(12) United States Patent
Adamovich et al.

(10) Patent No.: US 9,705,099 B2
(45) Date of Patent: Jul. 11, 2017

(54) PHOSPHORESCENT ORGANIC LIGHT EMITTING DEVICES HAVING A HOLE TRANSPORTING COHOST MATERIAL IN THE EMISSIVE REGION

(71) Applicants: Universal Display Corporation, Ewing, NJ (US); Hodogaya Chemical Co., Ltd., Tokyo (JP)

(72) Inventors: Vadim Adamovich, Ewing, NJ (US); Hitoshi Yamamoto, Ewing, NJ (US); Michael S. Weaver, Ewing, NJ (US); Norimasa Yokoyama, Tokyo (JP); Makoto Nagaoka, Tokyo (JP); Naoaki Kabasawa, Tokyo (JP)

(73) Assignees: Universal Display Corporation, Ewing, NJ (US); Hodogaya Chemical Co., Ltd., Tokyo (JP)

(*) Notice: Subject to any disclaimer, the term of this patent is extended or adjusted under 35 U.S.C. 154(b) by 408 days.

(21) Appl. No.: 14/372,594

(22) PCT Filed: Jan. 23, 2013

(86) PCT No.: PCT/US2013/022707
§ 371 (c)(1),
(2) Date: Jul. 16, 2014

(87) PCT Pub. No.: WO2013/112557
PCT Pub. Date: Aug. 1, 2013

(65) Prior Publication Data
US 2014/0374728 A1    Dec. 25, 2014

Related U.S. Application Data

(60) Provisional application No. 61/591,011, filed on Jan. 26, 2012.

(51) Int. Cl.
*H01L 51/50*    (2006.01)
*C09K 11/06*    (2006.01)
(Continued)

(52) U.S. Cl.
CPC ......... *H01L 51/5028* (2013.01); *C09K 11/06* (2013.01); *H01L 51/0052* (2013.01); *H01L 51/0068* (2013.01); *H01L 51/0072* (2013.01); *H01L 51/5056* (2013.01); *H01L 51/5096* (2013.01); *H05B 33/10* (2013.01); *C09K 2211/1007* (2013.01); *C09K 2211/1011* (2013.01); *C09K 2211/1029* (2013.01); *C09K 2211/1092* (2013.01); *H01L 51/5016* (2013.01); *H01L 51/5024* (2013.01); *H01L 2251/5384* (2013.01)

(58) Field of Classification Search
None
See application file for complete search history.

(56) References Cited

U.S. PATENT DOCUMENTS

2009/0302745 A1†  12/2009  Otsu
2013/0075716 A1*   3/2013  Nishimura .......... H01L 51/5016
                                                        257/40

FOREIGN PATENT DOCUMENTS

| WO | 2006-076092 A1 | 7/2006 |
| WO | 2009-080799 A2 | 7/2009 |
| WO | 2010-028262 A1 | 3/2010 |
| WO | 2011132683     | 10/2011 |
| WO | 2011-137072 A1 | 11/2011 |
| WO | 2011148909 A1 † | 12/2011 |

OTHER PUBLICATIONS

Official Letter and Search Report issued for on Feb. 22, 2016 for corresponding Taiwan Patent Application No. 102102635.

* cited by examiner
† cited by third party

*Primary Examiner* — Gregory Clark
(74) *Attorney, Agent, or Firm* — Duane Morris LLP

(57) ABSTRACT

An improved OLED includes an emissive layer disposed between a cathode and an anode where the emissive layer
(Continued)

includes a multi-component host material and a phosphorescent emitter material. The host material includes at least a first host compound and a second host compound, where the first host compound is hole-transporting host compound having the general formula wherein $R_1$, $R_2$, $R_3$, $R_4$, $R_5$, and $R_6$ may be the same or different fluorine atom, chlorine atom, a deuterium atom, a cyano group, a trifluoromethyl group, a nitro group, linear or branched alkyl group (C1-C6), cyclo-alkyl group (C5-C10), linear or branched alkoxy group (C1-C6), cyclo-alkoxy group (C5~C10), substituted or unsubstituted aromatic hydrocarbon group, substituted or unsubstituted aromatic heterocyclic group, substituted or unsubstituted condensed polycyclic aromatic group, $r_1$, $r_4$, $r_5$=0, 1, 2, 3, or 4 $r_2$, $r_3$ $r_6$; =0, 1, 2 or 3 n=0 or 1, and $Ar_1$, $Ar_2$, and $Ar_3$ may be the same or different, substituted or unsubstituted aromatic hydrocarbon group, substituted or unsubstituted aromatic heterocyclic group, substituted or unsubstituted condensed polycyclic aromatic group, deuterium substituted aromatic hydrocarbon group, deuterium substituted aromatic heterocyclic group, or deuterium substituted condensed polycyclic aromatic group.

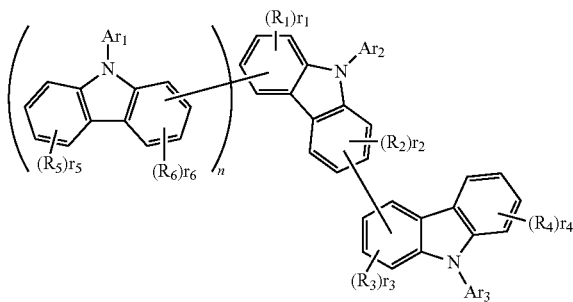

(I)

29 Claims, 11 Drawing Sheets

(51) Int. Cl.
    *H01L 51/00*     (2006.01)
    *H05B 33/10*     (2006.01)

PHOSPHORESCENT ORGANIC LIGHT EMITTING DEVICES HAVING A HOLE TRANSPORTING COHOST MATERIAL IN THE EMISSIVE REGION

FIELD

The present invention relates to an organic electroluminescent (EL) device such as an organic light emitting device (hereinafter abbreviated as an OLED) and materials capable of being used in such an OLED.

BACKGROUND

OLEDs which comprise an organic thin film layer which includes a light emitting layer located between an anode and a cathode are known in the art. In such devices, emission of light may be obtained from exciton energy, produced by recombination of a hole injected into a light emitting layer with an electron.

OLEDs make use of thin organic films that emit light when a voltage is applied across the device. Generally, OLEDs are comprised of several organic layers in which at least one of the layers can be made to electro-luminesce by applying a voltage across the device. When a voltage is applied across a device, the cathode effectively reduces the adjacent organic layers (i.e., injects electrons), and the anode effectively oxidizes the adjacent organic layers (i.e., injects holes). Holes and electrons migrate across the device toward their respective oppositely charged electrodes. When a hole and an electron localize on the same molecule, recombination is said to occur, and an exciton is formed. An exciton is a localized electron-hole pair having an excited energy state. Light is emitted (i.e., electroluminescence) when the exciton relaxes via a photo-emissive mechanism in luminescent compounds. In some cases, the exciton may be localized on an excimer or an exciplex.

Despite the recent discoveries such as the use of efficient heavy metal phosphors and the resulting advancements in OLED technology, there remains a continued need for longer device stability and higher efficiency. An improved OLED device that exhibit improved lifetimes and efficiencies is disclosed herein along with the associated materials that may be used to construct such OLED.

As used herein, the term "organic" includes polymeric materials as well as small molecule organic materials that may be used to fabricate organic opto-electronic devices. As used herein, "small molecule" refers to any organic material that is not a polymer, i.e., organic material having molecules with a defined molecular weight, and "small molecules" may actually be quite large. Small molecules may include repeat units in some circumstances, e.g. oligomers. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions. As used herein, the term "co-host" when used in referring to a particular host compound means that the particular host compound is used along with one or more additional host compounds to form the host material in an OLED device.

SUMMARY

The present disclosure provides OLEDs having a multi-component emissive layer. In one aspect, an OLED of the present disclosure comprises an anode electrode, a cathode electrode, and an organic electroluminescent layer disposed between the anode electrode and the cathode electrode. The organic electroluminescent layer comprising a host material and a phosphorescent emitter dopant material. The host material comprises a first host compound and a second host compound, wherein the first host compound is represented by the following general formula

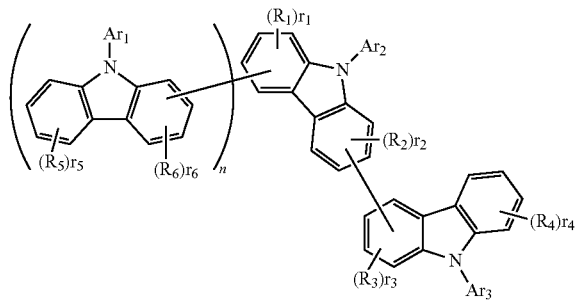

(H1)

wherein $R_1$, $R_2$, $R_3$, $R_4$, $R_5$, and $R_6$ may be the same or different fluorine atom, chlorine atom, a deuterium atom, a cyano group, a trifluoromethyl group, a nitro group, linear or branched alkyl group (C1-C6), cyclo-alkyl group (C5-C10), linear or branched alkoxy group (C1-C6), cyclo-alkoxy group (C5~C10), substituted or unsubstituted aromatic hydrocarbon group, substituted or unsubstituted aromatic heterocyclic group, substituted or unsubstituted condensed polycyclic aromatic group, $r_1$, $r_4$, $r_5$=0, 1, 2, 3, or 4, $r_2$, $r_3$, $r_6$; =0, 1, 2 or 3, n=0 or 1, and $Ar_1$, $Ar_2$, and $Ar_3$ may be the same or different, substituted or unsubstituted aromatic hydrocarbon group, substituted or unsubstituted aromatic heterocyclic group, substituted or unsubstituted condensed polycyclic aromatic group, deuterium substituted aromatic hydrocarbon group, deuterium substituted aromatic heterocyclic group, or deuterium substituted condensed polycyclic aromatic group.

In another aspect, the OLED described above further comprises an exciton/electron blocking layer disposed between the emissive layer and the anode, wherein the exciton/electron blocking layer blocks at least one of excitons or electrons and comprises a material that is the compound represented by the general formula H1.

The inventors have discovered that the OLED incorporating the teachings of the present disclosure exhibits an unexpectedly improved luminous efficiency.

DETAILED DESCRIPTION

In the present disclosure, HIL refers to a hole injection layer; HTL refers to a hole transport layer; EBL refers to an exciton/electron blocking layer that may be capable of blocking excitons or electrons or both; EML refers to an emissive layer; HBL refers to a hole blocking layer; and ETL refers to an electron transport layer.

The present disclosure describes an OLED comprising an organic electroluminescent layer comprising a phosphorescent emitter dopant dispersed in a host material wherein the host material comprises a first host compound and a second host compound. The first host compound is a hole-transporting host compound represented by the general formula

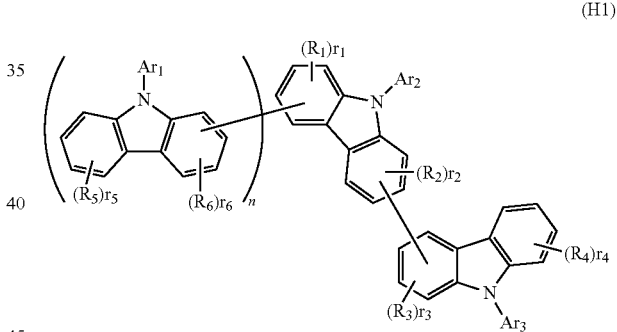

(H1)

wherein $R_1$, $R_2$, $R_3$, $R_4$, $R_5$, and $R_6$ may be the same or different fluorine atom, chlorine atom, a deuterium atom, a cyano group, a trifluoromethyl group, a nitro group, linear or branched alkyl group (C1-C6), cyclo-alkyl group (C5-C10), linear or branched alkoxy group (C1-C6), cyclo-alkoxy group (C5~C10), substituted or unsubstituted aromatic hydrocarbon group, substituted or unsubstituted aromatic heterocyclic group, substituted or unsubstituted condensed polycyclic aromatic group, $r_1$, $r_4$, $r_5$=0, 1, 2, 3, or 4, $r_2$, $r_3$, $r_6$; =0, 1, 2 or 3, n=0 or 1, and $Ar_1$, $Ar_2$, and $Ar_3$ may be the same or different, substituted or unsubstituted aromatic hydrocarbon group, substituted or unsubstituted aromatic heterocyclic group, substituted or unsubstituted condensed polycyclic aromatic group, deuterium substituted aromatic hydrocarbon group, deuterium substituted aromatic heterocyclic group, or deuterium substituted condensed polycyclic aromatic group. When $Ar_1$, $Ar_2$, or $Ar_3$ is a substituted aromatic hydrocarbon group, a substituted aromatic heterocyclic group, or a substituted polycyclic aromatic group, the substitution groups can be any non-carbon or carbon-containing functional group, such as, an aromatic hydrocarbon group, an aromatic heterocyclic group or a polycyclic aromatic group.

The resulting OLED exhibits improved luminous efficiency. According to an aspect of the present disclosure, the host material can also include a third host compound. The second and third host compounds are described below.

Figure 1:
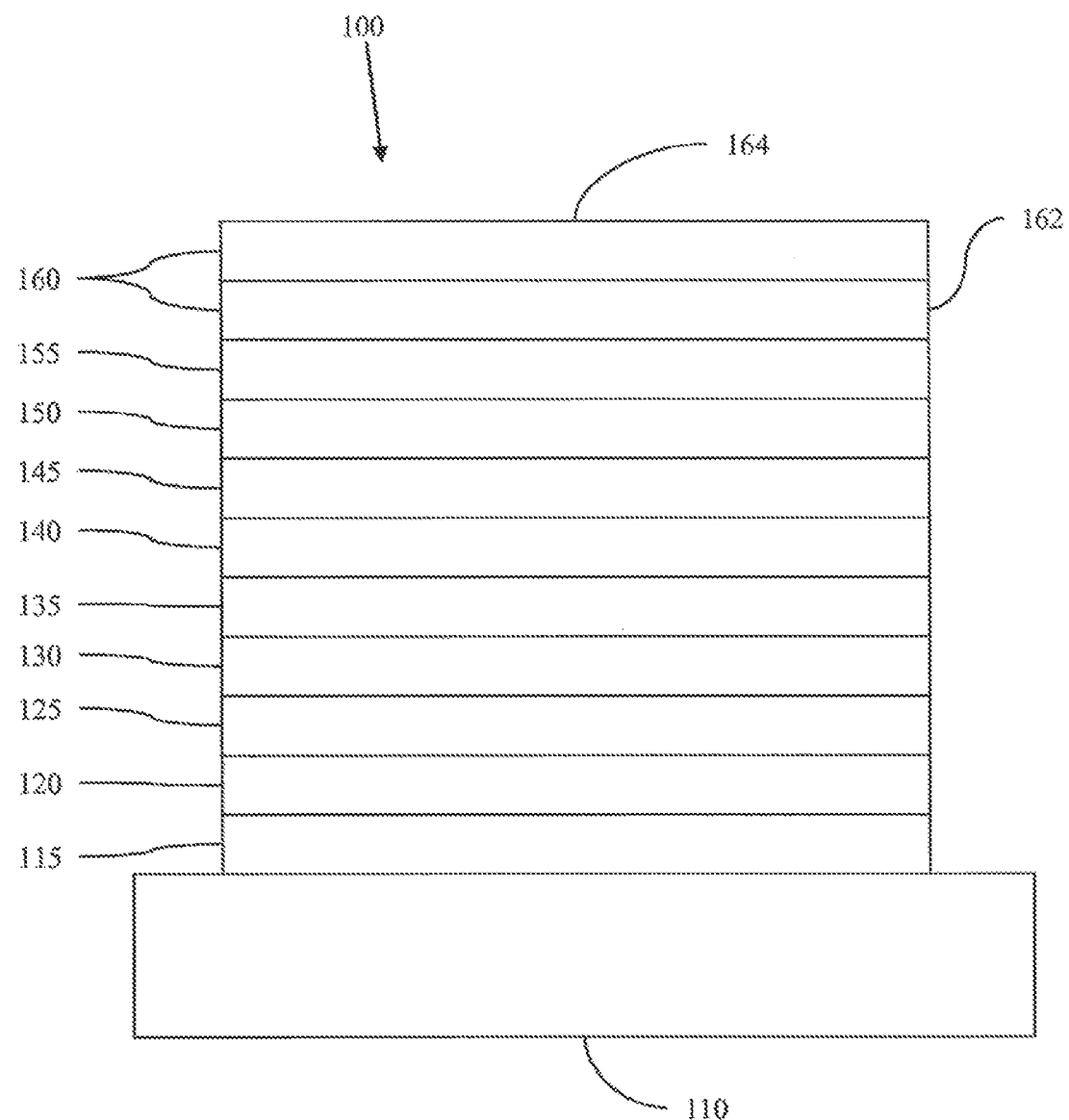
FIG. 1 is a schematic illustration of an OLED architecture.

FIG. 1 shows an OLED 100. The OLED 100 may include a substrate 110, an anode 115, a hole injection layer 120, a hole transport layer 125, and electron blocking layer 130, an emissive layer 135, a hole blocking layer 140, an electron transport layer 145, an electron injection layer 150, a protective layer 155, and a cathode 160. The cathode 160 can be a compound cathode having more than one conductive layers. The OLED 100 may be fabricated by depositing the layers described, in order. The properties and functions of these various layers, as well as example materials, are described in more detail in U.S. Pat. No. 7,279,704 at columns 6-10, the disclosure of which is incorporated herein by reference in its entirety.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in this disclosure. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. No. 6,013,982 and U.S. Pat. No. 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. No. 6,294,398 and U.S. Pat. No. 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may be better suited for solution processing than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18° C. to 30° C., and more preferably at room temperature (20-25° C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, aralkyl, heterocyclic group, aryl, aromatic group, and heteroaryl are known to the art, and are defined in U.S. Pat. No. 7,279,704 at columns 31-32, the disclosure of which is incorporated herein by reference in its entirety. The host material of the emissive layer in an organic light-emitting device provides a solid medium for the transport and recombination of charge carriers injected from the anode and the cathode. Compounds used for the host material can be categorized according to their charge transport properties. Some host compounds are predominantly electron-transporting and some others are predominantly hole-transporting. Although host compounds may be characterized as transporting predominantly one type of charge, the compound may also transport charges of both types.

Emitter Dopant:

Any suitable phosphorescent dopant may be used in the emissive layer. Some examples are provided in Table 5 below. In one embodiment, the phosphorescent dopant is a phosphorescent emitter material comprising a phosphorescent organometallic compound that emits phosphorescent radiation from a triplet molecular excited state when a voltage is applied across the material. The selection of the host materials will vary depending on the selection of the phosphorescent emitter dopant. In some embodiments, the electroluminescent layer contains additional dopants.

According to an embodiment, the phosphorescent emitter material is an organometallic compound selected from the group consisting of phosphorescent organometallic platinum compounds, organometallic iridium compounds and organometallic osmium compounds. The phosphorescent organometallic compound can include a carbon-metal bond. The organometallic platinum compounds, iridium compounds and osmium compounds can each include an aromatic ligand.

The phosphorescent organometallic compounds can comprise heteroleptic complexes with extended conjugation on the heterocyclic ring. Examples of such heteroleptic iridium compounds are described in PCT publication No. WO 2010/028151, published on Mar. 11, 2010, the disclosure of which is incorporated herein by reference in its entirety.

First Host Compound:

The first host compound is represented by the following general formula (H1):

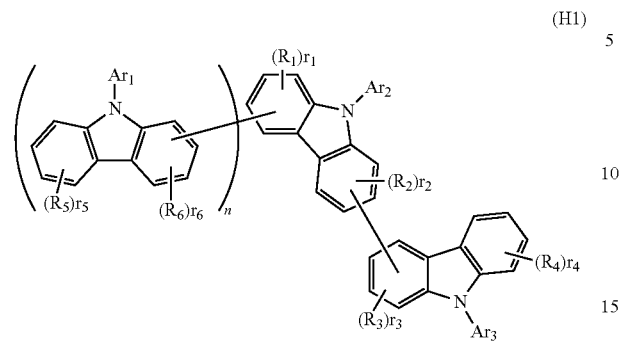

(H1)

wherein $R_1$, $R_2$, $R_3$, $R_4$, $R_5$, and $R_6$ may be the same or different fluorine atom, chlorine atom, a deuterium atom, a cyano group, a trifluoromethyl group, a nitro group, linear or branched alkyl group (C1-C6), cyclo-alkyl group (C5-C10), linear or branched alkoxy group (C1-C6), cyclo-alkoxy group (C5~C10), substituted or unsubstituted aromatic hydrocarbon group, substituted or unsubstituted aromatic heterocyclic group, substituted or unsubstituted condensed polycyclic aromatic group, $r_1$, $r_4$, $r_5$=0, 1, 2, 3, or 4, $r_2$, $r_3$, $r_6$; =0, 1, 2 or 3, n=0 or 1, and $Ar_1$, $Ar_2$, and $Ar_3$ may be the same or different, substituted or unsubstituted aromatic hydrocarbon group, substituted or unsubstituted aromatic heterocyclic group, substituted or unsubstituted condensed polycyclic aromatic group, deuterium substituted aromatic hydrocarbon group, deuterium substituted aromatic heterocyclic group, or deuterium substituted condensed polycyclic aromatic group. When $Ar_1$, $Ar_2$, or $Ar_3$ is a substituted aromatic hydrocarbon group, a substituted aromatic heterocyclic group, or a substituted polycyclic aromatic group, the substitution groups can be any non-carbon or carbon-containing functional group, such as, an aromatic hydrocarbon group, an aromatic heterocyclic group or a polycyclic aromatic group. For example, the substitution group on the aromatic ring structure of $Ar_1$, $Ar_2$, or $Ar_3$ can be

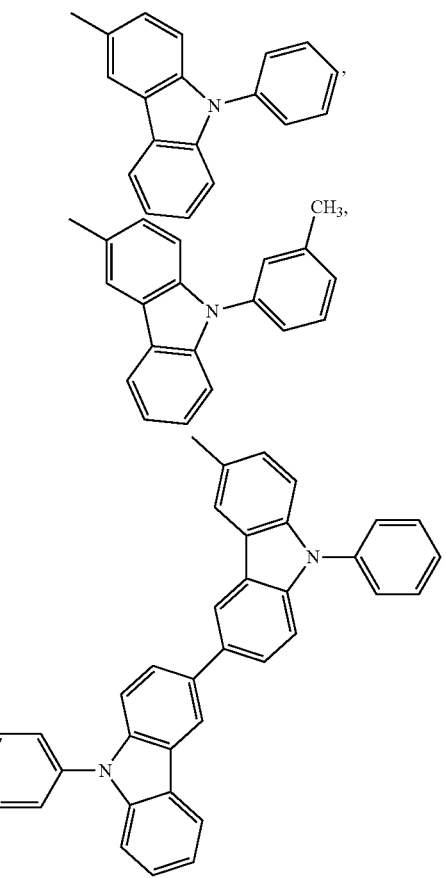

or the like.

Examples of compounds having the structure of formula (H1) are shown below. The first host compound can be selected from the group consisting of the compounds shown below, wherein D represents deuterium:

Compound H1-1

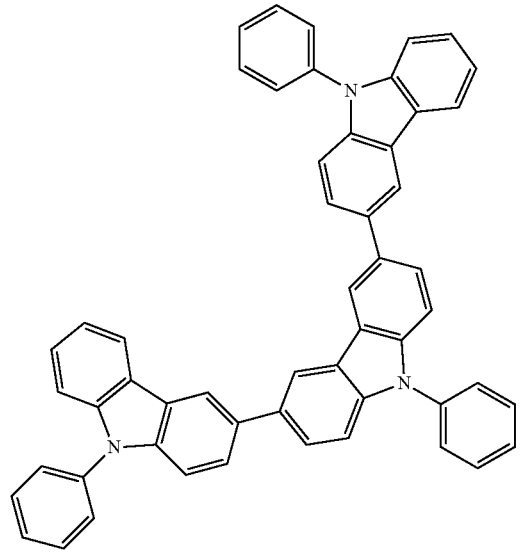

Compound H1-2

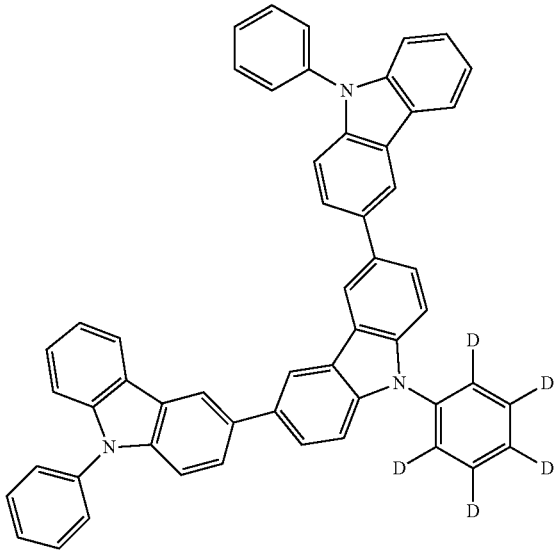

-continued
Compound H1-3
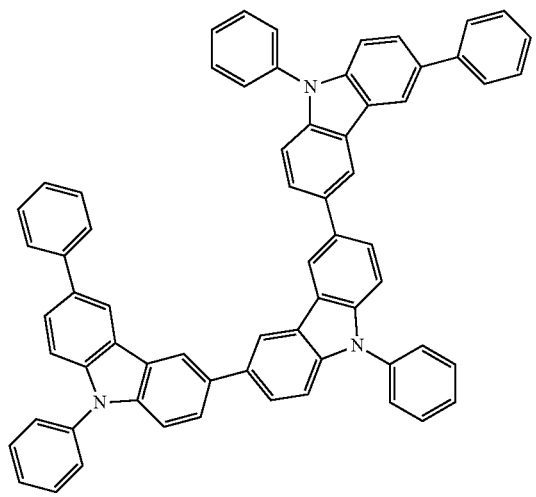
Compound H1-4
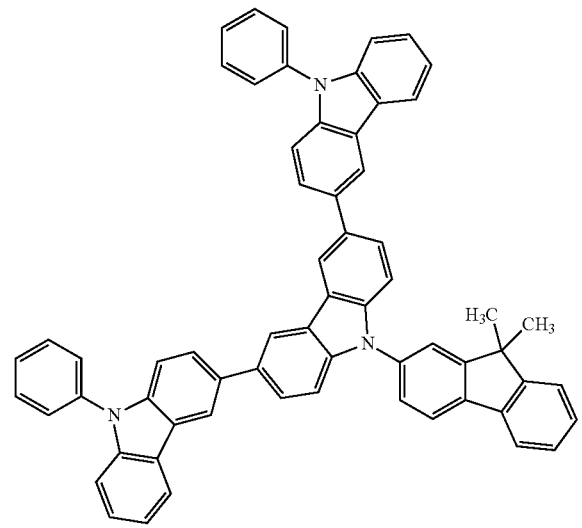
Compound H1-5
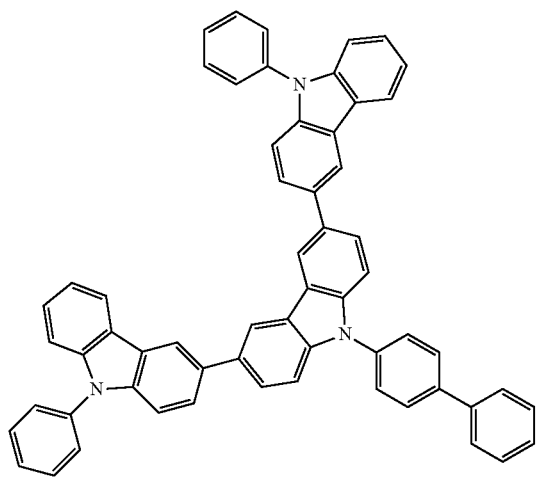
Compound-H1-6
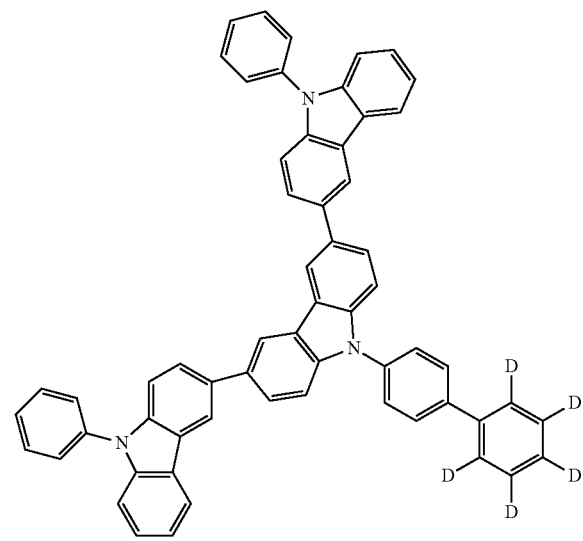
Compound H1-7
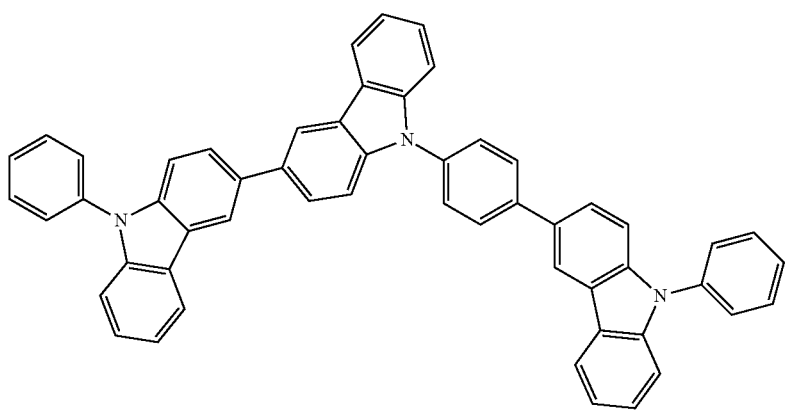

Compound H1-8
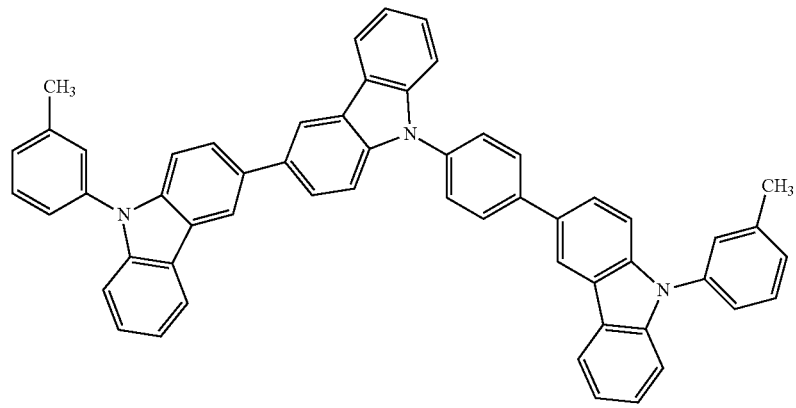
Compound H1-9
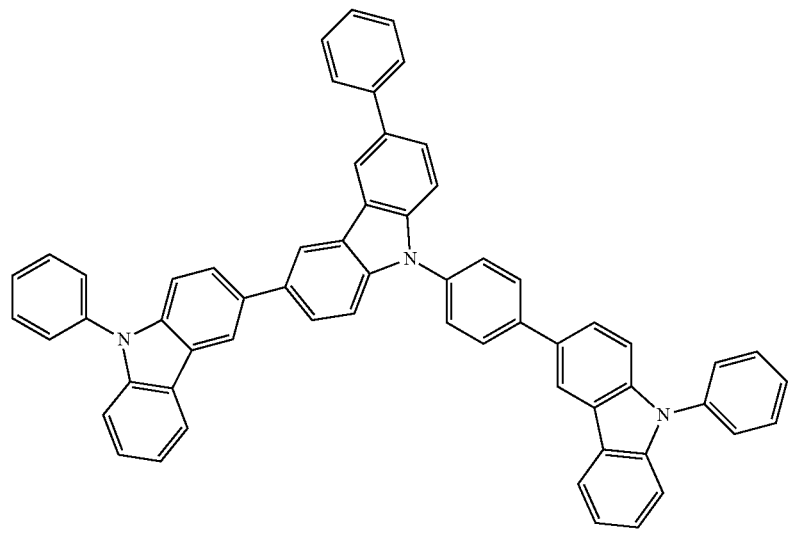
Compound H1-10
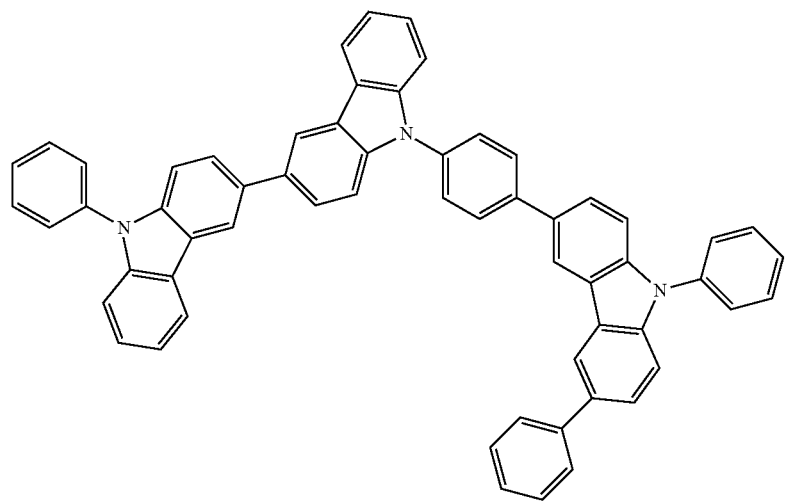

Compound H1-11
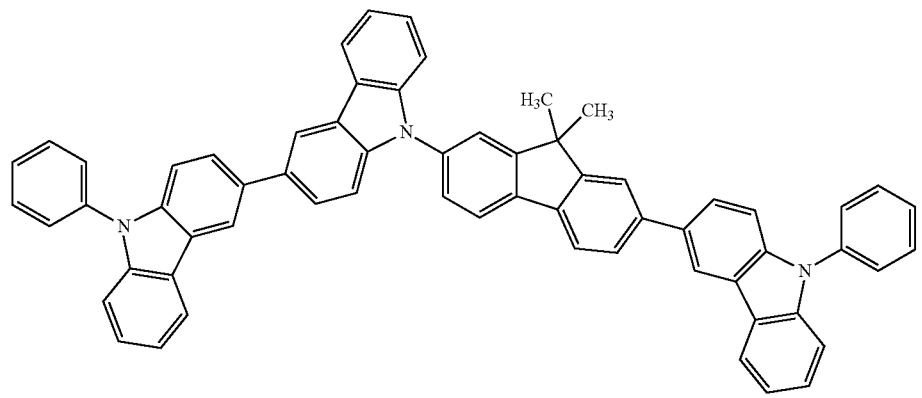
Compound H1-12
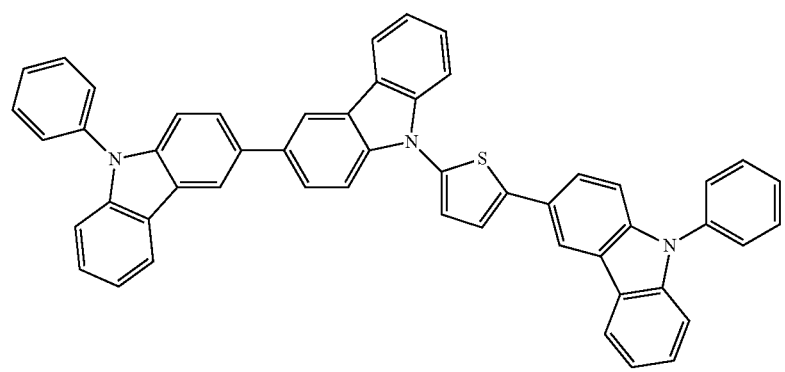
Compound H1-13
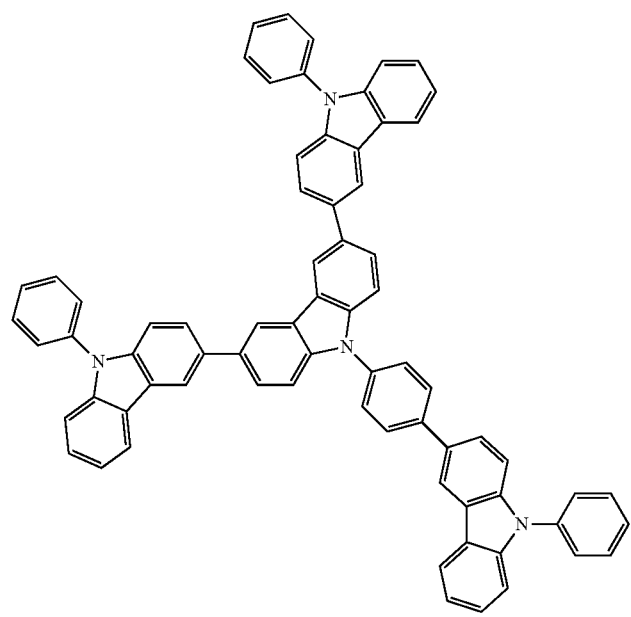

Compound H1-14
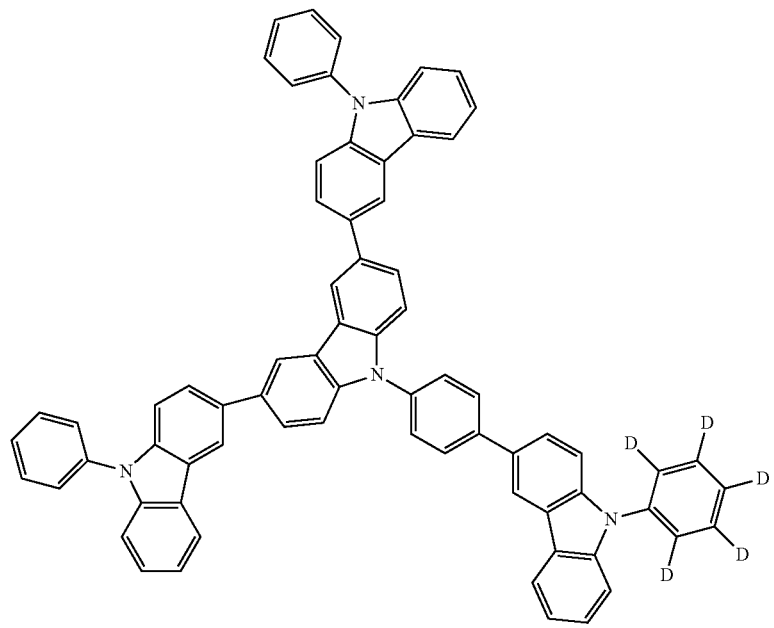
Compound H1-15
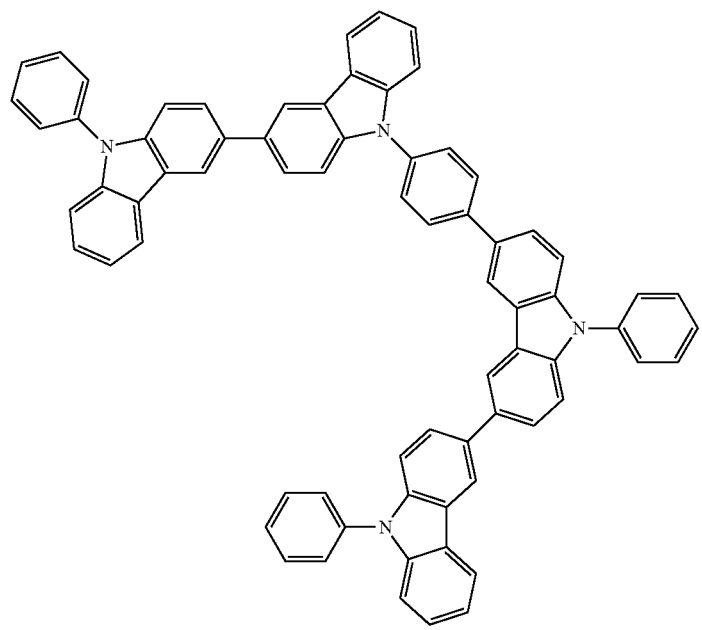

-continued

Compound H1-16

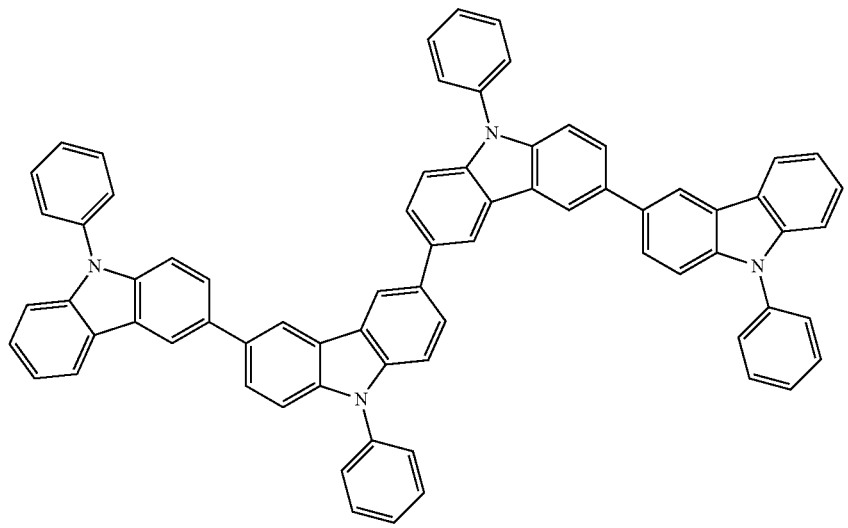

Compound H1-17

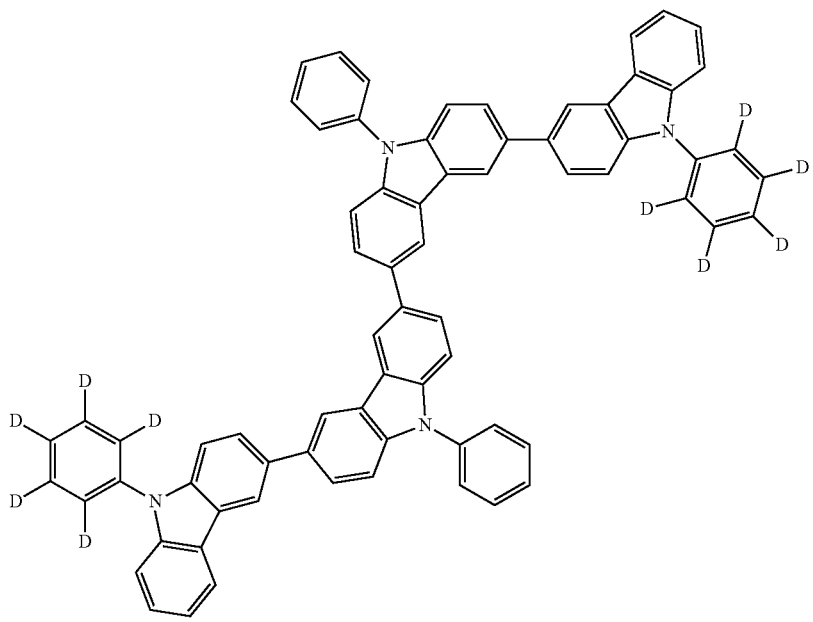

Compound H1-17

Preferably, the HOMO level of the first host compound is relatively close to the HOMO level of the emitter dopant, which allows offloading of the hole transporting function from the emitter dopant material. This enhances the lifetime of the emitter dopant material in the OLED. Because the first host compound is a hole-transporting type, the HOMO level of the first host compound is higher (less electronegative) than the HOMO energy levels of the other co-host materials. The right energy levels alignment allow separate charges and excitons in the device emissive layer, minimize triplet-polaron annihilation and non-radiative quenchers formation. This improves device efficiency and lifetime.

Synthesis of Examples of the First Host Compound:

Synthesis Example 1—Synthesis of Compound H1-1: In a nitrogen atmosphere, 1.6 g of 3,6-Dibromo-9-phenyl-9H-carbazole, 2.4 g of 9-Phenyl-3-(4,4,5,5-tetramethyl-1,3,2-dioxaborolan-2-yl)-9H-carbazole, 0.23 g of tetrakistriphenylphosphine palladium, 6 ml of an aqueous 2M potassium carbonate solution, 20 ml of toluene and 5 ml of ethanol were put into a reaction vessel, then heated and stirred under reflux temperature for 5 hours. After cooling to 40° C., the insoluble materials were removed by filtration, and the filtrate was concentrated under reduced pressure to obtain a crude product. The crude product was purified by recrystallization (solvent: toluene/methanol) and dried, 1.76 g (yield: 60.9%) of 3,6-Bis(9'-phenyl-9'H-carbazol-3-yl)-9-phenyl-9H-carbazole (Compound H1-1) was obtained as a brownish white powder.

The structure of the obtained brownish white powder was determined by NMR.

The following 35 hydrogen signals were detected by $^1$H-NMR (CDCl$_3$). δ (ppm)=8.56 (2H), 8.49 (2H), 8.24-8.26 (2H), 7.79-7.81 (4H), 7.62-7.67 (12H), 7.43-7.55 (11H), 7.30-7.33 (2H).

Synthesis Example 2—Synthesis of Compound H1-2: In a nitrogen atmosphere, 26.1 g of 3,6-Dibromo-9-(phenyl-d5)-9H-carbazole, 48.7 g of 9-Phenyl-3-(4,4,5,5-tetramethyl-1,3,2-dioxaborolan-2-yl)-9H-carbazole, 2.23 g of tetrakistriphenylphosphine palladium, 95 ml of an aqueous 2M potassium carbonate solution, 326 ml of toluene and 82 ml of ethanol were put into a reaction vessel, then heated and stirred under reflux temperature for 6.5 hours. After cooling to room temperature, 650 ml of methanol was added to the solution, the crude product was obtained by filtration. The crude product was dissolved in 1130 ml of toluene, purified by diaminesilica gel and silica gel. The solution was concentrated under reduced pressure. The residual product was purified by recrystallization (solvent: toluene/hexane), then washed with methanol and dried, 32.3 g (yield: 69%) of 3,6-Bis(9'-phenyl-9'H-carbazol-3-yl)-9-(phenyl-d5)-9H-carbazole (Compound H1-2) was obtained as a white powder.

The structure of the obtained white powder was determined by NMR.

The following 30 hydrogen signals were detected by $^1$H-NMR. (CDCl$_3$). δ (ppm)=8.70 (2H), 8.60 (2H), 8.28 (2H), 7.83-7.86 (4H), 7.65-7.66 (8H), 7.49-7.54 (6H), 7.36-7.42 (4H), 7.27 (2H).

Synthesis Example 3—Synthesis of Compound H1-7: In a nitrogen atmosphere, 12.9 g of 9-Phenyl-9H,9'H-[3,3'] bicarbazolyl, 13.4 g of 4-Bromoiodobenzene, 0.64 g of copper powder, 8.34 g of potassium carbonate, 0.49 g of sodium hydrogenesulfite and 50 ml of o-dichlorobenzene were put into a reaction vessel, then heated and stirred at 170° C. for 19.5 hours. After cooling to 90° C., 200 ml of toluene was added thereto and insoluble materials were removed by filtration. The filtrate was concentrated under reduced pressure to obtain a crude product, the crude product was purified by recrystallization with methanol and dried, 17.3 g (yield: 97%) of 9-(4-Bromophenyl)-9'-phenyl-9H,9'H-[3,3']bicarbazolyl was obtained as a white powder.

In a nitrogen atmosphere, 17.0 g of 9-(4-Bromophenyl)-9'-phenyl-9H,9'H-[3,3']bicarbazolyl, 12.3 g of 9-Phenyl-3-(4,4,5,5-tetramethyl-1,3,2-dioxaborolan-2-yl)-9H-carbazole, 1.74 g of tetrakistriphenylphosphine palladium, 23 ml of an aqueous 2M potassium carbonate solution, 160 ml of toluene and 40 ml of ethanol were put into a reaction vessel, then heated and stirred under reflux temperature for 13 hours. After cooling to room temperature, 100 ml of toluene and 150 ml of water were added thereto and stirred, and the organic layer was separated with a separatory funnel. The organic layer was dried over magnesium sulfate and concentrated under reduced pressure to obtain a crude product. The crude product was purified by column chromatography (carrier: silica gel, eluent: n-hexane/toluene) and 10.4 g (yield: 48%) of 9'-Phenyl-9-[4-(9-phenyl-9H-carbazol-3-yl)-phenyl]-9H,9'H-[3,3']bicarbazolyl was obtained as a slightly yellow powder.

The structure of the obtained slightly yellow powder was determined by NMR.

The following 35 hydrogen signals were detected by $^1$H-NMR (THF-d$_8$). δ (ppm)=8.56-8.61 (3H), 8.26-8.30 (3H), 8.04-8.08 (2H), 7.81-7.85 (3H), 7.73-7.76 (2H), 7.64-7.69 (8H), 7.58 (1H), 7.48-7.53 (5H), 7.36-7.44 (5H), 7.25-7.31 (3H).

Second and Third Host Compounds:

Each of the second and third host compounds is a wide band gap host compound that is more electron-transporting compared to the compound H1 and can contain at least one of the following groups in the molecule:

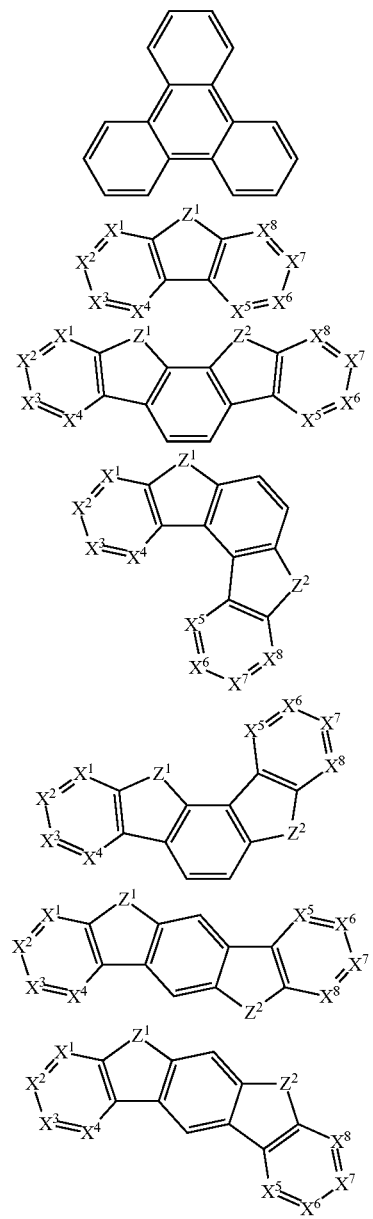

wherein $X^1$ to $X^8$ is selected from C or N; and wherein $Z^1$ and $Z^2$ is S or O. The second host compound and the third host compound are different compounds.

According to an aspect of the present disclosure, any substituent in the second and third host compounds is preferably an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH=CH-C_nH_{2n+1}$, $C=CHC_nH_{2n+1}$, $Ar_1$, $Ar_1$-$Ar_2$, $C_nH_{2n}$-$A_{r1}$, or no substitution, wherein n is 1, 2, 3, 4, 5, 6, 7, 8, 9, or 10, and wherein $Ar_1$ and $Ar_2$ are independently selected from the group consisting of benzene, biphenyl, naphthalene, triphenylene, carbazole, and heteroaromatic analogs thereof.

According to another embodiment, the second host compound can be a compound comprising a triphenylene containing benzo-fused thiophene. Triphenylene is a polyaromatic hydrocarbon with high triplet energy, yet high [pi]-conjugation and a relatively small energy difference between the first singlet and first triplet levels. This would indicate that triphenylene has relatively easily accessible HOMO and LUMO levels compared to other aromatic compounds with similar triplet energy (e.g., biphenyl). The advantage of using triphenylene and its derivatives as hosts is that it can accommodate red, green and even blue phosphorescent dopants to give high efficiency without energy quenching. Triphenylene hosts may be used to provide high efficiency and stability phosphorescent OLEDs (PHOLEDs). See Kwong and Alleyene, *Triphenylene Hosts in Phosphorescent Light Emitting Diodes,* 2006, 60 pp, US 2006/0280965 A1. Benzo-fused thiophenes may be used as hole transporting organic conductors. In addition, the triplet energies of benzothiophenes, namely dibenzo[b,d]thiophene (referred to herein as "dibenzothiophene"), benzo[b]thiophene and benzo[c]thiophene are relatively high. A combination of benzo-fused thiophenes and triphenylene as hosts in PHOLEDs may be beneficial. More specifically, benzo-fused thiophenes are typically more hole transporting than electron transporting, and triphenylene is more electron transporting than hole transporting. Therefore combining these two moieties in one molecule may offer improved charge balance which may improve device performance in terms of lifetime, efficiency and low voltage. Different chemical linkage of the two moieties can be used to tune the properties of the resulting compound to make it the most appropriate for a particular phosphorescent emitter, device architecture, and/or fabrication process. For example, m-phenylene linkage is expected to result in higher triplet energy and higher solubility whereas p-phenylene linkage is expected to result in lower triplet energy and lower solubility.

Similar to the characterization of benzo-fused thiophenes, benzo-fused furans are also typically hole transporting materials having relatively high triplet energy. Examples of benzo-fused furans include benzofuran and dibenzofuran. Therefore, a material containing both triphenylene and benzofuran may be advantageously used as emitter host or hole blocking material in PHOLED. A compound containing both of these two groups may offer improved electron stabilization which may improve device stability and efficiency with low voltage. The properties of the triphenylene containing benzofuran compounds may be tuned as necessary by using different chemical linkages to link the triphenylene and the benzofuran.

The compounds for the second host compound may be substituted with groups that are not necessarily triphenylenes, benzo-fused thiophenes, and benzo-fused furans. Preferably, any group that is used as a substituent of the compound has a triplet energy high enough to maintain the benefit of having triphenylene benzo-fused thipohenes or benzo-fused furans (i.e. the triplet energy of the substituent maintains the high triplet energy of benzo-fused thiophenes, benzo-fused furans and triphenylenes). Examples of such groups that may be used as substituents of the compound may include any unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH=CH-C_nH_{2n+1}$, $C=CHC_nH_{2n+1}$, $Ar_1$, $Ar_1$-$Ar_2$, $C_nH_{2n}$-$A_{r1}$, or no substitution, wherein n is 1, 2, 3, 4, 5, 6, 7, 8, 9, or 10, and wherein $Ar_1$ and $Ar_2$ are independently selected from the group consisting of benzene, biphenyl, naphthalene, triphenylene, carbazole, and heteroaromatic analogs thereof. The compounds for the host material described herein have a high enough triplet energy to be suitable for use in a device having phosphorescent blue emissive materials.

The substituents of the compounds described herein are unfused such that the substituents are not fused to the triphenylene, benzo-fused furan or benzo-fused thiophene moieties of the compound. The substituents may optionally be inter-fused (i.e. fused to each other).

Materials provided herein may also offer improved film formation in the device as fabricated by both vapor deposition and solution processing methods. In particular, materials offering improved fabrication have a central pyridine ring to which the benzo-fused thiophenylene and triphenylene, or benzofuran and triphenylene, are attached. The improved film formation is believed to be a result of the combination of polar and non-polar rings in the compound.

According to another embodiment, the second and/or third host compounds are triphenylene-containing benzo-fused thiophenes or benzo-fused furans. Examples of triphenylene-containing benzo-fused thiophenes or benzo-fused furans include compounds having the structure of the following formulae (H-IV), (H-V), and (H-VI):

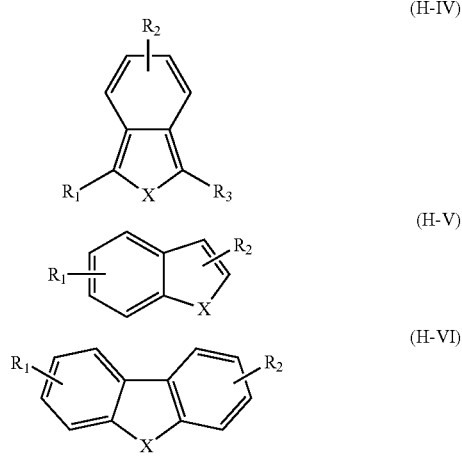

X is S or O. Preferably, $R_1$, $R_2$ and $R_3$ are unfused substituents that are independently selected from $C_nH_{2n+1}$, $OC_nH_{2n+1}$, $OAr_1$, $N(C_nH_{2n+1})_2$, $N(Ar_1)(Ar_2)$, $CH=CH-C_nH_{2n+1}$, $C=CHC_nH_{2n+1}$, $Ar_1$, $Ar_1$-$Ar_2$, $C_nH_{2n}$-$A_{r1}$, or no substitution. Each of $R_1$, $R_2$ and $R_3$ may represent mono, di, tri, or tetra substitutions, n is 1, 2, 3, 4, 5, 6, 7, 8, 9, or 10. $Ar_1$ and $Ar_2$ are independently selected from the group consisting of benzene, biphenyl, naphthalene, triphenylene, carbazole, and heteroaromatic analogs thereof. At least one of $R_1$, $R_2$ and $R_3$ includes a triphenylene group.

Examples of compounds having the structure of the formula (H-IV) include:

Compound 11G

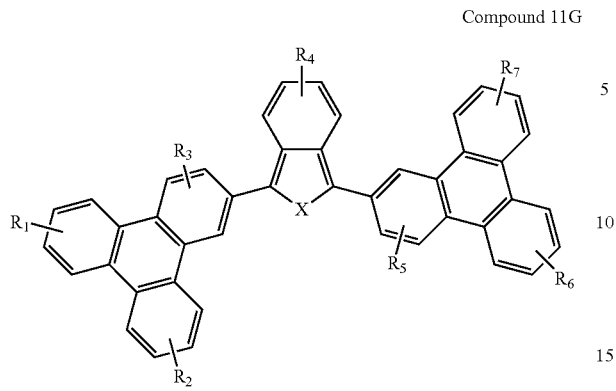

Compound 12

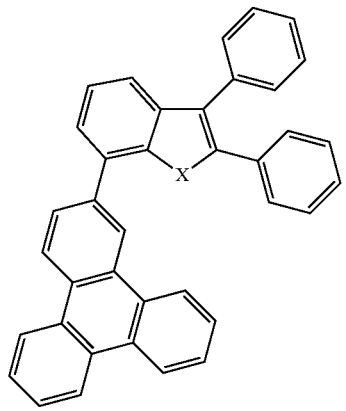

Compound 11

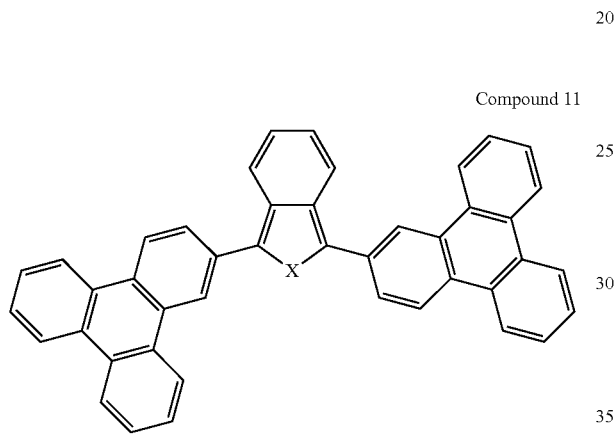

Compound 13G

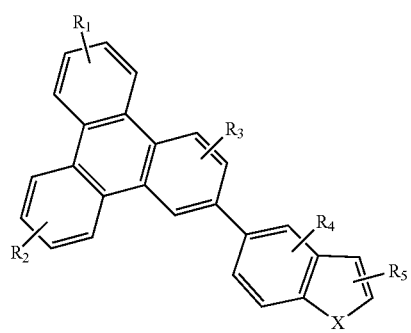

where X is S or O. Preferably, X is S. $R_1$ to $R_n$ are independently selected from the group consisting of $C_nH_{2n+1}$, $OC_nH_{2n+1}$, $OAr_1$, $N(C_nH_{2n+1})_2$, $N(Ar_1)(Ar_2)$, CH=CH—$C_nH_{2n+1}$, C≡CH$C_nH_{2n+1}$, $Ar_1$, $Ar_1$-$Ar_2$, $C_nH_{2n}$-$A_{r1}$, or no substitution. Each of $R_1$ to $R_n$ may represent mono, di, tri, or tetra substitutions, n is 1, 2, 3, 4, 5, 6, 7, 8, 9, or 10. $Ar_1$ and $Ar_2$ are independently selected from the group consisting of benzene, biphenyl, naphthalene, triphenylene, carbazole, and heteroaromatic analogs thereof. At least one of $R_1$, $R_2$, and $R_3$ includes a triphenylene group.

Examples of compounds having the structure of the formula (H-V) include:

Compound 13

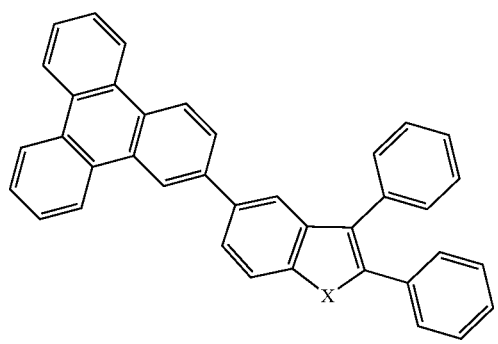

Compound 12G

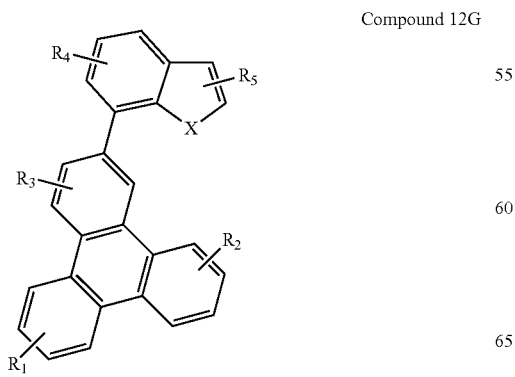

Compound 14G

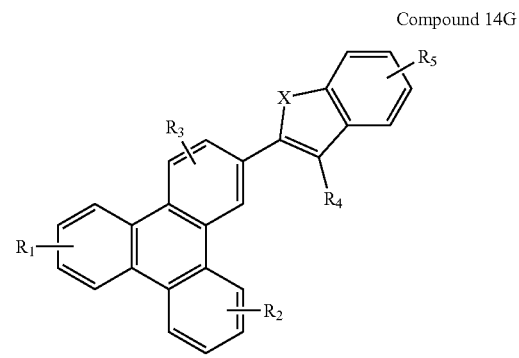

Compound 14

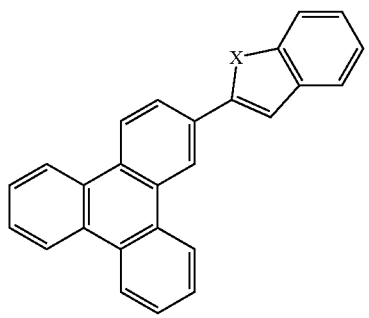

Compound 16G

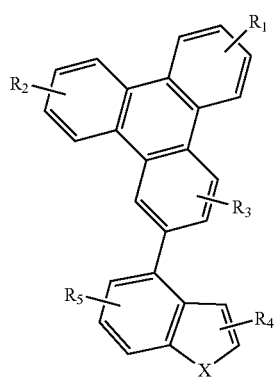

Compound 16

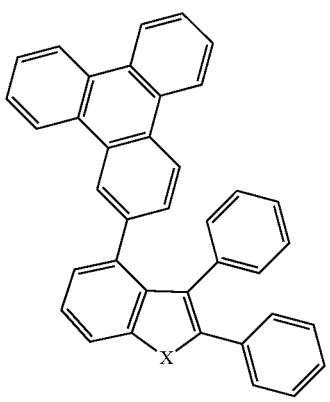

Compound 17G

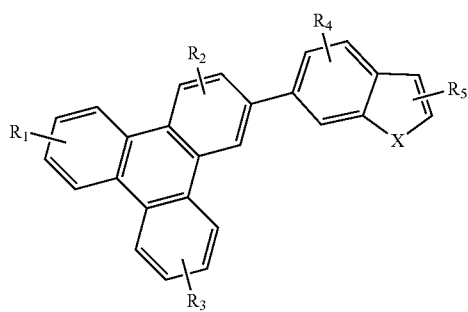

Compound 17

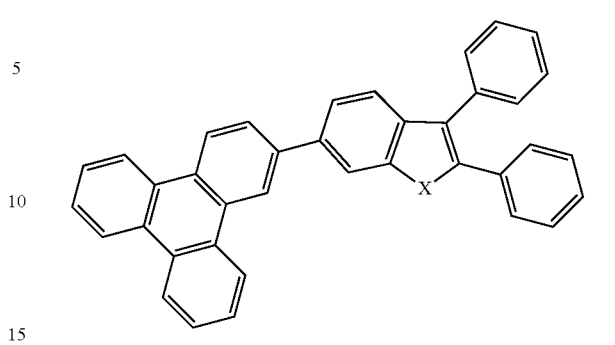

Compound 18G

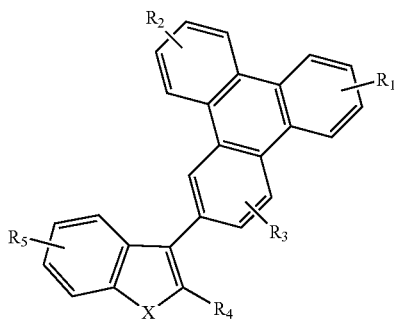

Compound 18

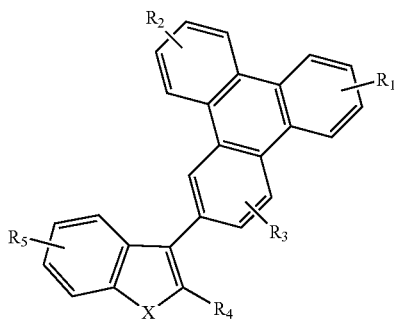

where X is S or O. Preferably, X is S. $R_1$ to $R_n$ are independently selected from the group consisting of $C_nH_{2n+1}$, $OC_nH_{2n+1}$, $OAr_1$, $N(C_nH_{2n+1})_2$, $N(Ar_1)(Ar_2)$, $CH=CH-C_nH_{2n+1}$, $C=CHC_nH_{2n+1}$, $Ar_1$, $Ar_1$-$Ar_2$, $C_nH_{2n}$-$A_{r1}$, or no substitution. Each of $R_1$ to $R_n$ may represent mono, di, tri, or tetra substitutions, n is 1, 2, 3, 4, 5, 6, 7, 8, 9, or 10. $Ar_1$ and $Ar_2$ are independently selected from the group consisting of benzene, biphenyl, naphthalene, triphenylene, carbazole, and heteroaromatic analogs thereof. At least one of $R_1$, $R_2$, and $R_3$ includes a triphenylene group.

Examples of compounds having the structure of the formula (H-VI) include:

Compound 1G
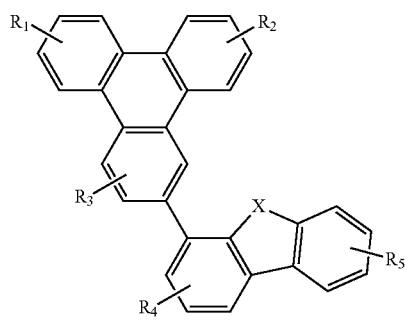
Compound 1
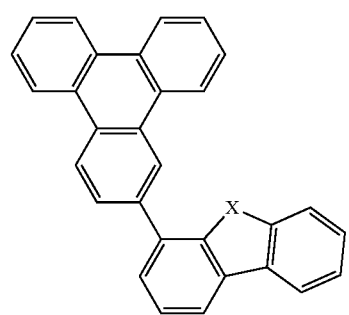
Compound 2G
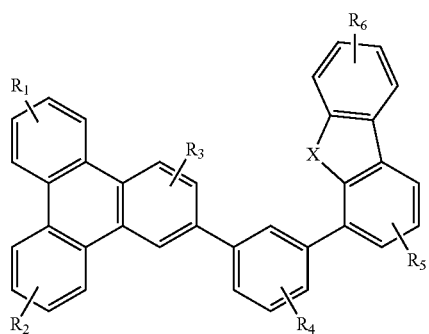
Compound 2
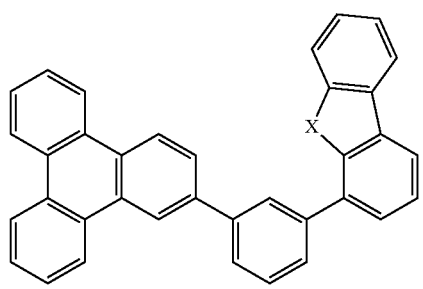
Compound 3G
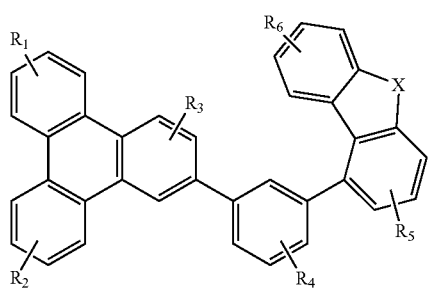
-continued
Compound 3
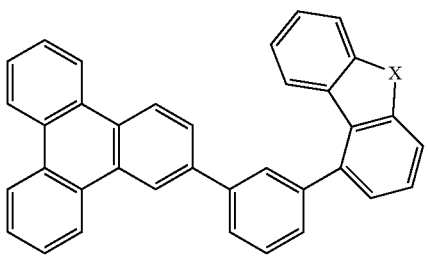
Compound 4G
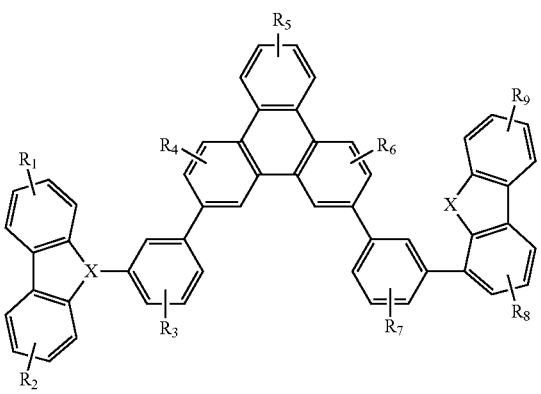
Compound 4
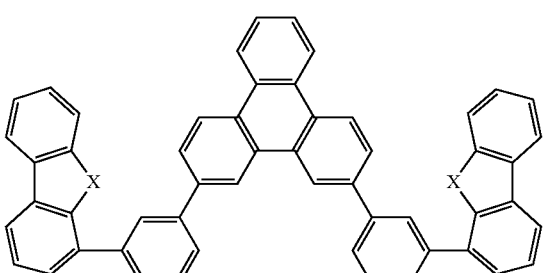
Compound 5G
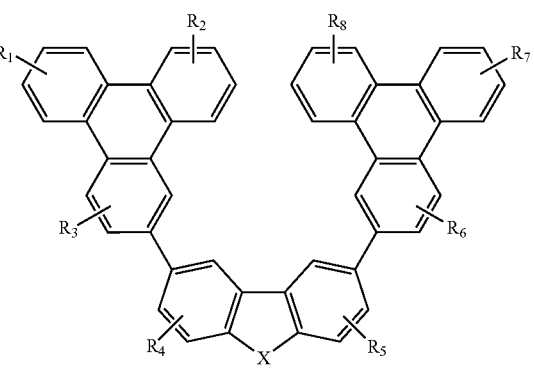

Compound 5
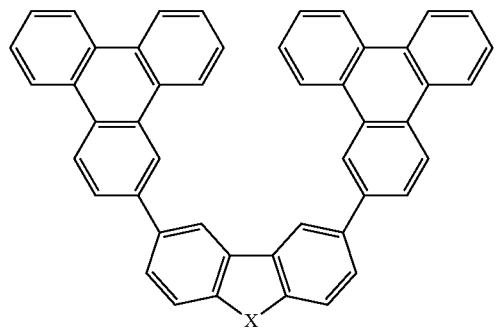
Compound 6G
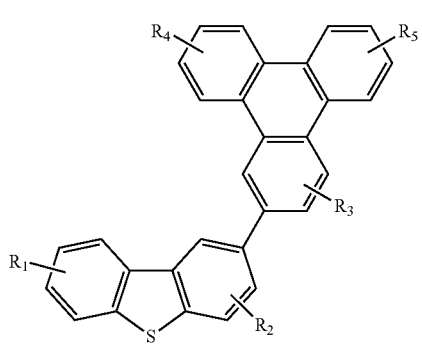
Compound 6
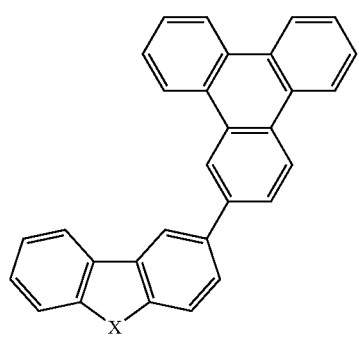
Compound 7G
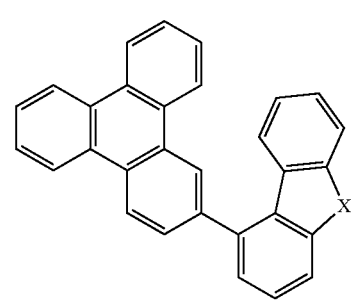
Compound 7
Compound 8G
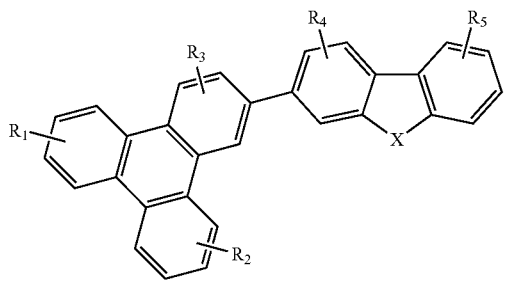
Compound 8
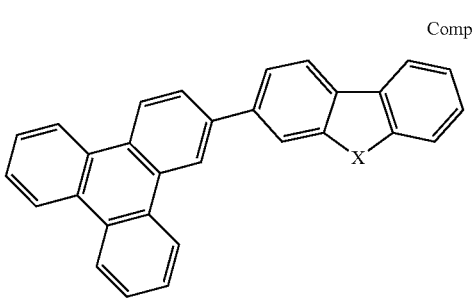
Compound 9G
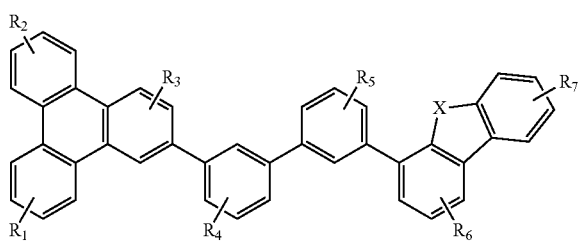
Compound 9
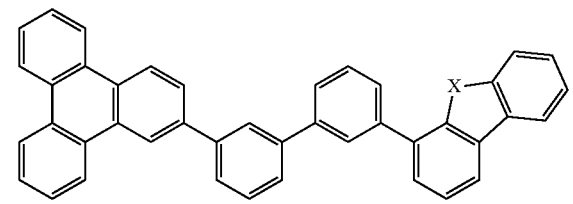
Compound 10G
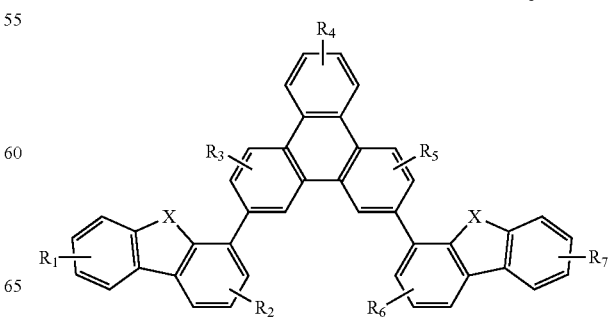

Compound 10
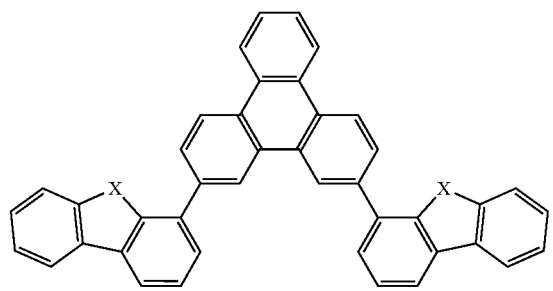
Compound 15G
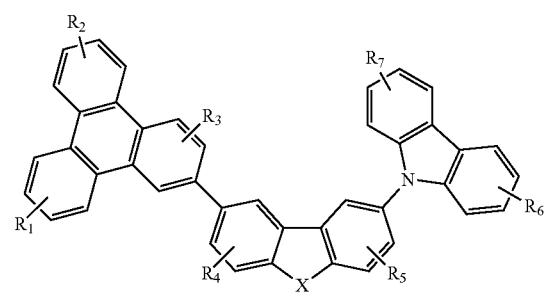
Compound 15
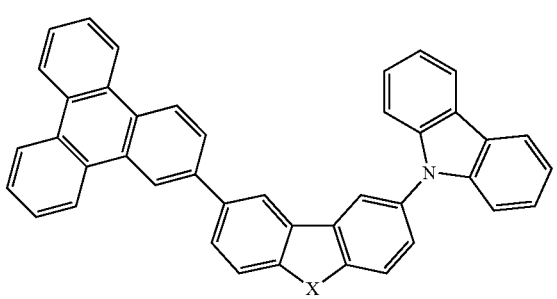
Compound 24 G
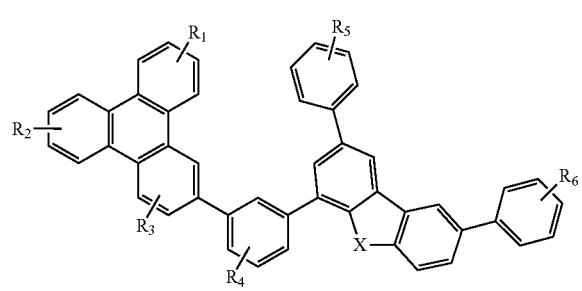
Compound 24
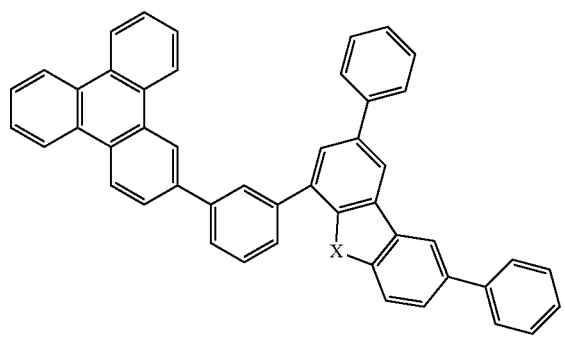
Compound 25 G
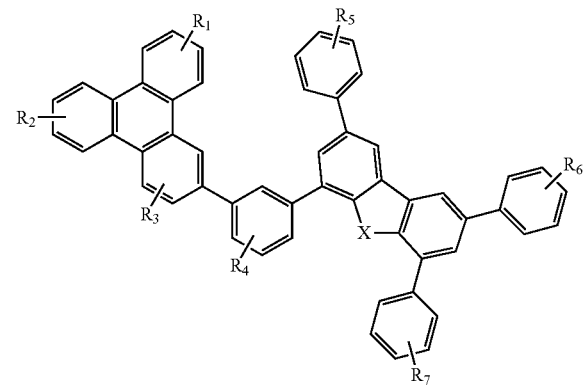
Compound 25
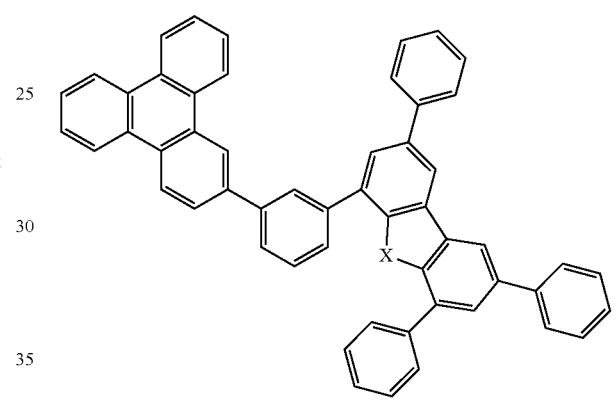
Compound 26G
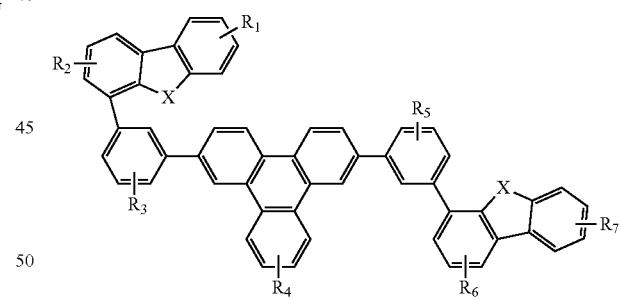
Compound 26
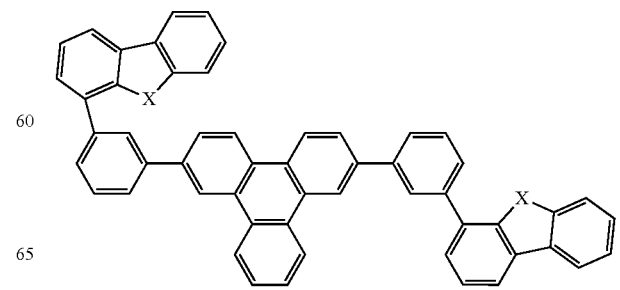

Compound 27G
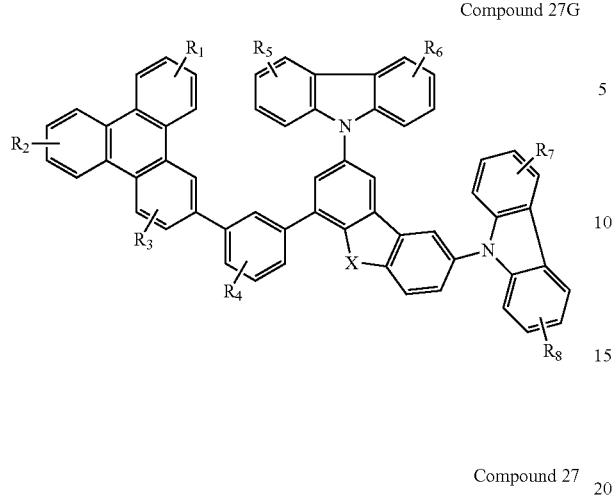
Compound 27
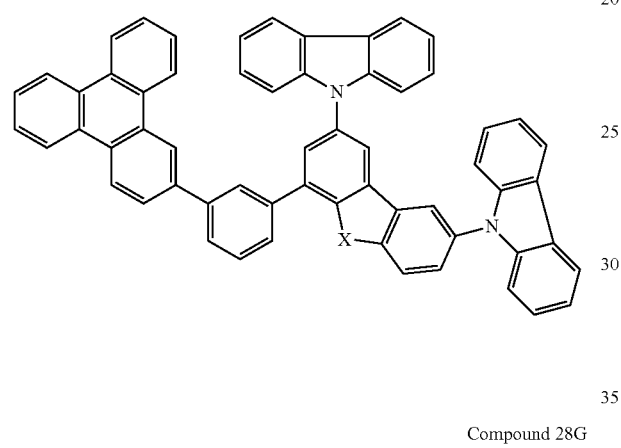
Compound 28G
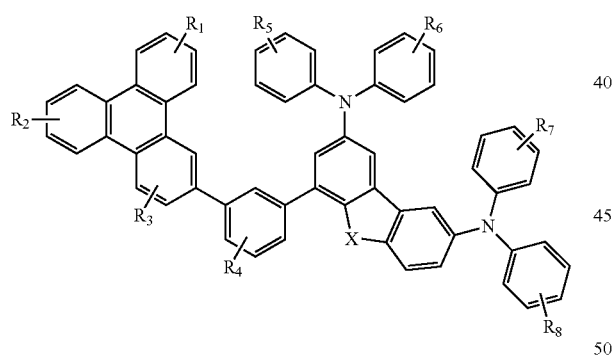
Compound 28
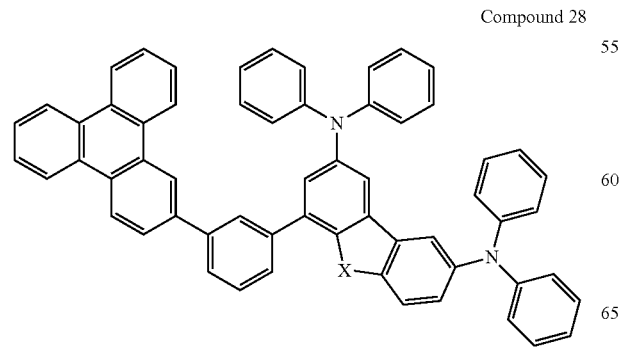
Compound 29G
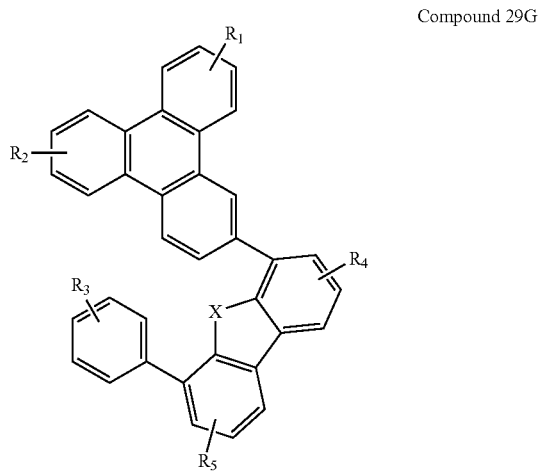
Compound 29
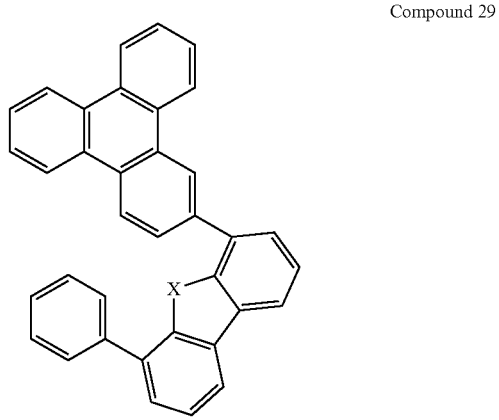
Compound 30G
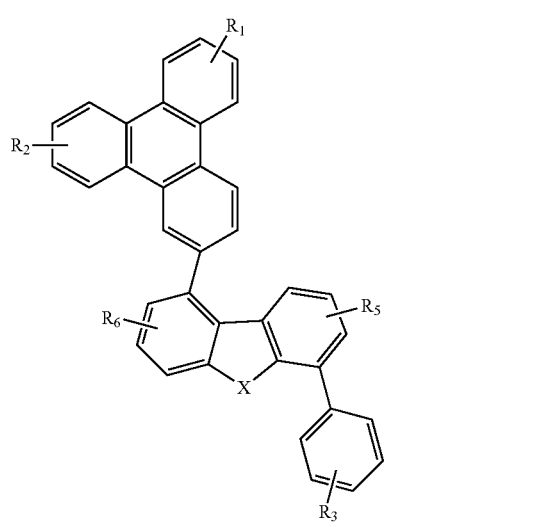

Compound 30
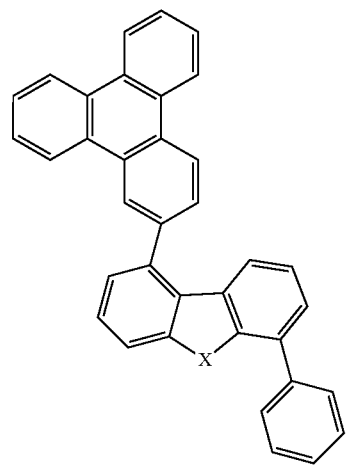
Compound 31G
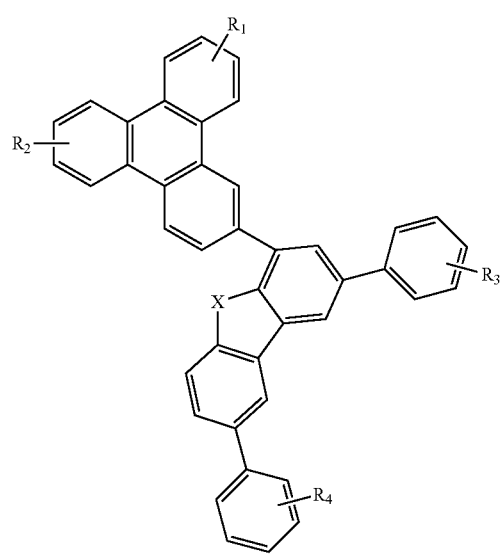
Compound 31
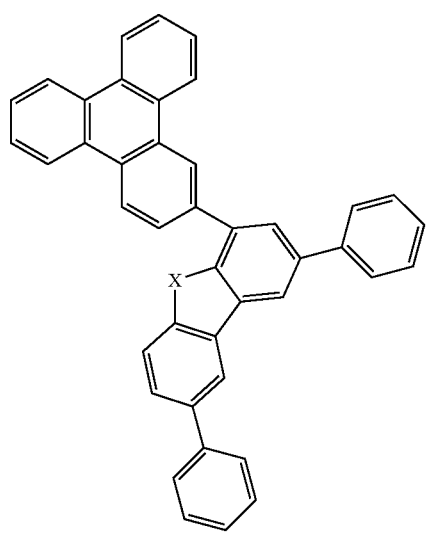
Compound 32G
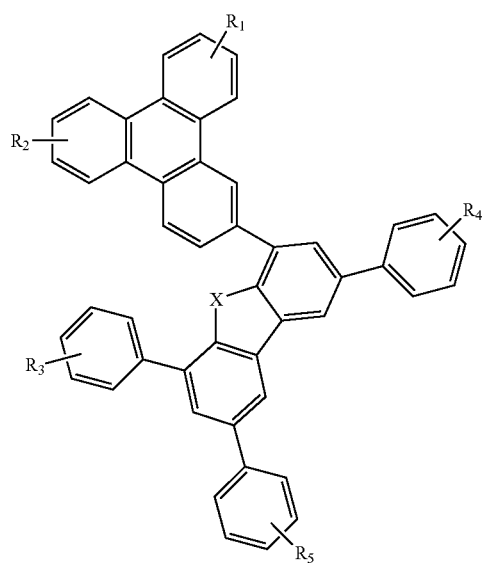
Compound 32
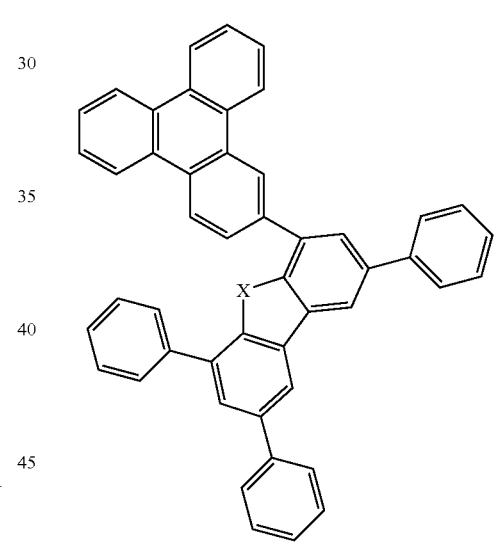
Compound 33G
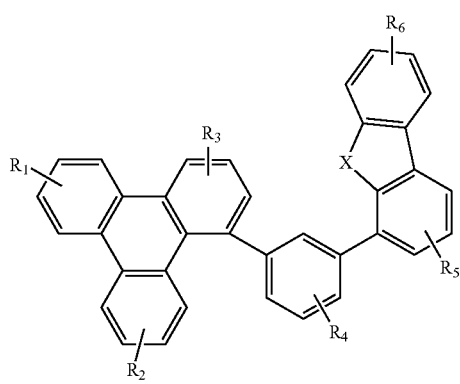

Compound 33
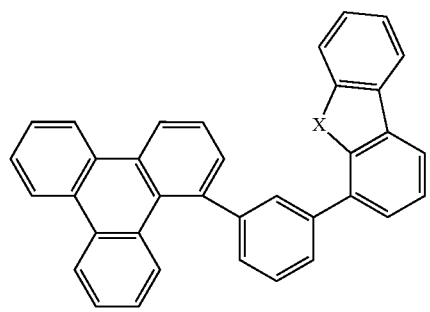
Compound 34G
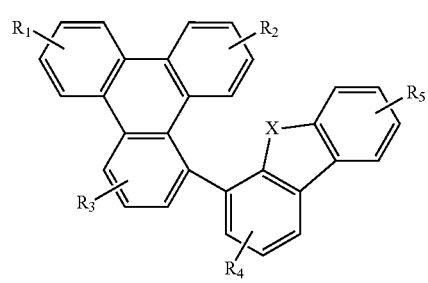
Compound 34
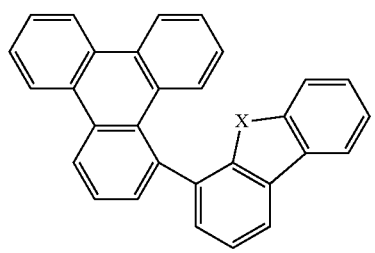
Compound 35G
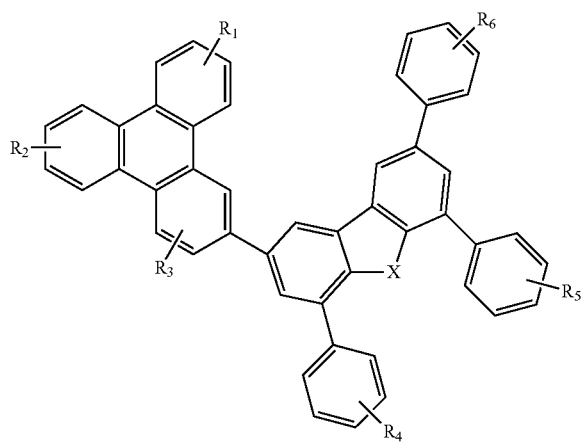
Compound 35
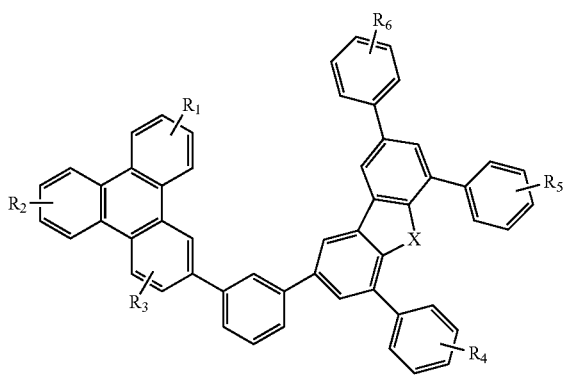
Compound 36G
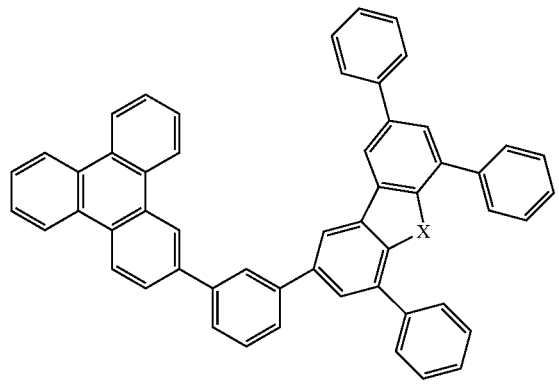
Compound 36

Compound 37G
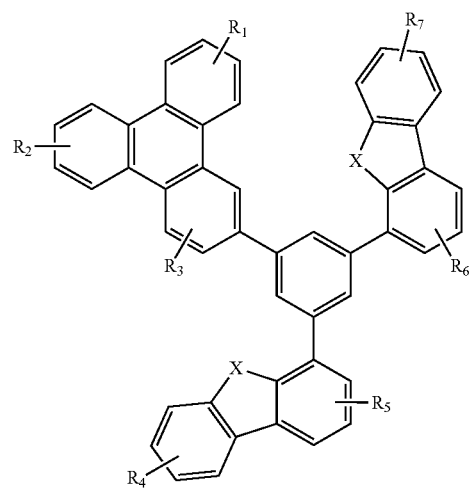
Compound 37
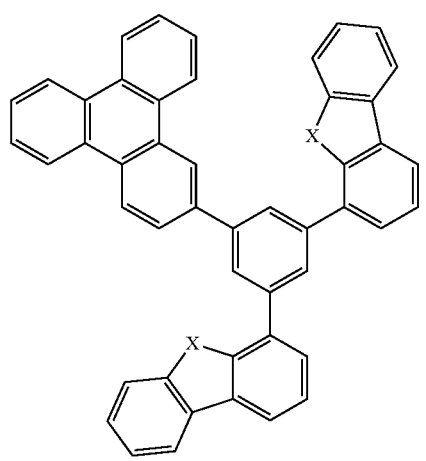
Compound 38G
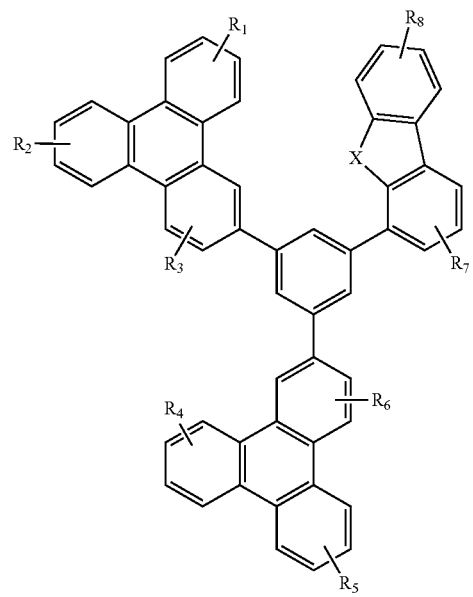
Compound 38
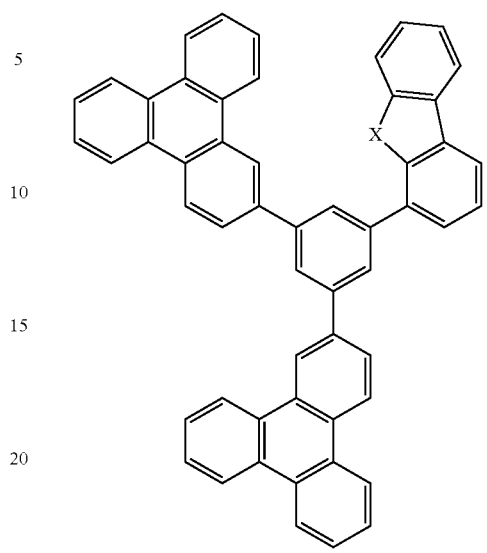
Compound 39G
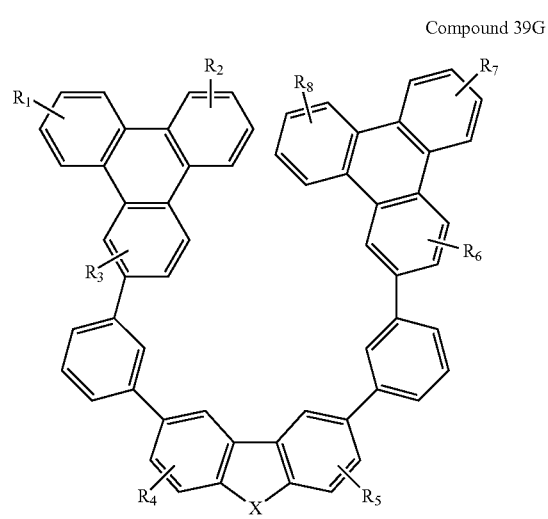
Compound 39

Compound 40G
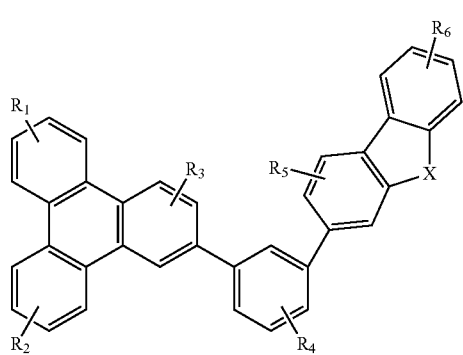
Compound 40
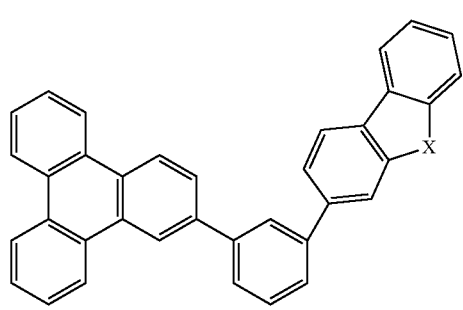
Compound 41G
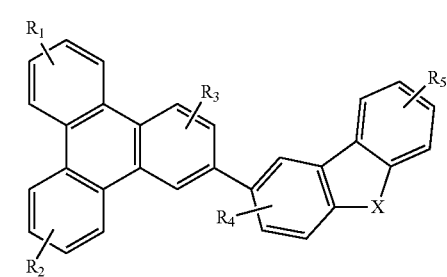
Compound 41
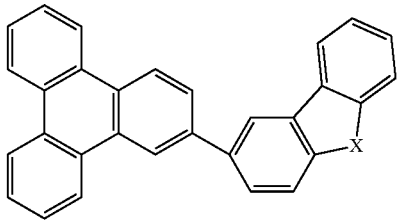
Compound 42G
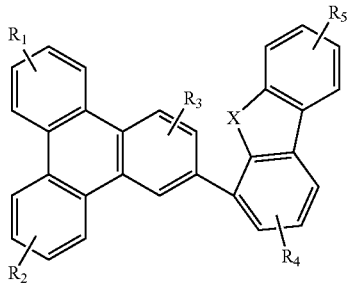
Compound 42
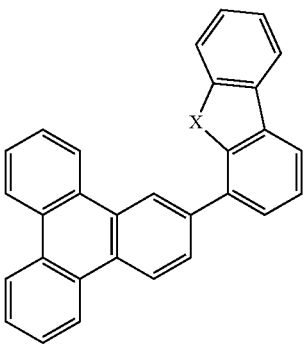
Compound 43G
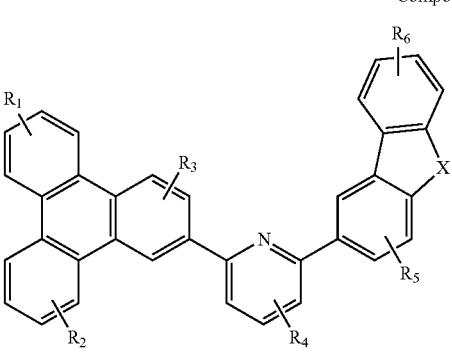
Compound 43
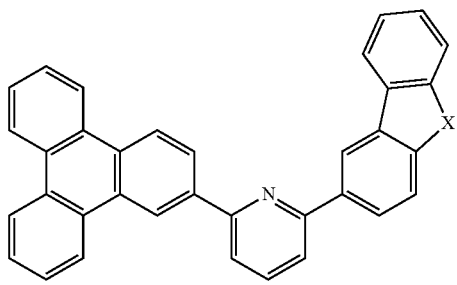
Compound 44G
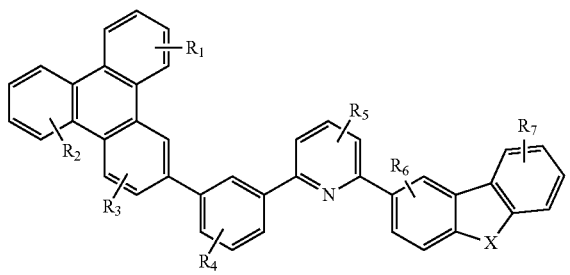
Compound 44
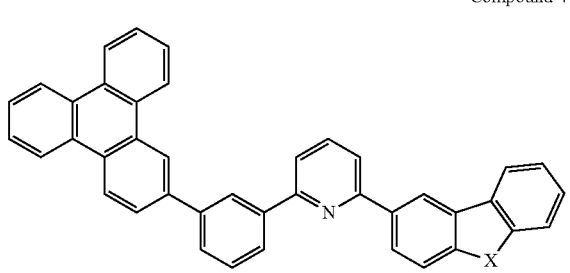

Compound 45G
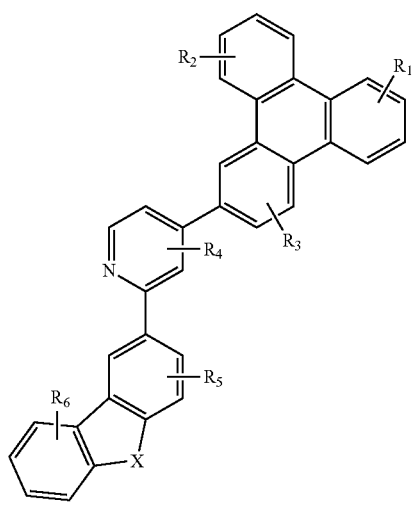
Compound 46
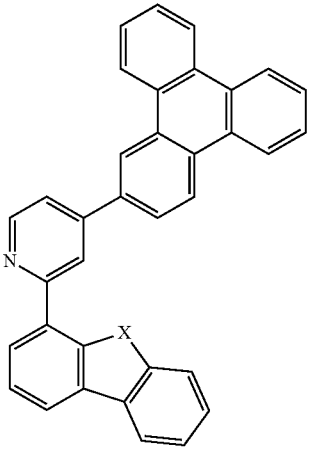
Compound 45
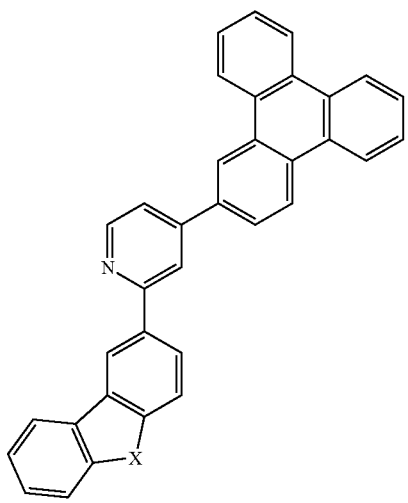
Compound 47G
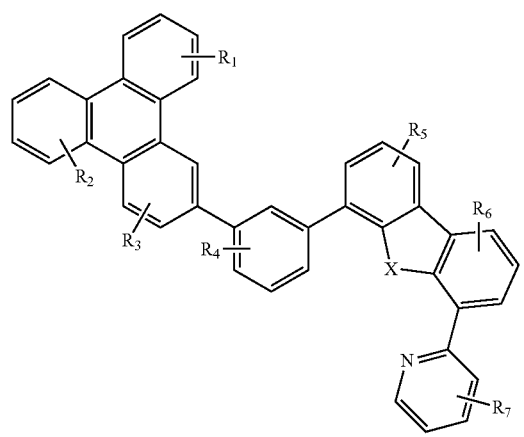
Compound 46G
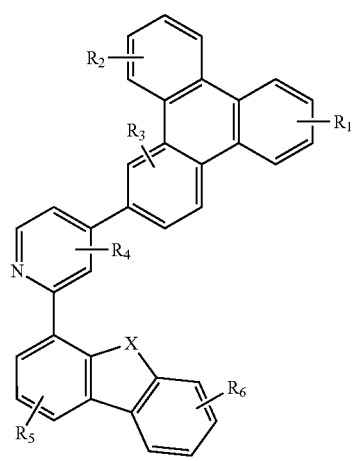
Compound 47
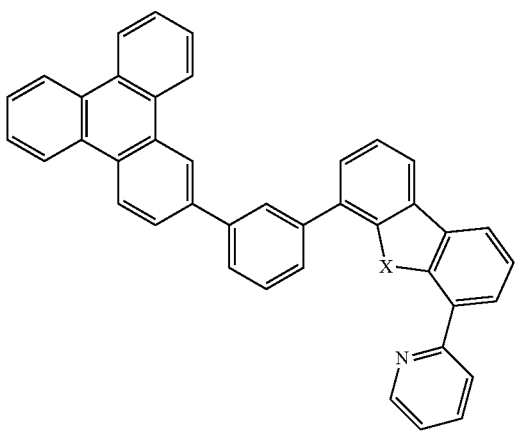

-continued

Compound 48G

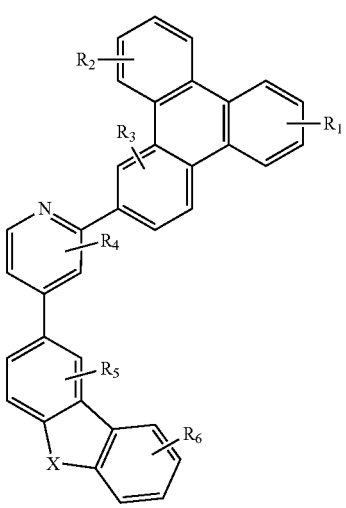

Compound 48

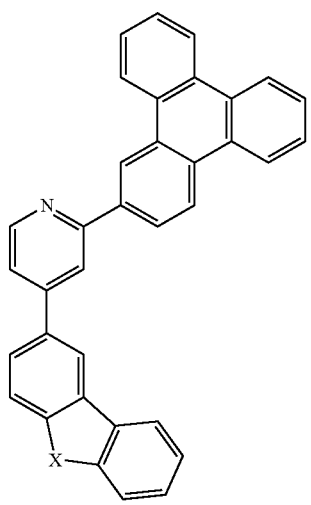

where X is S or O. Preferably, X is S. $R_1$ to $R_n$ are independently selected from the group consisting of $C_nH_{2n+1}$, $OC_nH_{2n+1}$, $OAr_1$, $N(C_nH_{2n+1})_2$, $N(Ar_1)(Ar_2)$, $CH=CH-C_nH_{2n+1}$, $C=CHC_nH_{2n+1}$, $Ar_1$, $Ar_1$-$Ar_2$, $C_nH_{2n}$-$A_{r1}$, or no substitution. Each of $R_1$ to $R_n$ may represent mono, di, tri, or tetra substitutions. n is 1, 2, 3, 4, 5, 6, 7, 8, 9, or 10. $Ar_1$ and $Ar_2$ are independently selected from the group consisting of benzene, biphenyl, naphthalene, triphenylene, carbazole, and heteroaromatic analogs thereof. At least one of $R_1$, $R_2$, and $R_3$ includes a triphenylene group.

All of the host compound materials disclosed herein are compounds that have triplet energies greater than the triplet energy of the phosphorescent dopant. This energy configuration allows confinement of the triplet excited states on the dopant. The use of the additional host materials in the emissive layer may reduce the interaction of the excitons with the charge carriers, thereby reducing exciton quenching, which may improve device efficiency and/or lifetime.

The wide band gap host compounds for the second and the third host compounds in the emissive layer have a HOMO-LUMO band gap of at least 2.0 eV. Depending on the phosphorescent dopant that is used, in some cases, the wide band gap host compound has a HOMO-LUMO band gap of at least 2.5 eV, and in some cases, at least 3.0 eV. In some cases, the HOMO-LUMO band gap of the wide band gap host compound is equal to or greater than that of the hole-transporting first host compound. The wide band gap host compound does not readily transport charges of either type in the emissive layer. In particular, the wide band gap host compound has a lower hole mobility than the hole-transporting first host compound. The host compounds are preferably capable of mixing well with the other components of the emissive layer and capable of promoting the formation of an amorphous film.

The synthesis information for the second and third host compounds described above can be found in PCT publication Nos. WO 2009/021126 published on 12 Feb. 2009, the contents of which are incorporated herein by reference, and WO 2010/083359 published on 22 Jul. 2010, the contents of which are incorporated herein by reference.

The compounds for the emissive layer may be deposited using any suitable deposition technique, including vapor-phase deposition techniques such as vacuum thermal evaporation. The different compounds in the emissive layer may be deposited separately or in combination. For example, each compound may be deposited at individually controlled rates, or alternatively, two or more of the host compounds may be pre-mixed and then be evaporated together.

The components of the multi-component emissive layer discussed herein can be used in the following quantities defined as wt. % of the total emissive layer materials. According to one embodiment, the phosphorescent dopant can be provided in 0.5-20%, more preferably in 1-10%, most preferably 3-7%. The first host compound preferably constitutes no more than 25% and more preferably about 10-20%. The second host compound preferably constitutes about 50-90% and more preferably about 60-80%. The third host compound preferably constitutes about 10-50% and more preferably about 20-40%. The relative amounts of the emitter dopant and the host materials in the emissive layer will vary depending upon the particular application.

Exciton/Electron Blocking Layer:

According to another aspect, the OLED of the present disclosure can further comprise an exciton/electron blocking layer, formed of the material that is the compound represented by the general formula H1 described above, disposed between the emissive layer and the anode. The exciton/electron blocking layer blocks at least one or both of excitons or electrons.

The material for the exciton/electron blocking layer can be selected from the group consisting of the following examples of compounds having the general formula H1: Compound H1-1; Compound H1-2; Compound H1-3; Compound H1-4; Compound H1-5; Compound H1-6; Compound H1-7; Compound H1-8; Compound H1-9; Compound H1-10; Compound H1-11; Compound H1-12; Compound H1-13; Compound H1-14; Compound H1-15; Compound H1-16; and Compound H1-17.

Hole Transport Layer:

The OLED according to another aspect of the present disclosure further comprises at least one hole transport layer disposed between the emissive layer and the anode. The at least one hole transport layer is a material comprising at least one of the compounds having a formula selected from the following formulae (HTL-I) to (HTL-VI) listed below:

(HTL-I) is

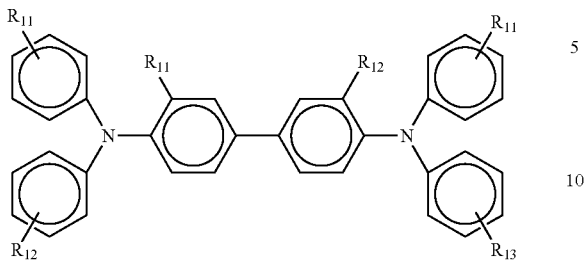

wherein $R_{11}$ and $R_{12}$ may be the same or different and are independently selected from the group consisting of a hydrogen atom, a deuterium atom, a lower alkyl group, a lower alkoxy group, a phenyl group, a phenyl group having a lower alkyl group or deuterium substituent, and a phenyl group having a deuterium atom or a lower alkoxy group substituent with the proviso at least one of $R_{11}$ and $R_{12}$ is a deuterium atom, a normal butyl group, an isobutyl group, a secondary butyl group, a tertiary butyl group, a phenyl group, a phenyl group having a lower alkyl group substituent, or a phenyl group having a lower alkoxy group substituent; and $R_{13}$ represents a hydrogen atom, a deuterium atom, a lower alkyl group, a lower alkoxy group or a chlorine atom;

(HTL-II) is

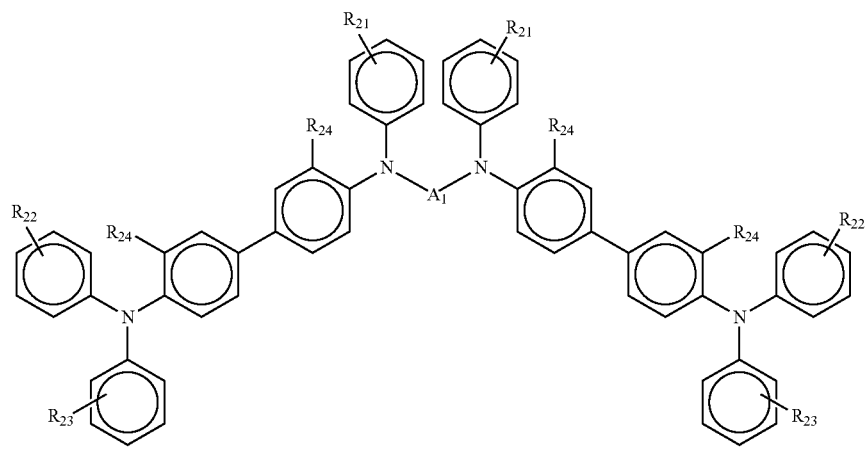

(II)

wherein $R_{21}$, $R_{22}$ and $R_{23}$ may be the same or different and each independently represents a hydrogen atom, a deuterium atom, a lower alkyl group, a lower alkoxy group, an unsubstituted phenyl group, or a phenyl group having a lower alkyl group or a lower alkoxy group as a substituent(s); $R_{24}$ represents a hydrogen atom, a deuterium atom, a lower alkyl group, a lower alkoxy group or a chlorine atom; and $A_1$ represents a group represented by any one of the following structural formulae (a1) to (i1);

(a1)

-continued

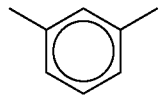

(b1)

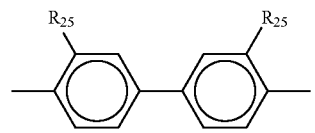

(c1)

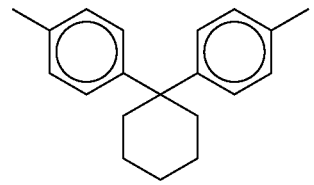

(d1)

-continued

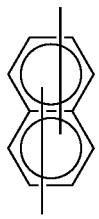

(e1)

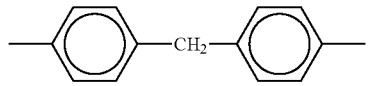

(f1)

-continued

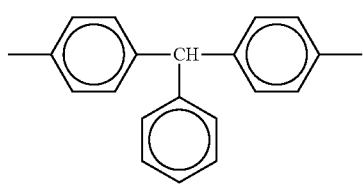
(g1)

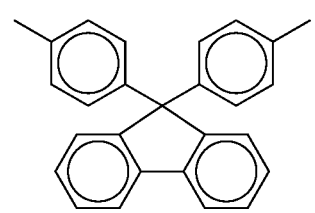
(h1)

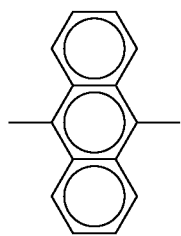
(i1)

in which $R_{25}$ represents a hydrogen atom, a deuterium atom, a lower alkyl group, a lower alkoxy group or a chlorine atom;
(HTL-III) is wherein $R_{31}$, $R_{32}$ and $R_{33}$ may be the same or different and each independently represents a hydrogen atom, a deuterium atom, a lower alkyl group, a lower alkoxy group, an unsubstituted phenyl group, or a phenyl group having a deuterium atom, a lower alkyl group or a lower alkoxy group as a substituent(s); $R_{34}$ represents a hydrogen atom, a deuterium atom, a lower alkyl group, a lower alkoxy group or a chlorine atom; and $A_2$ represents a group represented by any one of the following formulae (j1) to (n1);

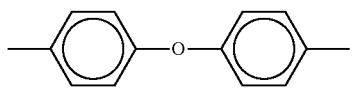
(j1)

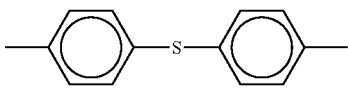
(k1)

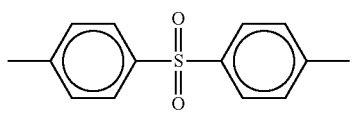
(l1)

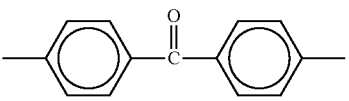
(m1)

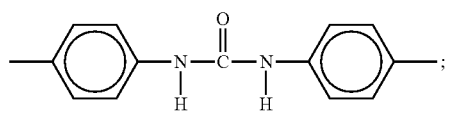
(n1)

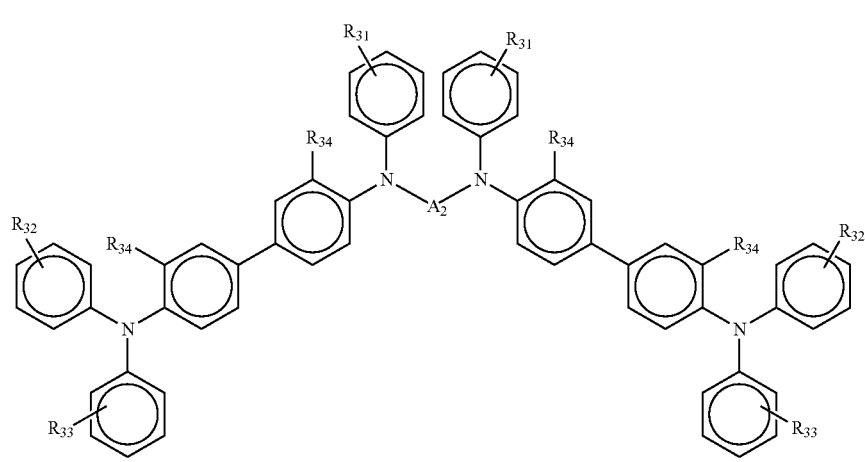
(III)

(HTL-IV) is

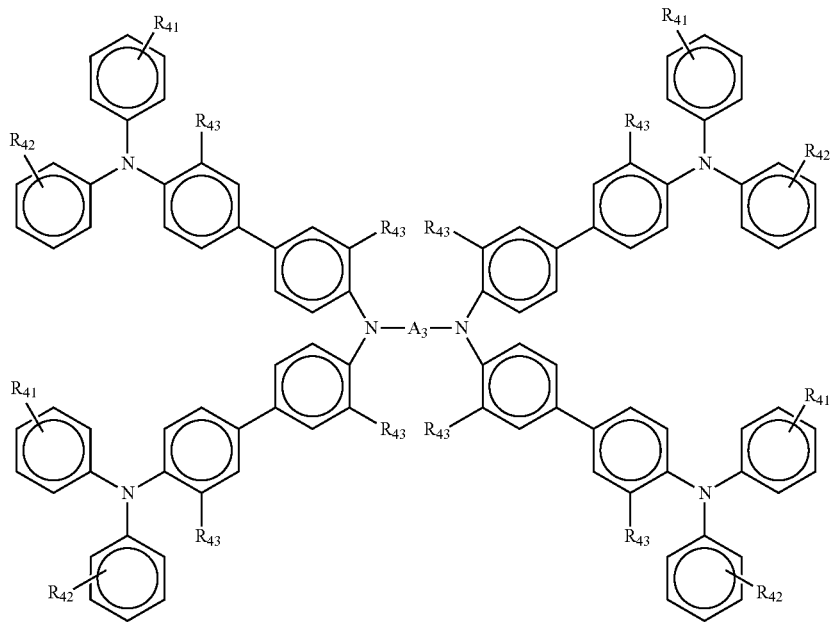

wherein $R_{41}$ and $R_{42}$ may be the same or different and each independently represents a hydrogen atom, a deuterium atom, a lower alkyl group, a lower alkoxy group, an unsubstituted phenyl group or a phenyl group having a deuterium atom, a lower alkyl group or a lower alkoxy group as a substituent(s); $R_{43}$ represents a hydrogen atom, a deuterium atom, a lower alkyl group, a lower alkoxy group or a chlorine atom; and $A_3$ represents a group represented by anyone of the following structural formulae (a2) to (i2);

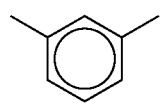 (a2)

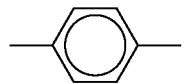 (b2)

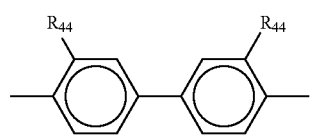 (c2)

-continued

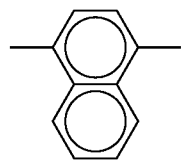 (d2)

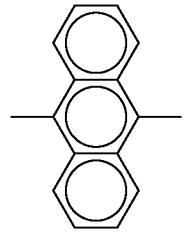 (e2)

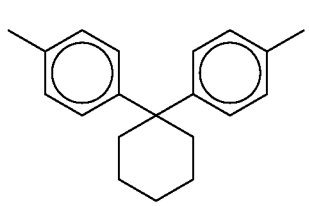 (f2)

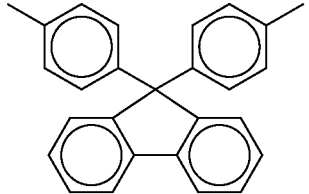 (g2)

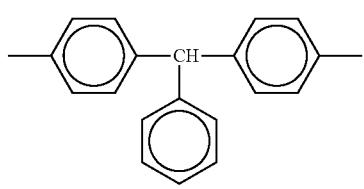 (h2)

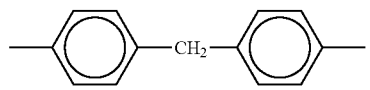 (i2)

in which $R_{44}$ represents a hydrogen atom, a deuterium atom, a lower alkyl group, a lower alkoxy group or a chlorine atom;

(HTL-V) is

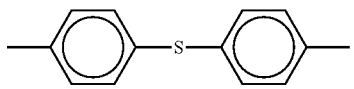 (k2)

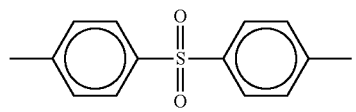 (l2)

(V)

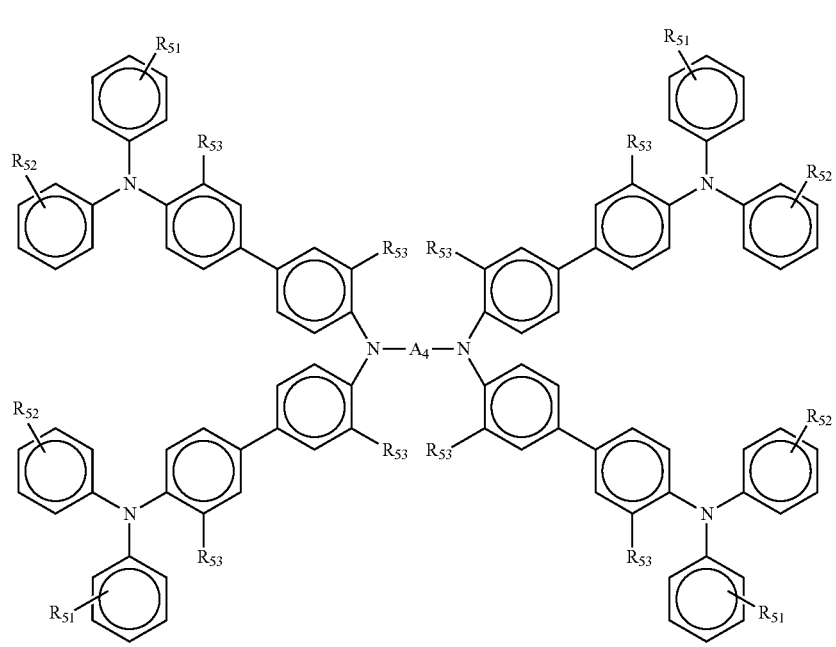

wherein $R_{51}$ and $R_{52}$ may be the same or different and each independently represent a hydrogen atom, a deuterium atom, a lower alkyl group, a lower alkoxy group, an unsubstituted phenyl group or a phenyl group having a deuterium atom, a lower alkyl group or a lower alkoxy group as a substituent(s); $R_{53}$ represents a hydrogen atom, a deuterium atom, a lower alkyl group, a lower alkoxy group or a chlorine atom; and $A_4$ represents a group represented by anyone of the following structural formulae (j2) to (n2);

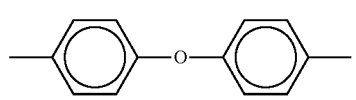 (j2)

-continued

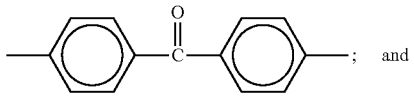 ; and (m2)

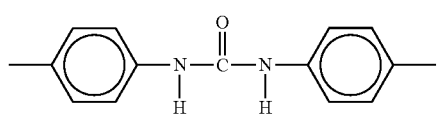 (n2)

(HTL-VI) is

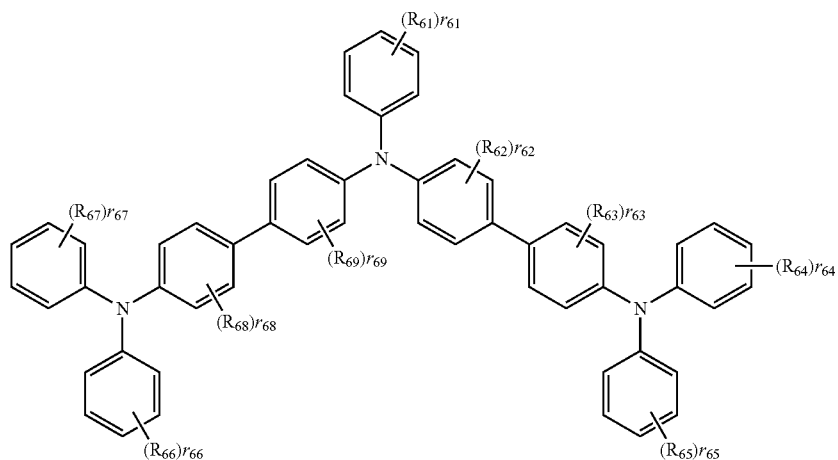

where $R_{61}$ to $R_{69}$, which may be the same or different, independently represent a hydrogen atom, a deuterium atom, a lower alkyl group, a lower alkoxy group, an unsubstituted aromatic hydrocarbon group, a phenyl group having a deuterium atom, a lower alkyl group or a lower alkoxy group; $r_{61}$ to $r_{69}$, which may be the same or different, represent 0, 1 or 2.

The terms "lower alkyl group" and "lower alkoxy group" as used herein mean "$C_{1-4}$ alkyl group" and "$C_{1-4}$ alkoxy group," respectively.

The synthesis information for the compounds of the formulae (HTL-I) to (HTL-VI) and the specific examples of the compounds of formulae (HTL-I) to (HTL-VI) are provided in U.S. Pat. No. 5,707,747 to Tomiyama et al., the contents of which are incorporated herein by reference.

Examples of compounds having the structure of formula (HTL-I) to (HTL-VI) include:

Compound-1a

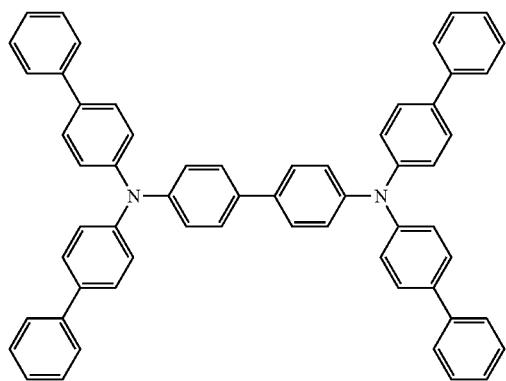

Compound -2a

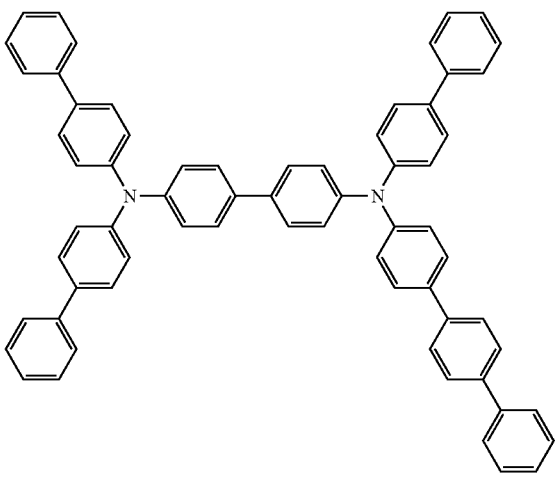

Compound-3a

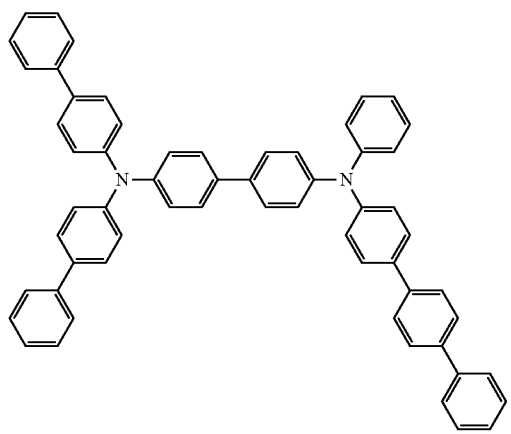

Compound-4a

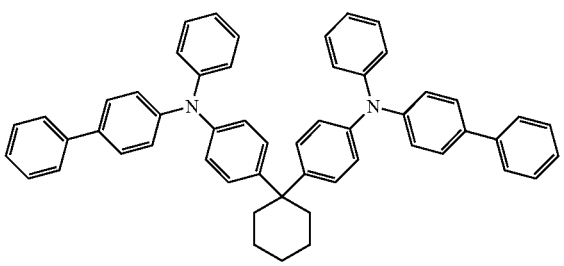

-continued
Compound-5a
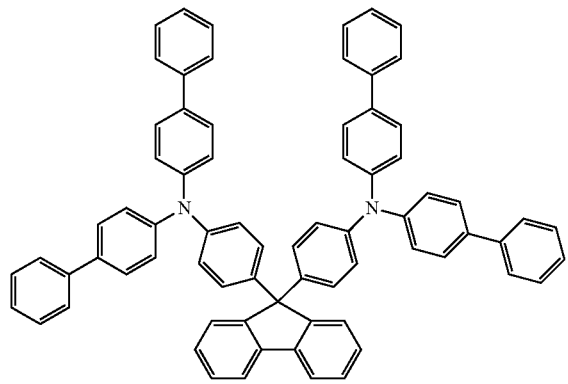
Compound-6a
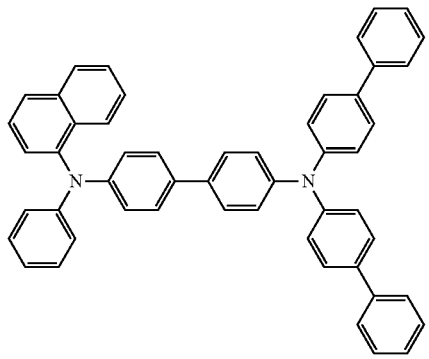
Compound-7a
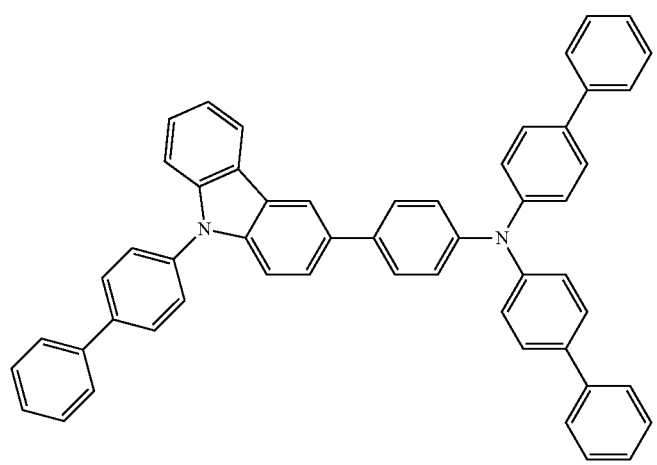
Compound-8a
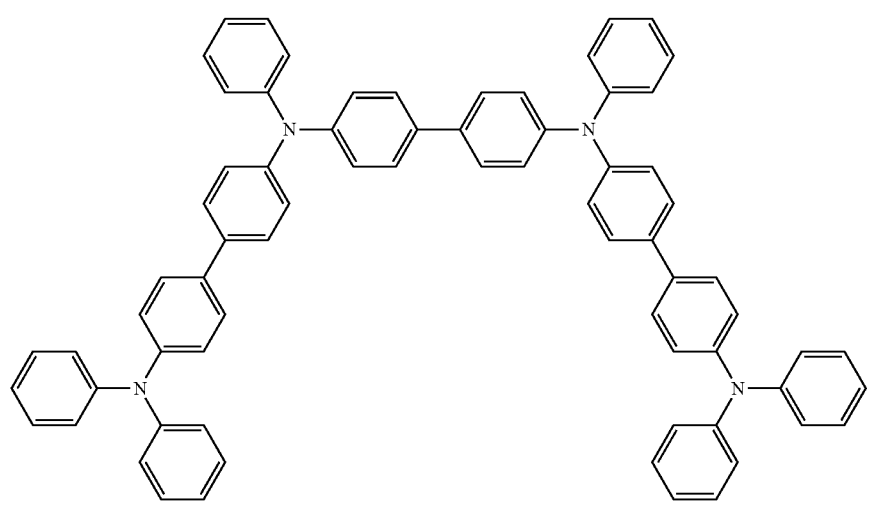

-continued
Compound-9a
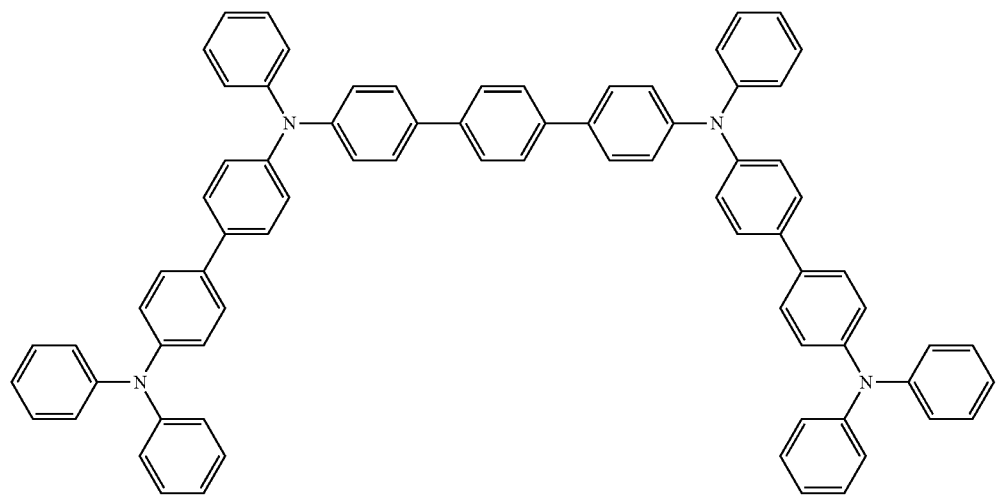
Compound-10a
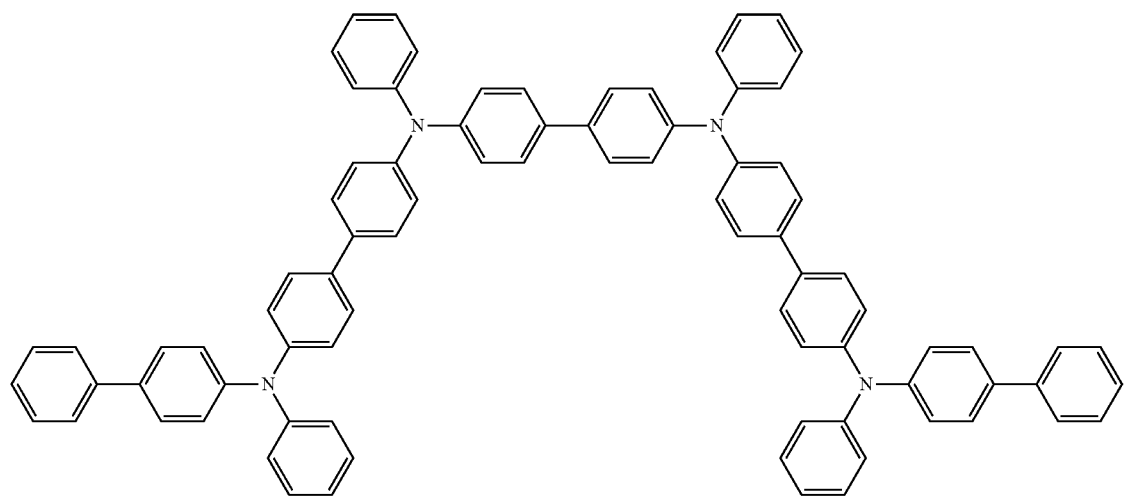
Compound-11a
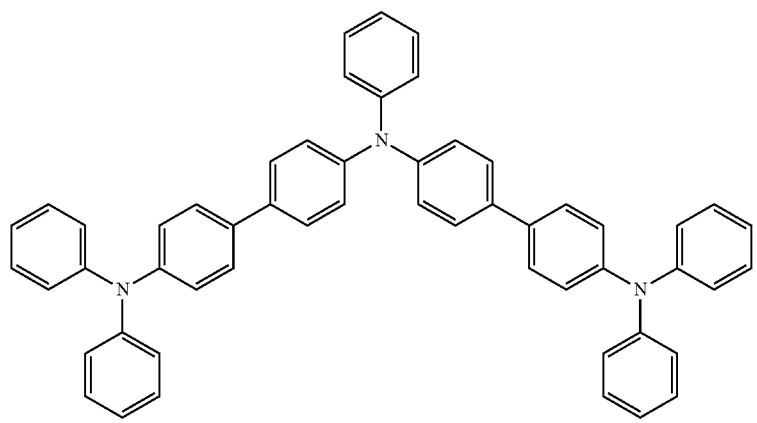

-continued

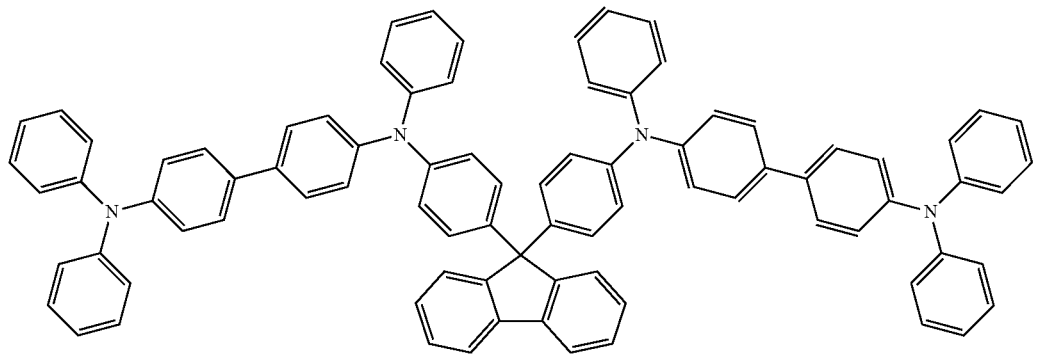

Compound-12a

Synthesis Example 4: Synthesis of N,N,N',N'-Tetrakis(biphenyl-4-yl)-4,4'-diaminobiphenyl (Compound-1a): A mixture of bis(biphenyl-4-yl)amine 10.0 g (31.1 mmol), 4,4'-Diiodobiphenyl 5.28 g (30.0 mmol), anhydrous potassium carbonate 5.39 g (39.0 mmol), copper powder 0.083 g (1.3 mmol), dodecylbenzene 12 ml and xylene 24 ml was stirred and heated. After xylene was evaporated the mixture was reacted at 210-215° C. for 4 hours. Furthermore copper powder 0.083 g (1.3 mmol) was added to the mixture, additional reaction was proceeded for 4.5 hours. After cooling to 90° C., toluene was added to the reaction mixture, and the reaction mixture was cooled to room temperature. The reaction mixture was filtered and washed with water, methanol and toluene. The residue was extracted with hot toluene and toluene solution was concentrated to dry-up in vacuo. The crude product obtained was purified by recrystallization. 7.38 g (yield: 71.7%) of N,N,N',N'-Tetrakis (biphenyl-4-yl)-4,4'-diaminobiphenyl (Compound-1a) was obtained. The melting point was 265° C.

Synthesis Example 5: Synthesis of 4',4'''-bis[bis(4-biphenylyl)amino]-9,9-diphenylfluorene (Compound-5a): A mixture of bis(biphenyl-4-yl)amine 20.30 g (63.16 mmol), 9,9-bis(4-iodophenyl)fluorene 15.0 g (26.31 mmol), anhydrous potassium carbonate 10.91 g (78.92 mmol), copper powder 0.17 g (2.63 mmol) and dodecylbenzene 30 ml was stirred and heated at 200° C. for 13 hours under nitrogen gas. The reacting mixture was analyzed by HPLC, it was confirmed that the monoiodo-compound of intermediates was 1% or less, and assumed a reactive end. Toluene 100 ml was added to the reaction mixture and filtered. A residue was washed with methanol and water. The residue was added in chlorobenzene 2000 ml and heated to 120° C. After cooling to 60° C. the mixture was filtered and the filtrate was concentrated to dry up. The crude product obtained was purified by recrystallization by chlorobenzene for 3 times. The purified product, 4',4'''-bis[bis(4-biphenylyl)amino]-9,9-diphenylfluorene (Compound-5a) was 17.9 g of gray-white powder. Yield was 71% and melting point was 324-326° C.

Substrate:

The OLED of the present invention may be prepared on a substrate. The substrate referred to in this case is a substrate for supporting the OLED, and it is preferably a flat substrate in which light in the visible region of about 400 to about 700 nm has a transmittance of at least about 50%.

The substrate may include a glass plate, a polymer plate and the like. In particular, the glass plate may include soda lime glass, barium.strontium-containing glass, lead glass, aluminosilicate glass, borosilicate glass, barium borosilicate glass, quartz and the like. The polymer plate may include polycarbonate, acryl, polyethylene terephthalate, polyether sulfide, polysulfone and the like.

Electrodes:

The anode 3 in the OLED 100 of the present invention assumes the role of injecting holes into the hole injecting layer, the hole transporting layer or the light emitting layer. Typically the anode has a work function of 4.5 eV or more. Specific examples of a material suitable for use as the anode include indium tin oxide alloy (ITO), tin oxide (NESA), indium zinc oxide, gold, silver, platinum, copper and the like. The anode can be prepared by forming a thin film from electrode substances, such as those discussed above, by a method such as a vapor deposition method, a sputtering method and the like.

When light is emitted from the light emitting layer, the transmittance of light in the visible light region in the anode is preferably larger than 10%. The sheet resistance of the anode is preferably several hundred Ω/square or less. The film thickness of the anode is selected, depending on the material, and is typically in the range of from about 10 nm to about 1 μm, and preferably from about 10 nm to about 200 nm.

The cathode 11 comprises preferably a material having a small work function for the purpose of injecting an electron into the electron injecting layer, the electron transporting layer or the light emitting layer. Materials suitable for use as the cathode include, but are not limited to indium, aluminum, magnesium, magnesium-indium alloys, magnesium-aluminum alloys, aluminum-lithium alloys, aluminum-scandium-lithium alloys, magnesium-silver alloys and the like. For transparent or top-emitting devices, a TOLED cathode such as disclosed in U.S. Pat. No. 6,548,956 is preferred.

The cathode can be prepared, as is the case with the anode, by forming a thin film by a method such as a vapor deposition method, a sputtering method and the like. Further, an embodiment in which light emission is taken out from a cathode side can be employed as well.

Figure 8:
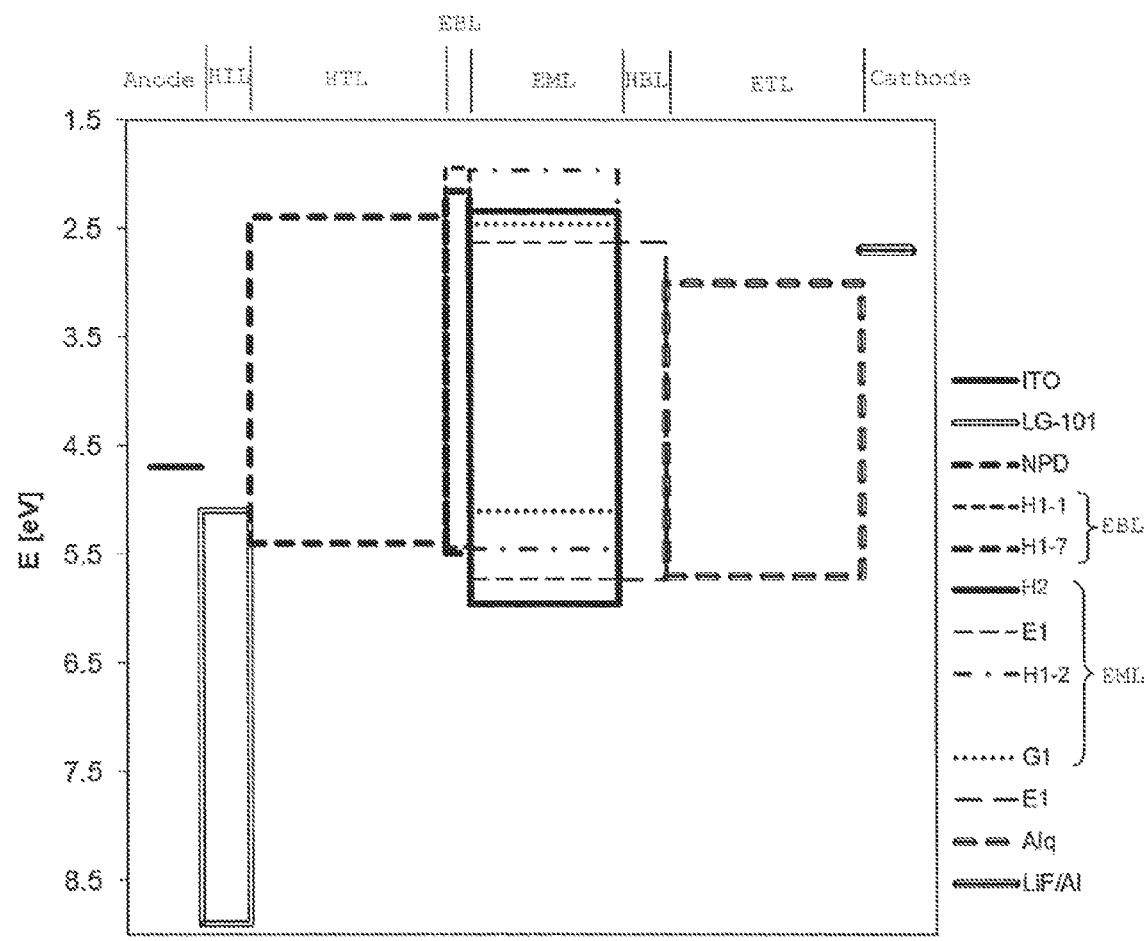
FIG. 8 is a composite energy level diagram for the Example Devices #5 and #6.

Inverted OLED:

FIG. 8 shows an inverted OLED 400 according to another embodiment of the present disclosure. The device includes a substrate 410, a cathode 415, an emissive layer 420, a hole transport layer 425, and an anode 430. OLED 400 may be fabricated by depositing the layers described, in order. Because the most common OLED configuration has a cathode disposed over the anode, and device 400 has cathode 415 disposed under anode 430, device 400 may be referred to as an inverted OLED. OLED 400 also illustrates an example of an OLED in which some of the layers illustrated in the OLED 100 of FIG. 1 are omitted from the device architecture.

The simple layered structures of OLEDs 100, 200, 300 and 400 are provided by way of non-limiting examples and it is understood that embodiments of the invention may be used in connection with a wide variety of other structures. The specific materials and structures described are exemplary in nature, and other materials and structures may be used. Functional OLEDs may be achieved by combining the various layers described in different ways, or certain layers may be omitted entirely, based on the design, performance, and cost factors. Other layers not specifically described herein may also be included.

Although many of the examples provided herein described various layers as comprising a single material, it is understood that combinations of materials, or more generally a mixture, may be used. Also, the layers may have various sub-layers. The names given to the various layers herein are not intended to be strictly limiting. For example, in device 400, hole transport layer 425 transports holes and injects holes into emissive layer 420, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described.

EXAMPLES

Figure 9:
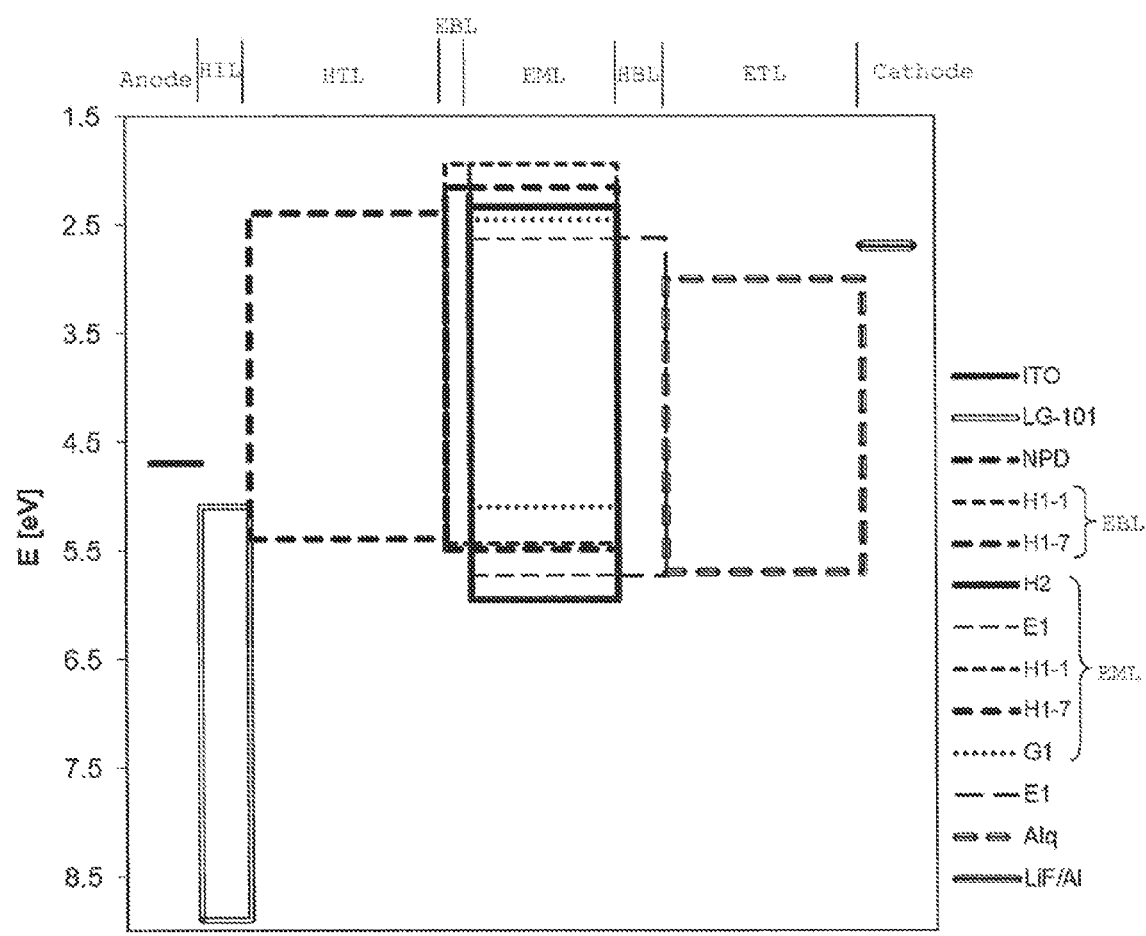
FIG. 9 is a composite energy level diagram for the Example Devices #7 through #16.
Figure 10:
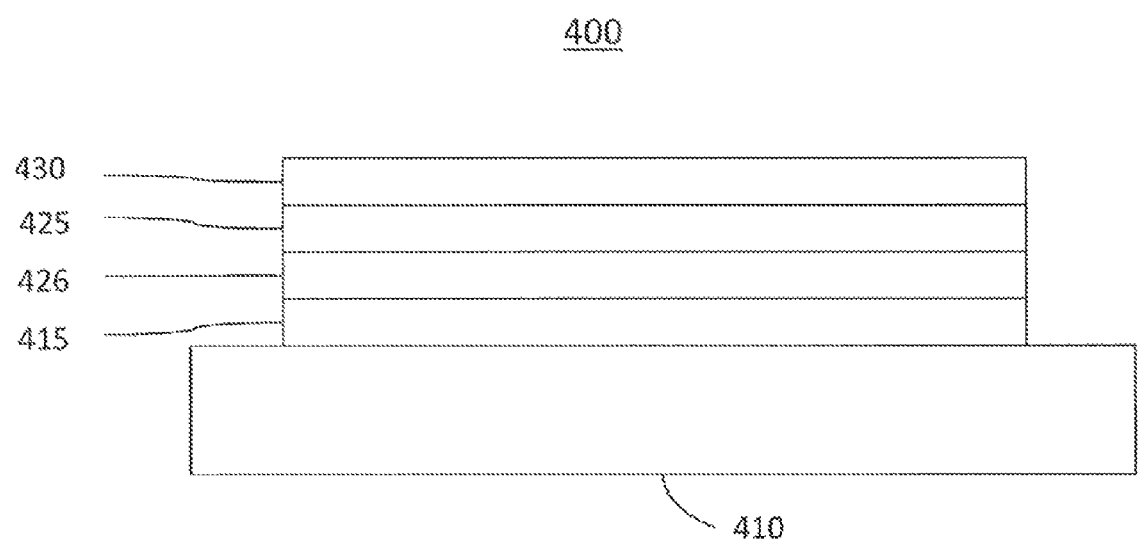
FIG. 10 is a schematic illustration of an inverted OLED.
Figure 11:
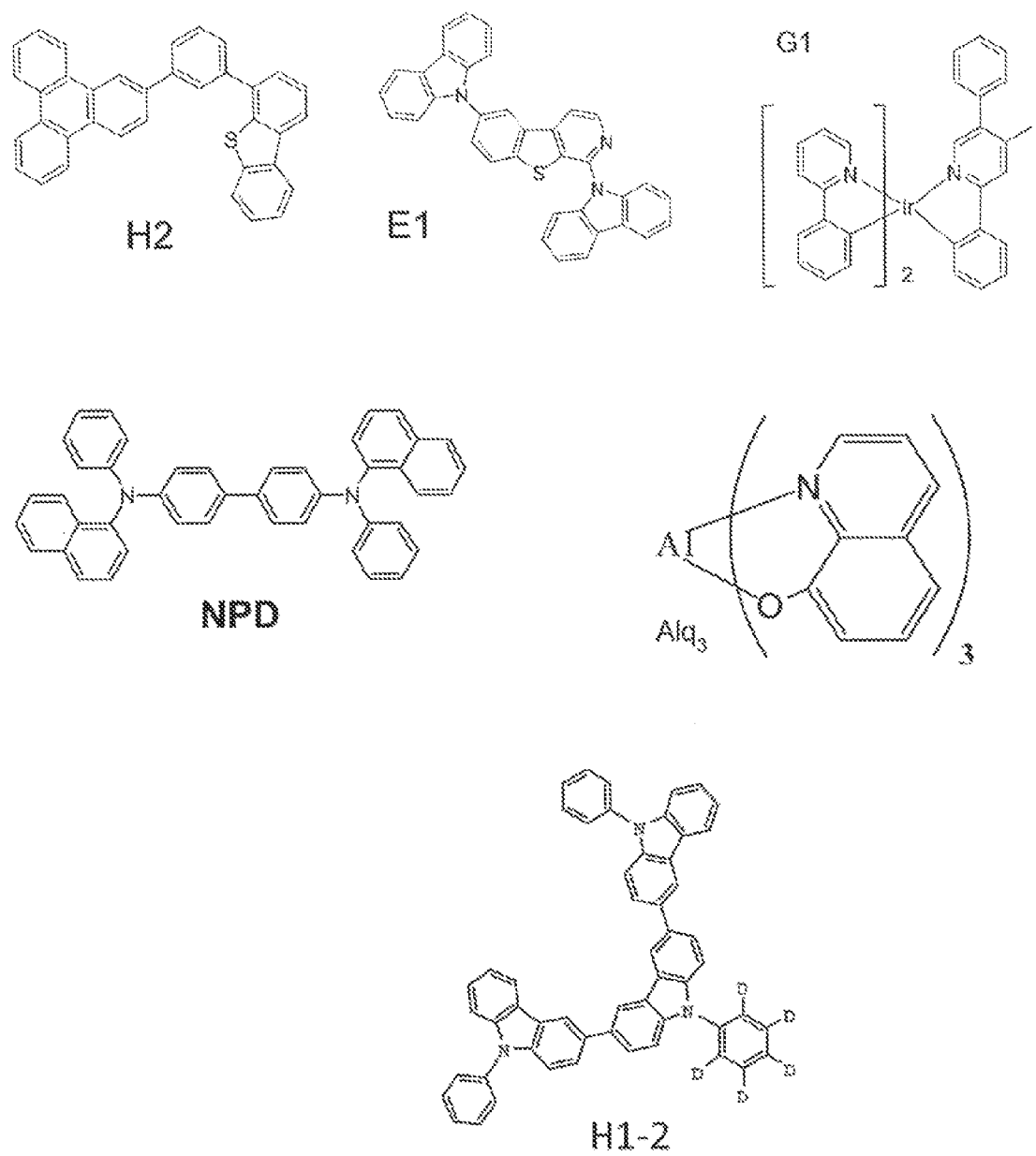
FIG. 11 shows structures of some of the organic compounds used in the sample devices.

The invention will be described in further detail with reference to the following examples and comparative examples. However, the invention is not limited by the following examples. FIG. 9 shows the chemical structure of the particular organic compound examples of H1-1, H1-2, H1-7, H2, E1, G1, NPD and Alg$_3$ used in making the sample devices Deuterated Compound H1-2 as a Co-Host
Material—Example Device #1

Figure 2:
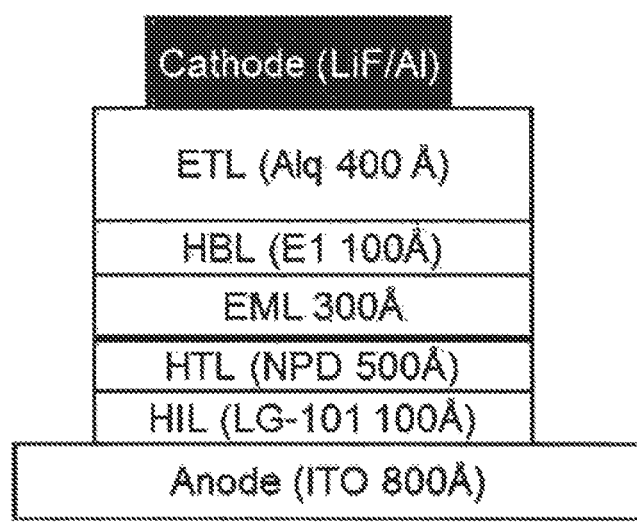
FIG. 2 is a schematic illustration of an OLED architecture according to an embodiment of the present disclosure in which a hole transporting material is used as a co-host material in a multi-component emissive layer.

An experimental green PHOLED having a four-component emissive layer and having the architecture shown in FIG. 2 was constructed. The example device #1 had an ITO anode and a LiF/Al cathode. Disposed between the two electrodes were: 100 Å thick hole injection layer, HIL, made of the compound LG-101 (from LG Chemical), a 500 Å thick hole transport layer, HTL, made of NPD, a 300 Å thick four-component emissive layer, EML, a 100 Å thick hole blocking layer, HBL, made of the compound E1, and a 400 Å thick electron transport layer, ETL, made of Alg$_3$. In Device #1, the four-component EML was formed with three host compounds. The first host compound was compound H1-2 as a hole-transporting host. The second host compound was compound H2 as a wide band gap host and the third host compound was compound E1 as an electron-transporting host. Compound G1 was the green emitter dopant. The HOMO-LUMO energy levels of these compounds are provided in Table 1 below.

TABLE 1

Energy levels of the EML components

| Compound | LUMO [eV] | HOMO [eV] | Triplet Energy [eV] |
|---|---|---|---|
| H2 | 2.34 | 5.96 | 2.63 |
| E1 | 2.63 | 5.73 | 2.95 |
| H1-1 | 1.94 | 5.44 | 2.74 |
| H1-2 | 1.97 | 5.45 | 2.75 |
| H1-7 | 2.16 | 5.49 | 2.71 |
| G1 | 2.46 | 5.1 | 2.40 |

The functions of the organic compounds used in the exemplary devices according to the present disclosure are provided in Table 2 below.

TABLE 2

Functions of the organic compounds

| | Compound | | | | | |
|---|---|---|---|---|---|---|
| | H1-2 | H1-2 | H1-1 | H1-1 | H1-7 | H1-7 |
| Layer location | exciton/electron blocking layer | Emissive Layer | exciton/electron blocking layer | Emissive Layer | exciton/electron blocking layer | Emissive Layer |
| Function | Exciton and/or Electron blocker | Hole-transporting host | Exciton and/or Electron blocker | Hole-transporting host | Exciton and/or Electron blocker | Hole-transporting host |

| | Compound | | | |
|---|---|---|---|---|
| | H2 | G1 | E1 | E1 |
| Layer location | Emissive Layer | Emissive Layer | Emissive Layer | Hole Blocking Layer |
| Function | Wide band gap Matrix host | Emitter Dopant | Electron-transporting host | Hole Blocker |

The amount of each of the components of the emissive layer used are provided in Table 3 below. The amounts are provided in wt. % of the emissive layer. In the example device #1, the concentrations of the first host compound H1-2, the second host compound H2, the third host compound E1, and the emitter dopant G1 were 15 wt. %, 60 wt. %, 20 wt. %, and 5 wt. %, respectively.

Deuterated Compound H1-2 as a Co-Host
Material—Example Device #2

A second experimental green PHOLED having the same architecture as shown in FIG. 2 and having a three-component emissive layer was constructed. The three-component EML of the Example Device #2 was formed using two host compounds. The first host was compound H1-2 as the hole-transporting host. The second host was compound E1 as the electron-transporting host. Compound G1 was the green emitter dopant. The amount of the components of the emissive layer used are provided in Table 3 in wt. % of the emissive layer. In the Example Device #2, the concentrations of the first host compound H1-2, the second host compound D1 and the emitter dopant G1 were 18 wt. %, 77 wt. %, and 5 wt. %, respectively.

Compound H1-1 as a Co-Host Material—Example Device #7

Example Device #7 was also an experimental green PHOLED having the same general architecture as the Devices #1 and #2 and had a four-component emissive layer. The four-component EML of the Example Device #7 was formed using three host compounds. The first host was compound H1-1 as a hole-transporting host. The second host was compound H2 as a wide band gap host. The third host was compound E1 as an electron-transporting host. Compound G1 was the green emitter dopant. The amount of the components of the emissive layer used are provided in Table 3 in wt. % of the emissive layer. In the Example Device #7, the concentrations of the first host compound H1-1, the second host compound H2, the third host compound E1, and the emitter dopant G1 were 15 wt. %, 60 wt. %, 20 wt. % and 5 wt. %, respectively.

Compound H1-7 as a Co-Host Material—Example Device #8

Example Device #8 was also an experimental green PHOLED having the same general architecture as the Devices #1, #2 and #7 and had a three-component emissive layer. The three-component EML of the Example Device #8 was formed using two host compounds. The first host was compound H1-7 as a hole-transporting host. The second host was compound E1 as an electron-transporting host. Compound G1 was the green emitter dopant. The amount of the components of the emissive layer used are provided in Table 3 in wt. % of the emissive layer. In the Example Device #8, the concentrations of the first host compound H1-7, the second host compound E1, and the emitter dopant G1 were 15 wt. %, 20 wt. %, and 5 wt. %, respectively.

Figure 3:
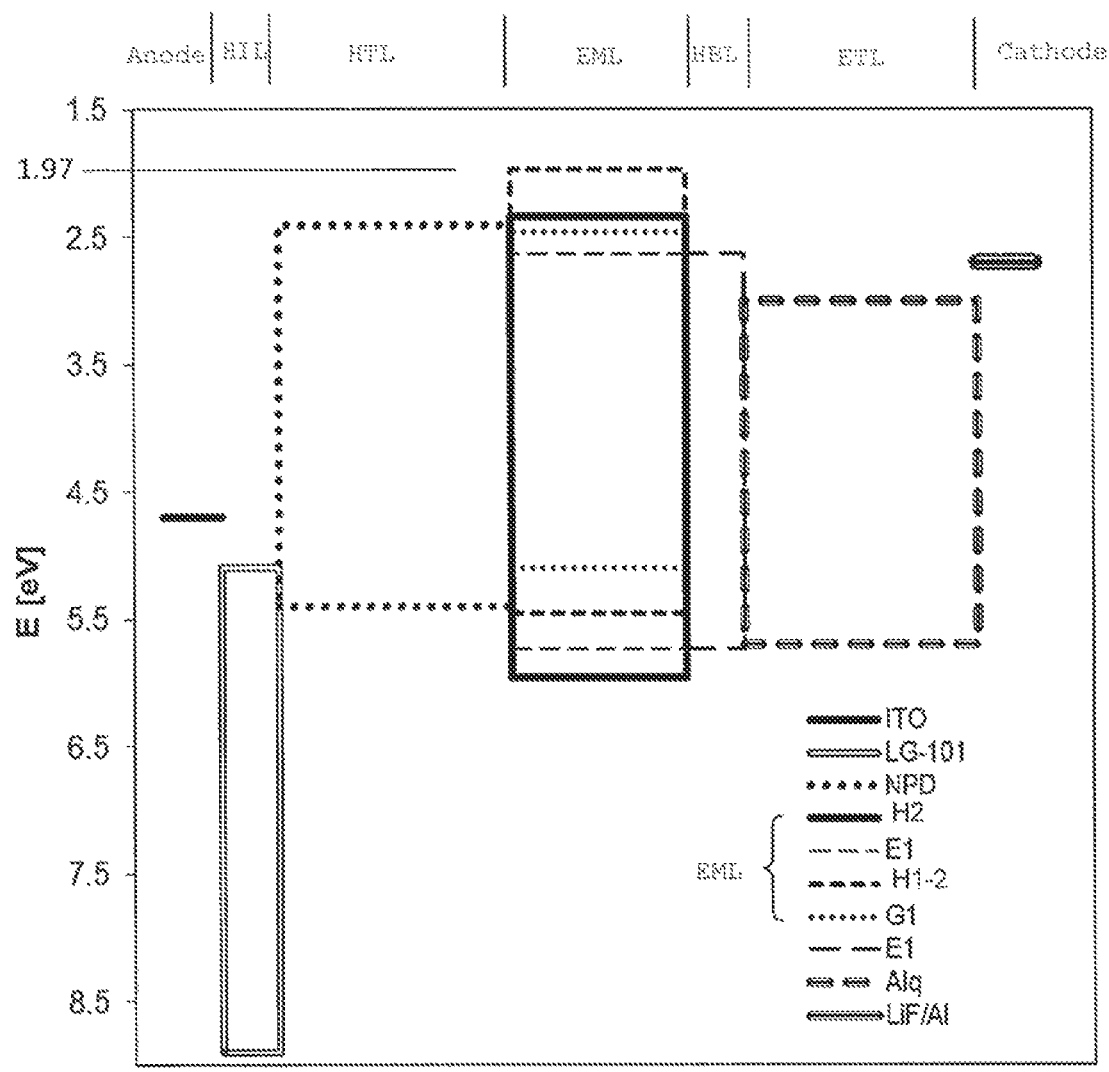
FIG. 3 is an energy level diagram for the device of FIG. 2 in which the emissive layer is a four-component emissive layer comprising a hole transporting co-host material according to an embodiment.
Figure 4:
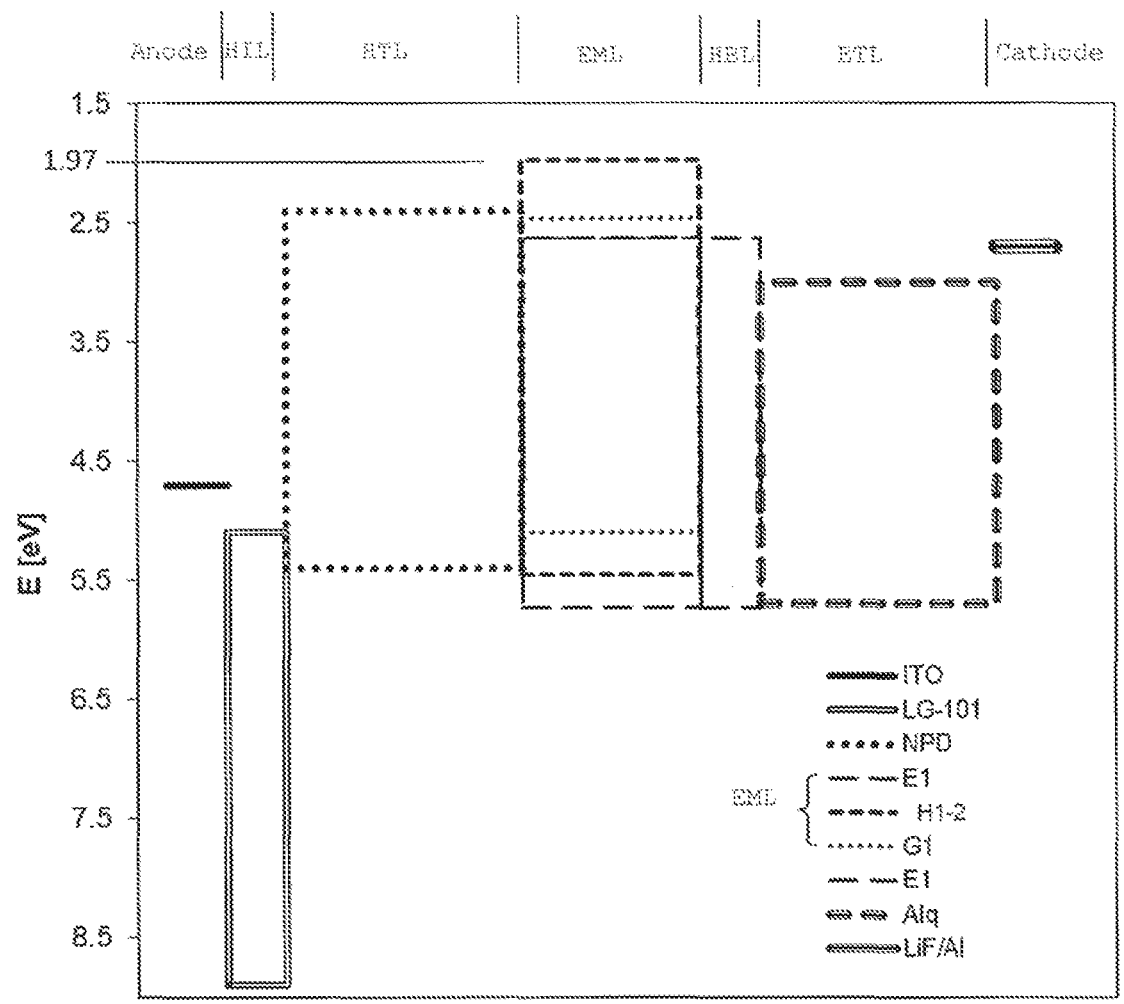
FIG. 4 is an energy level diagram for the device of FIG. 2 in which the emissive layer is a three-component emissive layer comprising a hole transporting co-host material according to another embodiment.

The energy level diagram for the four-component EML of the Example Device #1 is shown in FIG. 3. The energy level diagram for the three-component EML of the Example Device #2 is shown in FIG. 4. The energy level diagram for the four-component EML portion of the Example Device #7 and the three-component EML portion of the Example Device #8 are represented in FIG. 9. The energy level diagram in FIG. 9 over lays the HOMO-LUMO energy levels of the various compounds used in many of the example devices. Therefore, the diagram in FIG. 9 is not meant to represent one particular sample device. The HOMO levels of compounds H1-2, H1-1, and H1-7 are 5.45 eV, 5.44 eV, and 5.49 eV respectively, which are higher (or less electronegative) than the HOMO levels of the other host materials H2 and E1 which are 5.96 and 5.73, respectively. The host materials H2 and E1 are thus more electron-transporting than compounds H1-2, H1-1 and H1-7. The HOMO levels of compounds H1-2, H1-1, and H1-7 are relatively close to HOMO level of the emitter dopant G1 (5.1 eV), and as discussed above, this allows the hole-transporting host compounds H1-2, H1-1, and H1-7 to offload the hole transporting function from the emitter dopant which extends the life of the emitter dopant material. In the Example Devices #1, #2, #7 and #8 with high 15-18 wt. % of compounds H1-2, H1-1, and H1-7 and low 5 wt. % of G1 in the EML, the majority of holes are believed to be transported by the host compounds H1-2, H1-1, and H1-7 which enhances separation of the charge carriers and excitons and minimizes concentration quenching and polaron-exciton interaction. The triplet energy of compound H1-2 (2.75 eV) is higher than the triplet energy of G1 (2.4 eV) and does not cause the emission quenching.

For comparison, two corresponding reference devices, CE1 and CE2 were also constructed and tested. The emissive layer of CE1 had the same components H2, E1, and G1 as with the Example Devices #1 and #7 but without compounds H1-2 or H1-1. The emissive layer of CE2 had the same components E1 and G1 as with the Example Devices #2 and #8 but without compounds H1-2 or H1-7. The measured performance parameters of the devices is shown in Table 3. The Example Devices with compounds H1-2, H1-1 or H1-7 component in the EML exhibited superior efficiency and lifetime performance as compared to the corresponding reference devices, CE1 and CE2, without compound H1-2, H1-1 or H1-7 in the EML. The Example Devices #1 and #7 exhibited higher luminous efficiency (LE) and external quantum efficiency (EQE) and longer lifetime (LT97%) in comparison to CE1. The Example Devices #2 and #8 exhibited longer lifetime (LT97%) in comparison to CE2. The substantially superior performance data of the Example Devices from adding one component, compounds represented by the general formula H1 of the present disclosure, such as H1-2, H1-1, or H1-7, to the emissive layer as a co-host was unexpected.

TABLE 3

Example Devices Experimental Data

| | EBL | Emissive Layer Components | | | | HBL | 1931 CIE | | λ max [nm] | FWHM [nm] |
| | | First Host [wt %] | Second Host [wt %] | Third Host [wt %] | Emitter [wt %] | | x | y | | |
| --- | --- | --- | --- | --- | --- | --- | --- | --- | --- | --- |
| Example Device #1 | — | H1-2 15 | H2 60 | E1 20 | G1 5 | E1 | 0.333 | 0.621 | 522 | 72 |
| Example Device #2 | — | H1-2 18 | — | E1 77 | G1 5 | E1 | 0.329 | 0.622 | 522 | 70 |
| Example Device #7 | — | H1-1 15 | H2 60 | E1 20 | G1 5 | E1 | 0.322 | 0.628 | 522 | 68 |

TABLE 3-continued

Example Devices Experimental Data

| | | | | | | | | | | |
|---|---|---|---|---|---|---|---|---|---|---|
| Example Device #8 | — | H1-7 15 | | E1 20 | G1 5 | E1 | 0.322 | 0.627 | 522 | 66 |
| CE1 | — | — | H2 68 | E1 20 | G1 12 | E1 | 0.344 | 0.616 | 528 | 72 |
| CE2 | — | — | — | E1 83 | G1 17 | E1 | 0.337 | 0.622 | 526 | 68 |

| | At 1,000 nits | | | At 10,000 | | 40 mA/cm2 | |
|---|---|---|---|---|---|---|---|
| | Voltage [V] | LE [cd/A] | EQE [%] | PE [lm/W] | nits LT97% [h]* | $L_0$ [nits] | LT97% [h] |
| Example Device #1 | 5.1 | 72.7 | 20 | 44.6 | 63 | 22,378 | 15 |
| Example Device #2 | 5.2 | 50.5 | 13.9 | 30.5 | 62 | 15,469 | 28 |
| Example Device #7 | 4.6 | 75 | 21 | 51 | 97 | 23,236 | 21 |
| Example Device #8 | 4.8 | 61 | 17 | 40 | 122 | 18,356 | 41 |
| CE1 | 4.9 | 70.1 | 19.2 | 44.7 | 44 | 20,271 | 12 |
| CE2 | 4.4 | 63.4 | 17.3 | 44.9 | 28 | 19,482 | 8 |

*Calculated assuming accelerated factor 1.8

Figure 5:
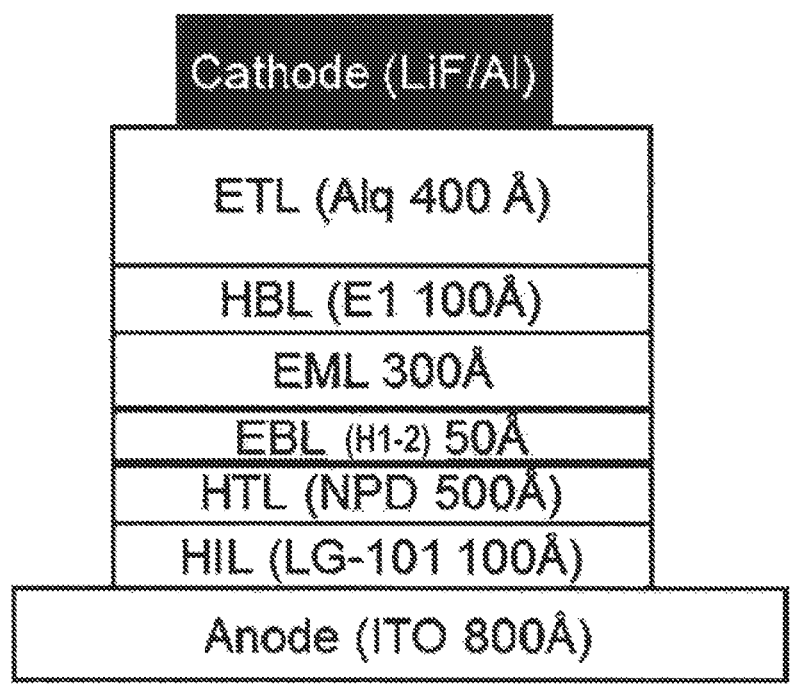
FIG. 5 is a schematic illustration of an OLED architecture according to another embodiment, in which the hole transporting material can be used as a co-host material in the emissive layer as well as an exciton/electron blocking layer.

Compounds H1-2, H1-7, and H1-1 as an exciton/electron blocker (EBL): Example Devices #3, #9, and #10 were constructed for testing the use of compound H1-2, H1-7, and H1-1, respectively, as an exciton/electron blocking layer. Example Devices #3, #9, and #10 had the architecture 300 shown in FIG. 5. The emissive layer of Example Devices #3, #9, #10 had a three-component composition consisting of the host compounds H2 (65 wt. %-68 wt. %) and E1 (20 wt. %), and the emitter dopant compound G1 (15 wt. %-12 wt. %).

Compounds H1-2, H1-7, and H1-1 as an exciton/electron blocker and a co-host material: Example Devices #4, #5, #6, and #11 through #16 were constructed for testing the use of compounds H1-2, H1-7, and H1-1 as a hole-transporting host material in the emissive layer as well as an exciton/electron blocking layer. These Example Devices also had the architecture 300 shown in FIG. 5 but the emissive layer had a four-component composition. For example, Example Device #4 had compound H1-2 as the exciton/electron blocker layer and an EML consisting of the hole-transporting first host compound H1-2 (15 wt. %), a wide band gap host compound H2 (60 wt. %), an electron-transporting host E1 (20 wt. %), and the emitter dopant compound G1 (5 wt. %). In Example Device #5, compound H1-7 was the exciton/electron blocker layer and the EML consisted of the hole-transporting first host compound H1-2 (15 wt. %), a wide band gap host compound H2 (60 wt. %), an electron-transporting host E1 (20 wt. %), and the emitter dopant compound G1 (5 wt. %). As shown in Table 4, the Example Devices #6 and #11 through #16 were constructed using various combinations of compounds H1-1, H1-7 and H1-2 as the hole-transporting co-host as well as the exciton/electron blocker. For comparison, a reference device CE3 was constructed having the same emissive layer composition as that of the Example Device #3 but with a layer of NPD in the place of compound H1-2 as the exciton/electron blocking layer. The compositions of the Example Devices #3, #4, #5, #6, and #9 through #16 and their performance data are provided in Table 4 below.

The data presented in Table 4 shows that the Example Devices #3 through #6, and #9 through #16 exhibited higher luminous efficiency (LE), external quantum efficiency (EQE) and longer lifetime (LT97%) in comparison to CE3. The substantially superior performance data of the Example Devices from adding compounds represented by the general formula H1 of the present disclosure, such as H1-2, H1-1, or H1-7, to the EBL and/or as a co-host material was unexpected.

TABLE 4

Example Devices Experimental Data

| | | Emissive Layer Components | | | | | 1931 CIE | | λ max | FWHM |
|---|---|---|---|---|---|---|---|---|---|---|
| | EBL | First Host [wt %] | Second Host [wt %] | Third Host [wt %] | Emitter [wt %] | HBL | X | y | [nm] | [nm] |
| Example Device #3 | H1-2 | — | H2 65 | E1 20 | G1 15 | E1 | 0.351 | 0.612 | 530 | 72 |
| Example Device #4 | H1-2 | H1-2 15 | H2 60 | E1 20 | G1 5 | E1 | 0.337 | 0.618 | 522 | 72 |
| Example Device #5 | H1-7 | H1-2 15 | H2 60 | E1 20 | G1 5 | E1 | 0.320 | 0.628 | 522 | 66 |
| Example Device #6 | H1-1 | H1-2 15 | H2 60 | E1 20 | G1 5 | E1 | 0.321 | 0.628 | 522 | 68 |

TABLE 4-continued

Example Devices Experimental Data

| | | | | | | | | | | | |
|---|---|---|---|---|---|---|---|---|---|---|---|
| Example Device #9 | H1-7 | — | H2 68 | E1 20 | G1 12 | E1 | 0.332 | 0.625 | 526 | 68 |
| Example Device #10 | H1-1 | — | H2 68 | E1 20 | G1 12 | E1 | 0.333 | 0.623 | 526 | 68 |
| Example Device #11 | H1-2 | H1-1 15 | H2 60 | E1 20 | G1 5 | E1 | 0.322 | 0.628 | 522 | 68 |
| Example Device #12 | H1-7 | H1-1 15 | H2 60 | E1 20 | G1 5 | E1 | 0.326 | 0.625 | 522 | 68 |
| Example Device #13 | H1-1 | H1-1 15 | H2 60 | E1 20 | G1 5 | E1 | 0.326 | 0.625 | 522 | 68 |
| Example Device #14 | H1-2 | H1-7 15 | H2 60 | E1 20 | G1 5 | E1 | 0.322 | 0.628 | 522 | 66 |
| Example Device #15 | H1-7 | H1-7 15 | H2 60 | E1 20 | G1 5 | E1 | 0.325 | 0.627 | 522 | 68 |
| Example Device #16 | H1-1 | H1-7 15 | H2 60 | E1 20 | G1 5 | E1 | 0.326 | 0.625 | 522 | 68 |
| CE3 | NPD | — | H2 65 | E1 20 | G1 15 | E1 | 0.343 | 0.617 | 528 | 72 |

| | At 1,000 nits | | | | At 10,000 nits | 40 mA/cm2 | |
|---|---|---|---|---|---|---|---|
| | Voltage [V] | LE [cd/A] | EQE [%] | PE [lm/W] | LT97% [h]* | $L_0$ [nits] | LT97% [h] |
| Example Device #3 | 4.7 | 74.1 | 20.3 | 49.4 | 30 | 23,766 | 6 |
| Example Device #4 | 5.2 | 74.6 | 20.6 | 45.4 | 55 | 24,367 | 11 |
| Example Device #5 | 4.5 | 88 | 24 | 61 | 79 | 29,650 | 11 |
| Example Device #6 | 4.5 | 87 | 24 | 61 | 72 | 28,900 | 11 |
| Example Device #9 | 4.2 | 84 | 23 | 62 | 42 | 27,077 | 7 |
| Example Device #10 | 4.2 | 83 | 23 | 62 | 47 | 26,387 | 8 |
| Example Device #11 | 4.5 | 83 | 23 | 57 | 48 | 27,331 | 8 |
| Example Device #12 | 4.7 | 83 | 23 | 56 | 69 | 27,802 | 11 |
| Example Device #13 | 4.6 | 82 | 22 | 56 | 83 | 27,012 | 14 |
| Example Device #14 | 4.6 | 79 | 22 | 54 | 88 | 24,760 | 17 |
| Example Device #15 | 4.6 | 82 | 22 | 55 | 58 | 26,157 | 10 |
| Example Device #16 | 4.6 | 79 | 22 | 54 | 88 | 24,665 | 17 |
| CE3 | 4.6 | 73.6 | 20.1 | 50.6 | 29 | 22,593 | 7 |

*Calculated assuming accelerated factor 1.8

Figure 6:
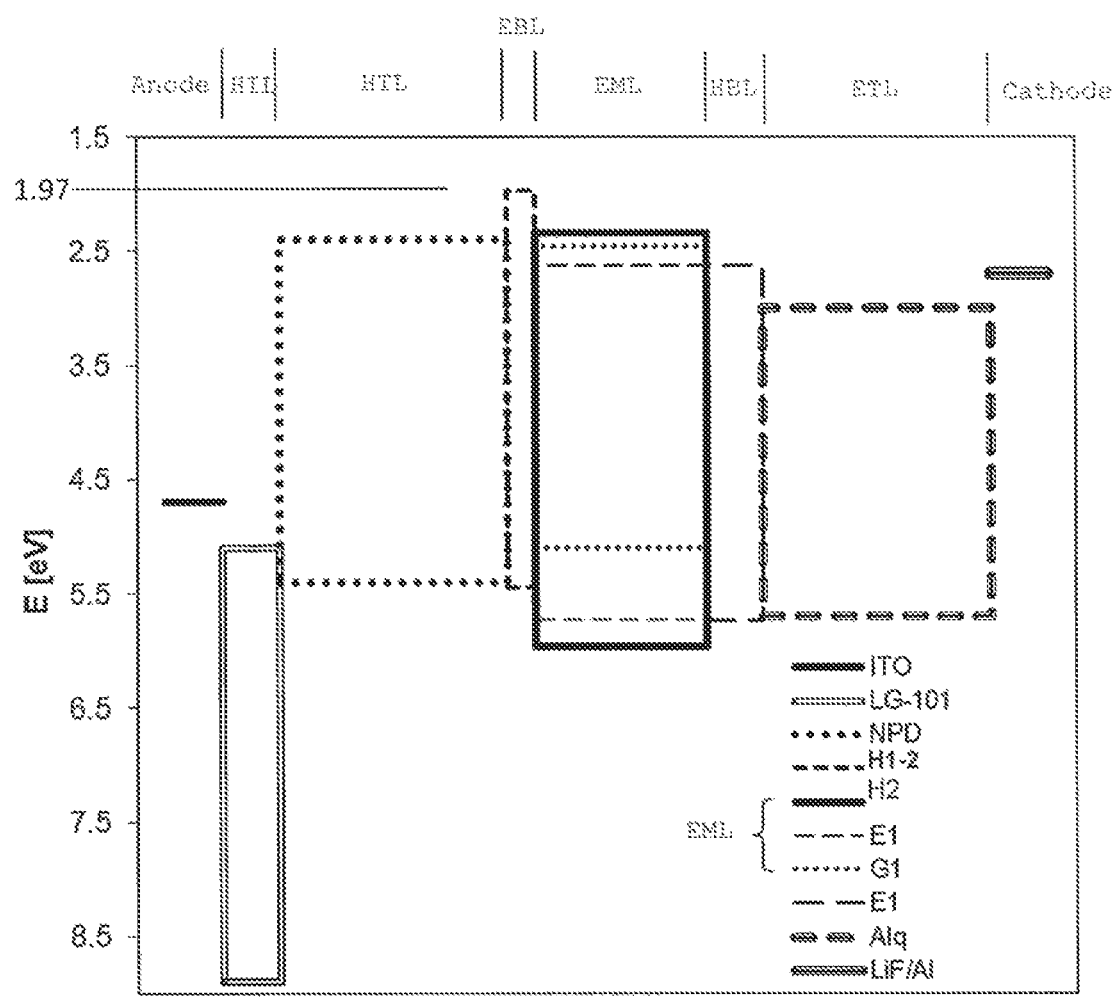
FIG. 6 is an energy level diagram for the device of FIG. 5 in which the hole-transporting material is used as the exciton/electron blocking layer.
Figure 7:
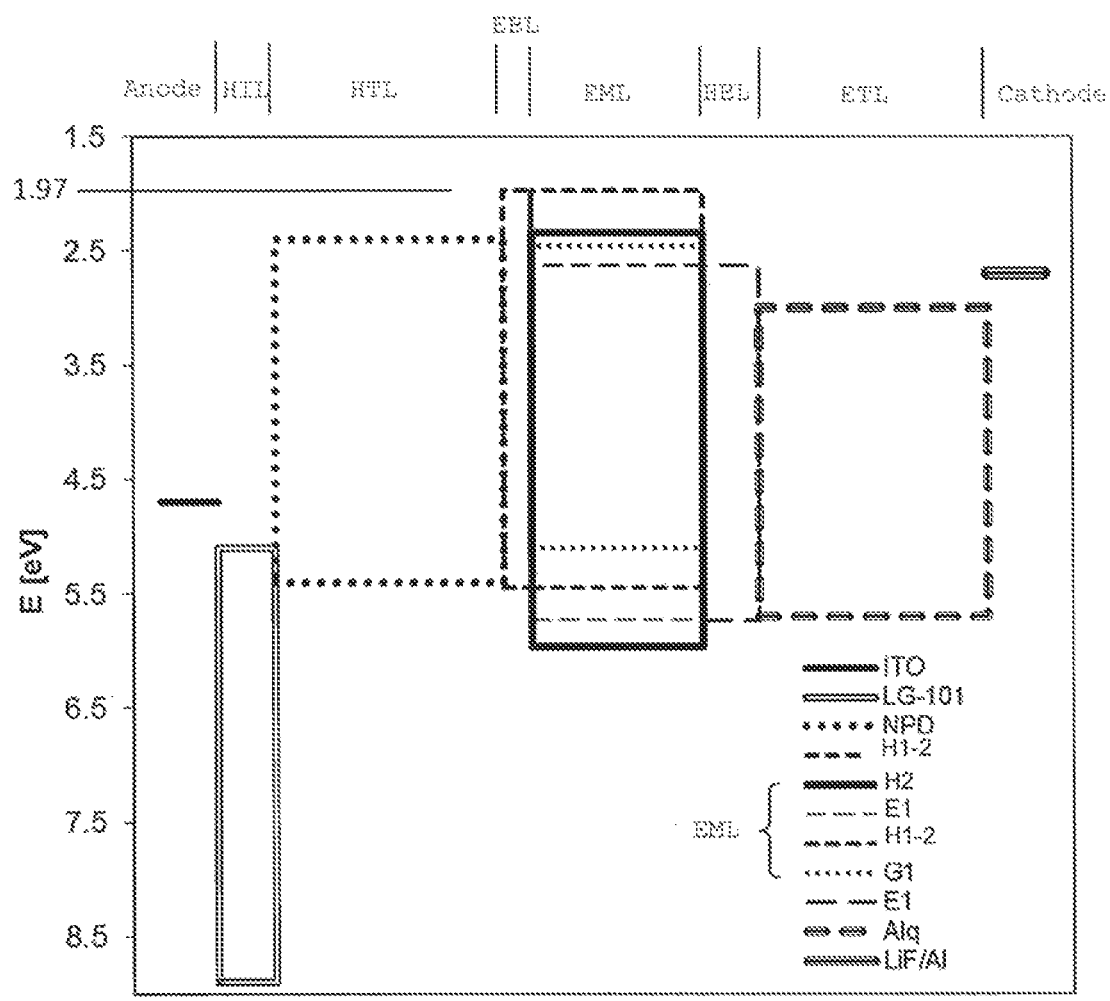
FIG. 7 is an energy level diagram for the device of FIG. 5 in which the hole-transporting material is used as a co-host material in the emissive layer and as the exciton/electron blocking layer.

The energy level diagrams for the Example Devices #3 and #4 are shown in FIGS. 6 and 7, respectively. The energy level diagrams for the Example Devices #5 and #6 are shown in overlaid composite form in FIG. 8. The energy level diagrams for the Example Device #7 through #16 are shown in overlaid composite form in FIG. 9. The energy level diagrams in FIGS. 8 and 9 over lays the HOMO-LUMO energy levels of the various compounds used in the example devices. Therefore, the energy level diagrams in FIGS. 8 and 9 are not meant to represent one particular sample device.

The HOMO, LUMO levels and the triplet energy levels are provided in Table 1 above. The very shallow LUMO level of compounds H1-1, H1-7, and H1-2 (1.94, 2.16, and 1.97 eV, respectively) blocks electrons from leaking into HTL and high triplet energy of the compounds H1-1, H1-7, and H1-2 (2.74, 2.71, and 2.75 eV, respectively) blocks excitons from leaking into HTL. The excitons and electrons in the device with compounds, such as H1-1, H1-7, or H1-2, as the exciton/electron blocking layer are better confined within the emissive layer which is believed to be a reason for higher efficiency of such devices as shown by the performance data for the Example Devices #3 through #6 and #9 through #16 compared to the reference device CE3. The Example Devices #5 and #6 exhibited the highest efficiency (EQE of 24% at 1,000 nits) of all devices and very good lifetime (LT97%). Thus, it combines both charge-exciton separation in the emissive layer and electron and exciton blocking in the exciton/electron blocking layer.

All organic layers were deposited under high-vacuum conditions ($1\times10^{-7}$ Torr). The PHOLED was transferred directly from vacuum into an inert environment glove-box, where it was encapsulated using a UV-curable epoxy, and a glass lid with a moisture getter. The PHOLED emission profiles were assumed to be Lambertian, so EQE was calculated from measurements, made with a SpectraScan PR705, of the emission intensity normal to the substrate. The current and voltage measurements were obtained using a Keithley 236 source measure unit.

Unless otherwise specified, any of the layers of the various embodiments of the invention described herein may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

The structures illustrated herein are an example only and the OLED according to the disclosed invention is not limited to the particular structure and can include more layers or fewer layers or different combinations of the layers.

TABLE 5

Examples of phosphorescent dopants.

| MATERIAL | EXAMPLES OF MATERIAL | PUBLICATIONS |
|---|---|---|
| Red dopants | | |
| Heavy metal porphyrins (e.g., PtOEP) | (octaethylporphyrin Pt complex with 8 Et substituents) | Nature 395, 151 (1998) |
| Iridium(III) organometallic complexes | (bis-benzothienylpyridine Ir acetylacetonate complex) | Appl. Phys. Lett. 78, 1622 (2001) |
| | (bis-phenylisoquinoline Ir acetylacetonate complex) | US 2006/835469 |

TABLE 5-continued

Examples of phosphorescent dopants.

| MATERIAL | EXAMPLES OF MATERIAL | PUBLICATIONS |
|---|---|---|
| | | US 2006/835469 |
| | | US 2006/0202194 |
| | | US 2006/0202194 |
| | | US 2007/0087321 |
| | | US 2007/0087321 |

TABLE 5-continued

Examples of phosphorescent dopants.

| MATERIAL | EXAMPLES OF MATERIAL | PUBLICATIONS |
|---|---|---|
| | | Adv. Mater. 19, 739 (2007) |
| | | WO 2009/100991 |
| | | WO 2008/101842 |
| Platinum(II) organometallic complexes | | WO 2003/040257 |
| Osminum(III) complexes | | Chem. Mater. 17, 3532 (2005) |

TABLE 5-continued

Examples of phosphorescent dopants.

| MATERIAL | EXAMPLES OF MATERIAL | PUBLICATIONS |
| --- | --- | --- |
| Ruthenium(II) complexes | | Adv. Mater. 17, 1059 (2005) |
| Rhenium (I), (II), and (III) complexes | | US 2005/0244673 |

Green dopants

| | | |
| --- | --- | --- |
| Iridium(III) organometallic complexes | and its derivatives | Inorg. Chem. 40, 1704 (2001) |
| | | US 2002/0034656 |

TABLE 5-continued

Examples of phosphorescent dopants.

| MATERIAL | EXAMPLES OF MATERIAL | PUBLICATIONS |
|---|---|---|
| | | US 7332232 |
| | | US 2009/0108737 |
| | | US 2009/0039776 |
| | | US 6921915 |

TABLE 5-continued

Examples of phosphorescent dopants.

| MATERIAL | EXAMPLES OF MATERIAL | PUBLICATIONS |
|---|---|---|
| | | US 6687266 |
| | | Chem. Mater. 16, 2480 (2004) |
| | | US 2007/0190359 |
| | | US 2006/0008670<br>JP 2007-123392 |
| | | Adv. Mater. 16, 2003 (2004) |

TABLE 5-continued

Examples of phosphorescent dopants.

| MATERIAL | EXAMPLES OF MATERIAL | PUBLICATIONS |
|---|---|---|
| | | Angew. Chem. Int. Ed. 2006, 45, 7800 |
| | | WO 2009/050290 |
| | | US 2009/0165846 |
| | | US 2008/0015355 |
| Monomer for polymeric metal organometallic compounds | | US 7250226, US 7396598 |

TABLE 5-continued
Examples of phosphorescent dopants.
| MATERIAL | EXAMPLES OF MATERIAL | PUBLICATIONS |
| --- | --- | --- |
| Pt(II) organometallic complexes, including polydentated ligands | 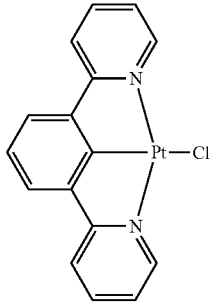 | Appl. Phys. Lett. 86, 153505 (2005) |
| | 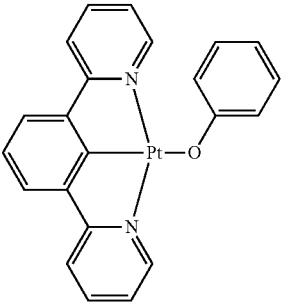 | Appl. Phys. Lett. 86, 153505 (2005) |
| | 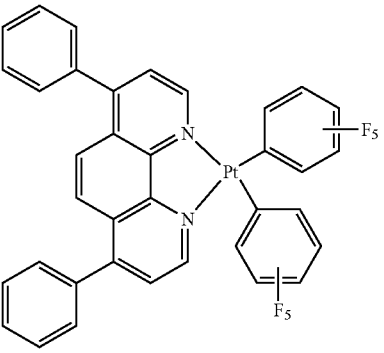 | Chem. Lett. 34, 592 (2005) |
| | 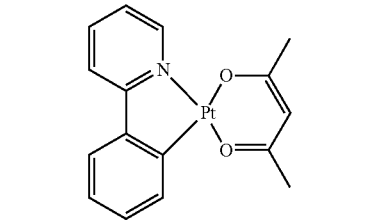 | WO 2002/015645 |
| | 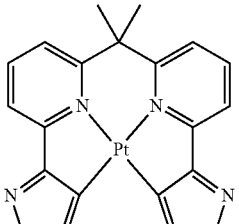 | US 2006/0263635 |

TABLE 5-continued

Examples of phosphorescent dopants.

| MATERIAL | EXAMPLES OF MATERIAL | PUBLICATIONS |
| --- | --- | --- |
| Cu complexes | | WO 2009/000673 |
| Gold complexes | | Chem. Commun. 2906 (2005) |
| Rhenium(III) complexes | | Inorg. Chem. 42, 1248 (2003) |
| Deuterated organometallic complexes | | US 2003/0138657 |

TABLE 5-continued
Examples of phosphorescent dopants.
| MATERIAL | EXAMPLES OF MATERIAL | PUBLICATIONS |
|---|---|---|
| Organometallic complexes with two or more metal centers | 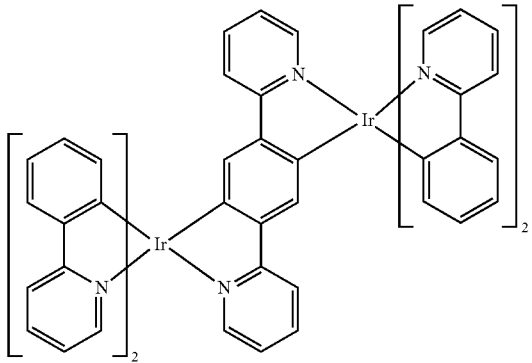 | US 2003/0152802 |
| | 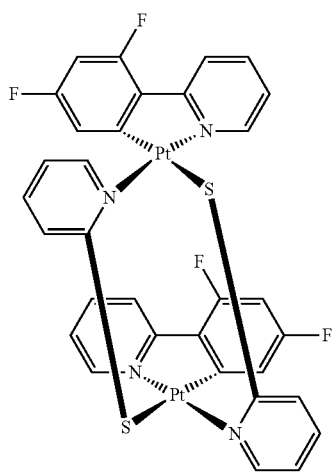 | US 7090928 |
Blue dopants
| Iridium(III) organometallic complexes | 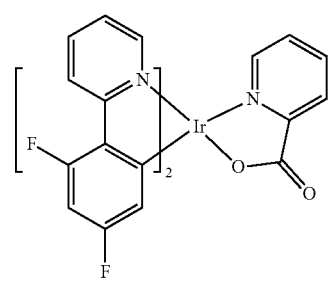 | WO 2002/002714 |
| | 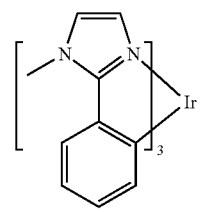 | WO 2006/009024 |

TABLE 5-continued

Examples of phosphorescent dopants.

| MATERIAL | EXAMPLES OF MATERIAL | PUBLICATIONS |
|---|---|---|
| | | US 2006/0251923 |
| | | US 7393599, WO 2006/056418, US 2005/0260441, WO 2005/019373 |
| | | US 7534505 |
| | | US 7445855 |
| | | US 20070190359, US 2008/0297033 |

TABLE 5-continued

| | Examples of phosphorescent dopants. | |
|---|---|---|
| MATERIAL | EXAMPLES OF MATERIAL | PUBLICATIONS |
| | | US 7338722 |
| | | US 2002/0134984 |
| | | Angew. Chem. Int. Ed. 47, 1 (2008) |
| | | Chem. Mater. 18, 5119 (2006) |
| | | Inorg. Chem. 46, 4308 (2007) |

TABLE 5-continued

Examples of phosphorescent dopants.

| MATERIAL | EXAMPLES OF MATERIAL | PUBLICATIONS |
|---|---|---|
| | | WO 2005/123873 |
| | | WO 2005/123873 |
| | | WO 2007/004380 |
| | | WO 2006/082742 |
| Osmium(II) complexes | | US 7279704 |

TABLE 5-continued

Examples of phosphorescent dopants.

| MATERIAL | EXAMPLES OF MATERIAL | PUBLICATIONS |
|---|---|---|
| | 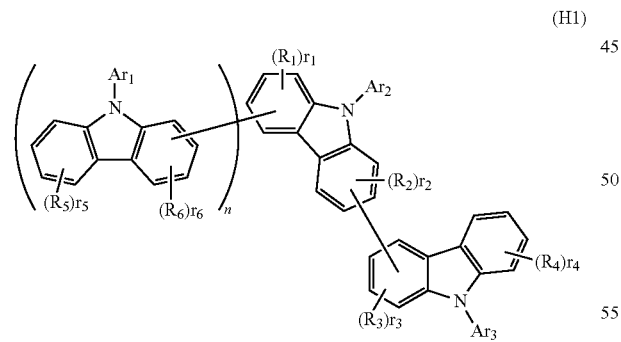 | Organometallics 23, 3745 (2004) |
| Gold complexes | | Appl. Phys. Lett. 74, 1361 (1999) |
| Platinum(II) complexes | | WO 2006/098120, WO 2006/103874 |

What is claimed is:

1. An organic light emitting device comprising an anode, a cathode and a plurality of organic layers provided between them, the plurality of organic layers comprising:
   an emissive layer comprising a host material and a phosphorescent emitter material, the host material comprising:
      a first host compound and a second host compound wherein the first host compound is represented by the following general formula (H1)

wherein $R_1$, $R_2$, $R_3$, $R_4$, $R_5$, and $R_6$ may be the same or different fluorine atom, chlorine atom, a deuterium atom, a cyano group, a trifluoromethyl group, a nitro group, linear or branched alkyl group (C1-C6), cyclo-alkyl group (C5-C10), linear or branched alkoxy group (C1-C6), cyclo-alkoxy group (C5~C10), substituted or unsubstituted aromatic hydrocarbon group, substituted or unsubstituted aromatic heterocyclic group, substituted or unsubstituted condensed polycyclic aromatic group, $r_1$, $r_4$, $r_5$=0, 1, 2, 3, or 4, $r_2$, $r_3$, $r_6$; =0, 1, 2 or 3, n=0 or 1, and $Ar_1$, $Ar_2$, and $Ar_3$ may be the same or different, substituted or unsubstituted aromatic hydrocarbon group, substituted or unsubstituted aromatic heterocyclic group, substituted or unsubstituted condensed polycyclic aromatic group, deuterium substituted aromatic hydrocarbon group, deuterium substituted aromatic heterocyclic group, or deuterium substituted condensed polycyclic aromatic group, wherein the first host compound is selected from the group consisting of:

Compound H1-2

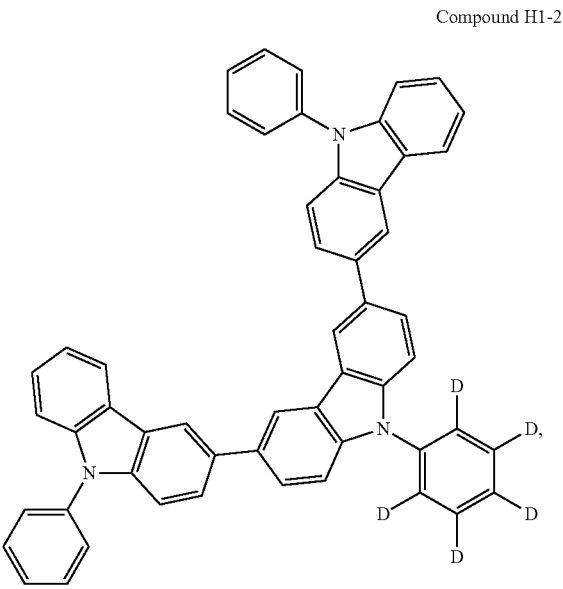

-continued
Compound H1-3
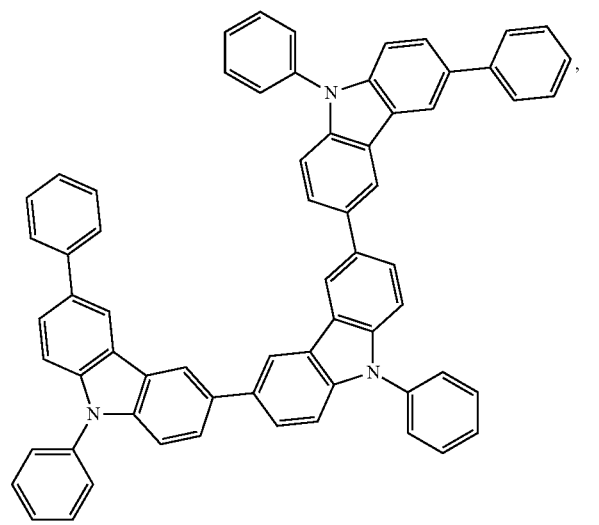
Compound H1-4
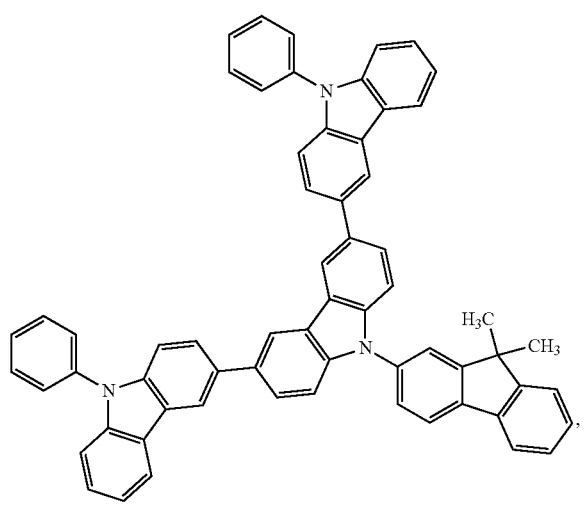
Compound H1-5
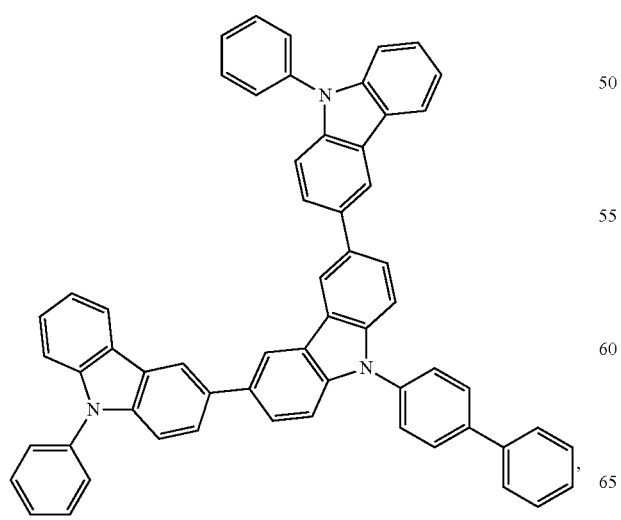
-continued
Compound H1-6
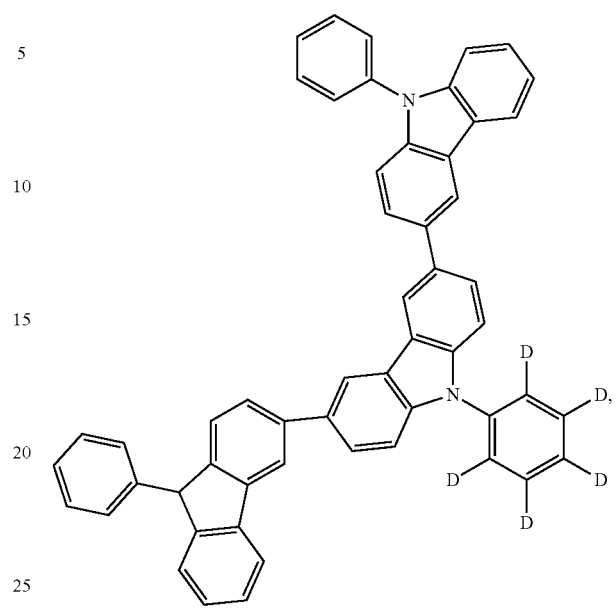
Compound H1-7
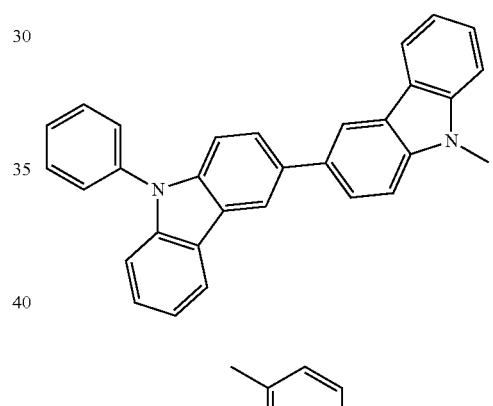
Compound H1-8
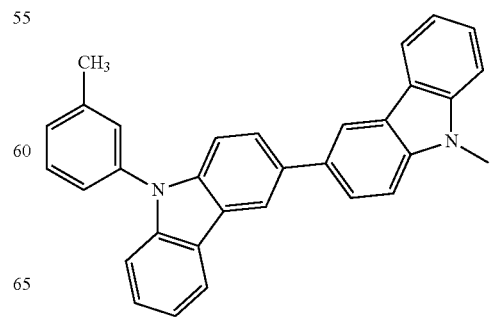

-continued
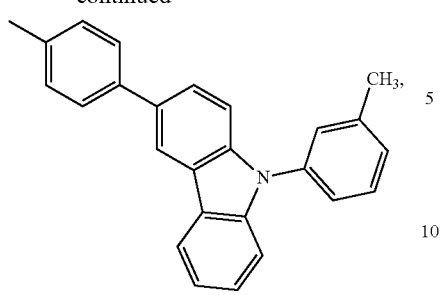
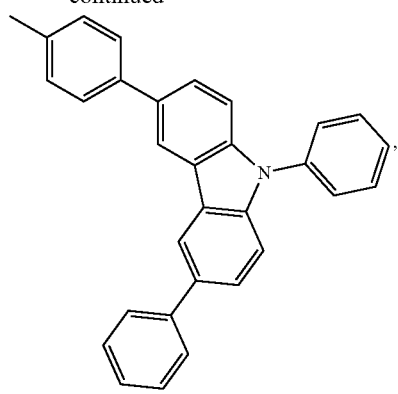
Compound H1-9
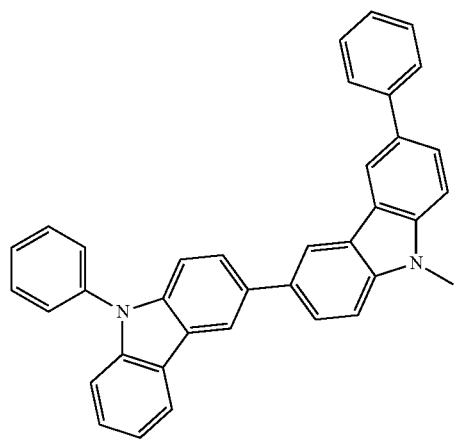
Compound H1-11
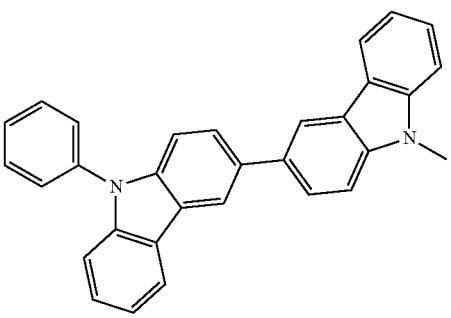
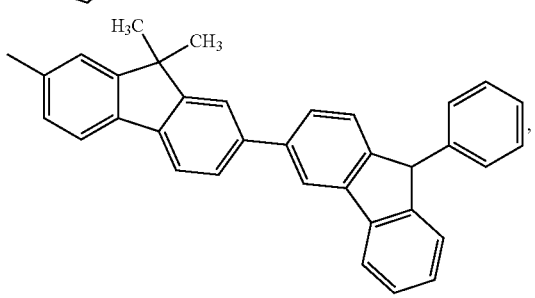
Compound H1-12
Compound H1-10
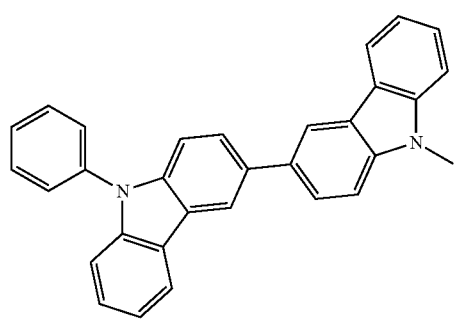
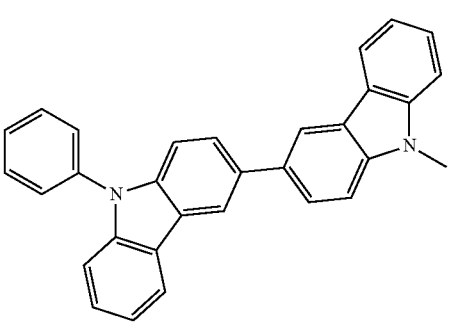
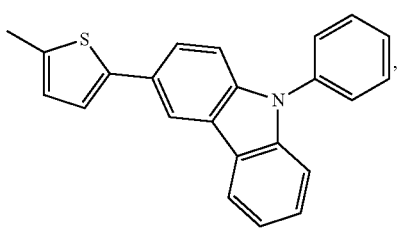

Compound H1-13

Compound H1-14

Compound H1-15

Compound H1-16

-continued

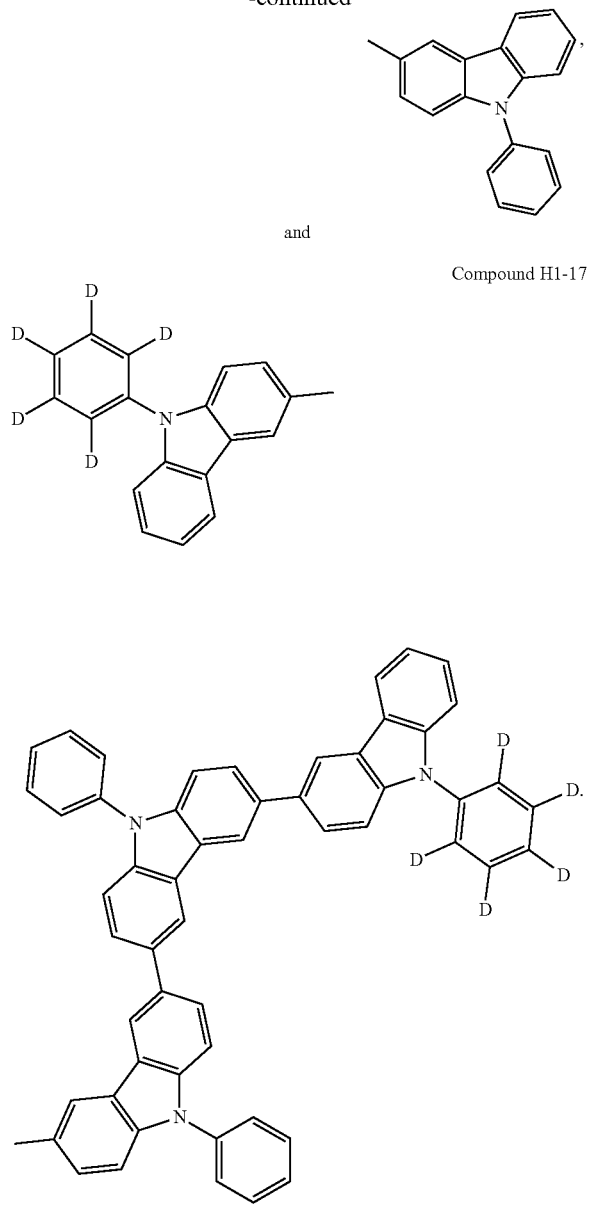

Compound H1-17

2. The organic light emitting device of claim 1, wherein the first host compound constitutes no more than 25 wt. % of the emissive layer.

3. The organic light emitting device of claim 2, wherein the first host compound constitutes about 10 to 20 wt. % of the emissive layer.

4. The organic light emitting device according to claim 1, wherein the second host compound contains at least one of the following groups in the molecule:

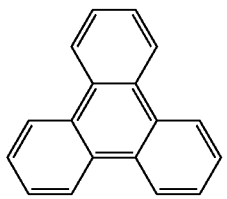 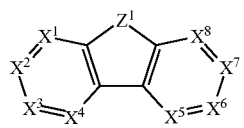

-continued

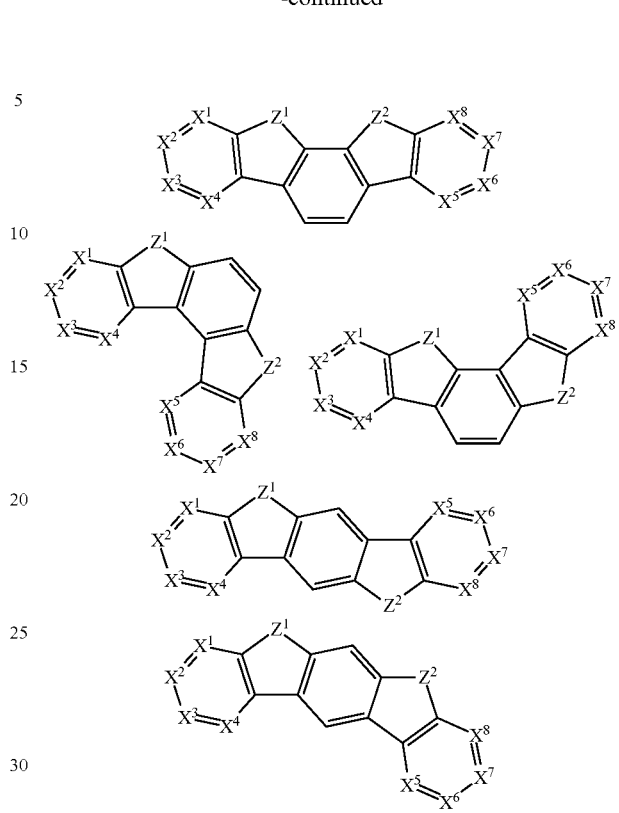

wherein $X^1$ to $X^8$ is selected from C or N; and
wherein $Z^1$ and $Z^2$ is S or O.

5. The organic light emitting device according to claim 4, wherein any substituent in the second host compound is an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH=CH-C_nH_{2n+1}$, $C=CHC_nH_{2n+1}$, $Ar_1$, $Ar_1$-$Ar_2$, $C_nH_{2n}$-$A_{r1}$, or no substitution, wherein n is 1, 2, 3, 4, 5, 6, 7, 8, 9, or 10, and wherein $Ar_1$ and $Ar_2$ are independently selected from the group consisting of benzene, biphenyl, naphthalene, triphenylene, carbazole, and heteroaromatic analogs thereof.

6. The organic light emitting device according to claim 1, wherein the second host compound is represented by the structure of formula (H-IV):

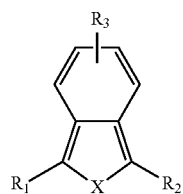

(H-IV)

wherein X is S or O;
wherein $R_1$, $R_2$, and $R_3$ are unfused substituents independently selected from the group consisting $C_nH_{2n+1}$, $OC_nH_{2n+1}$, $OAr_1$, $N(C_nH_{2n+1})_2$, $N(Ar_1)(Ar_2)$, $CH=CH-C_nH_{2n+1}$, $C=CHC_nH_{2n+1}$, $Ar_1$, $Ar_1$-$Ar_2$, $C_nH_{2n}$-$A_{r1}$, or no substitution, and wherein each of $R_1$, $R_2$ and $R_3$ may represent mono, di, tri, or tetra substitutions;

wherein n is 1, 2, 3, 4, 5, 6, 7, 8, 9, or 10;

wherein Ar$_1$ and Ar$_2$ are independently selected from the group consisting of benzene, biphenyl, naphthalene, triphenylene, carbazole, and heteroaromatic analogs thereof; and wherein at least one of R$_1$, R$_2$ and R$_3$ includes a triphenylene group.

7. The organic light emitting device according to claim 6, wherein X is S.

8. The organic light emitting device according to claim 6, wherein X is O.

9. The organic light emitting device according to claim 1, wherein the second host compound is represented by the structure of formula (H-V):

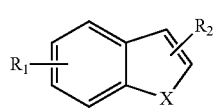

(H-V)

wherein X is S or O;

wherein R$_1$ and R$_2$ are unfused substituents independently selected from the group consisting C$_n$H$_{2n+1}$, OC$_n$H$_{2n+1}$, OAr$_1$, N(C$_n$H$_{2n+1}$)$_2$, N(Ar$_1$)(Ar$_2$), CH=CH—C$_n$H$_{2n+1}$, C=CHC$_n$H$_{2n+1}$, Ar$_1$, Ar$_1$-Ar$_2$, C$_n$H$_{2n}$-A$_{r1}$, or no substitution, and wherein each of R$_1$ and R$_2$ may represent mono, di, tri, or tetra substitutions;

wherein n is 1, 2, 3, 4, 5, 6, 7, 8, 9, or 10;

wherein Ar$_1$ and Ar$_2$ are independently selected from the group consisting of benzene, biphenyl, naphthalene, triphenylene, carbazole, and heteroaromatic analogs thereof; and wherein at least one of R$_1$ and R$_2$ includes a triphenylene group.

10. The organic light emitting device according to claim 9, wherein X is S.

11. The organic light emitting device according to claim 9, wherein X is O.

12. The organic light emitting device according to claim 5, wherein the second host compound is represented by the structure of formula (H-VI):

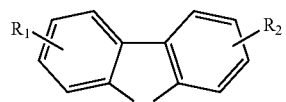

(H-VI)

wherein X is S or O; and wherein R$_1$ and R$_2$ are independently selected from the group consisting C$_n$H$_{2n+1}$, OC$_n$H$_{2n}$-A$_{r1}$, OAr$_1$, N(C$_n$H$_{2n+1}$)$_2$, N(Ar$_1$)(Ar$_2$), CH=CH—C$_n$H$_{2n+1}$, C=CHC$_n$H$_{2n+1}$, Ar$_1$, Ar$_1$-Ar$_2$, C$_n$H$_{2n}$-A$_{r1}$, or no substitution;

wherein n is 1, 2, 3, 4, 5, 6, 7, 8, 9, or 10;

wherein Ar$_1$ and Ar$_2$ are independently selected from the group consisting of benzene, biphenyl, naphthalene, triphenylene, carbazole, and heteroaromatic analogs thereof; and wherein at least one of R$_1$ and R$_2$ includes a triphenylene group.

13. The organic light emitting device according to claim 12, wherein X is S.

14. The organic light emitting device according to claim 12, wherein X is O.

15. The organic light emitting device according to claim 12, wherein the second host compound has the formula:

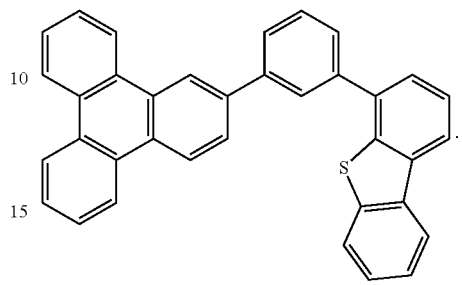

16. The organic light emitting device according to claim 1, wherein the host material further comprising a third host compound containing at least one of the following groups in the molecule:

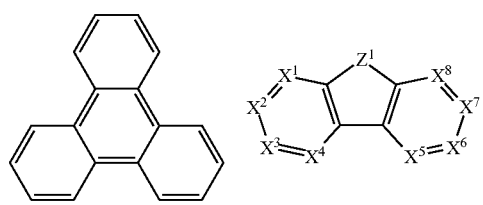

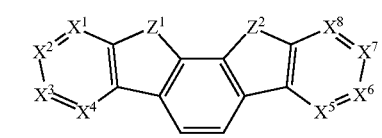

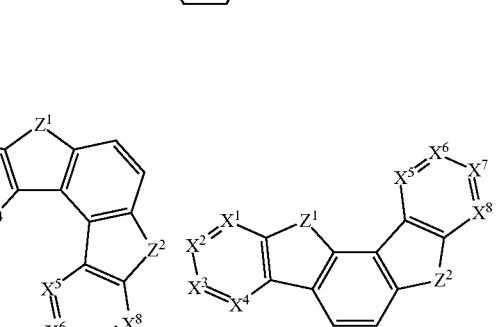

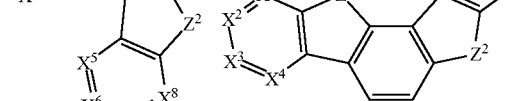

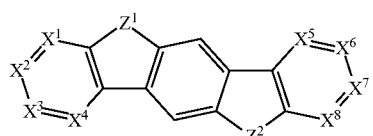

-continued

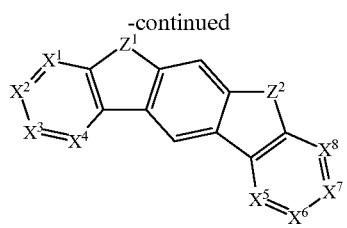

wherein $X^1$ to $X^8$ is selected from C or N;
wherein $Z^1$ and $Z^2$ is S or O; and
wherein the second host compound and the third host compound are different compounds.

17. The organic light emitting device according to claim 16, wherein any substituent in the third host compound is an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH=CH-C_nH_{2n+1}$, $C=CHC_nH_{2n+1}$, $Ar_1$, $Ar_1$-$Ar_2$, $C_nH_{2n}$-$A_{r1}$, or no substitution, wherein n is 1, 2, 3, 4, 5, 6, 7, 8, 9, or 10, and wherein $Ar_1$ and $Ar_2$ are independently selected from the group consisting of benzene, biphenyl, naphthalene, triphenylene, carbazole, and heteroaromatic analogs thereof.

18. The organic light emitting device according to claim 15, wherein the third host compound has the formula:

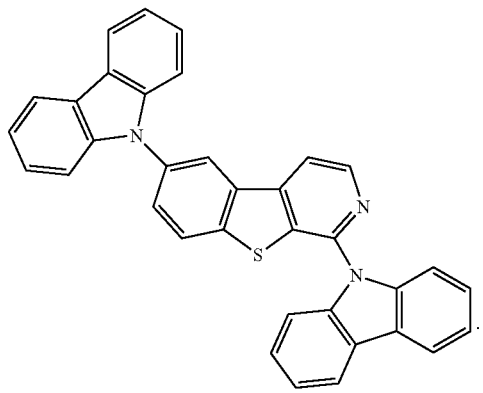 [SMILES: c1ccc2c(c1)c1ccccc1n2-c1ccc2sc3c(-n4c5ccccc5c5ccccc54)nccc3c2c1]

19. The organic light emitting device of claim 1, further comprising at least one hole transport layer disposed between the emissive layer and the anode, wherein the at least one hole transport layer is a material comprising at least one of the compounds having a formula selected from the following formulae (HTL-I) to (HTL-VI):

(HTL-I)

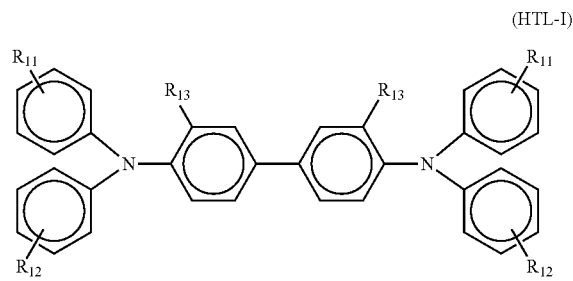

wherein $R_{11}$ and $R_{12}$ may be the same or different and are independently selected from the group consisting of a hydrogen atom, a deuterium atom, a lower alkyl group, a lower alkoxy group, a phenyl group, a phenyl group having a lower alkyl group or deuterium substituent, and a phenyl group having a deuterium atom or a lower alkoxy group substituent with the proviso at least one of $R_{11}$ and $R_{12}$ is a deuterium atom, a normal butyl group, an isobutyl group, a secondary butyl group, a tertiary butyl group, a phenyl group, a phenyl group having a lower alkyl group substituent, or a phenyl group having a lower alkoxy group substituent; and $R_{13}$ represents a hydrogen atom, a deuterium atom, a lower alkyl group, a lower alkoxy group or a chlorine atom;

(HTL-II)

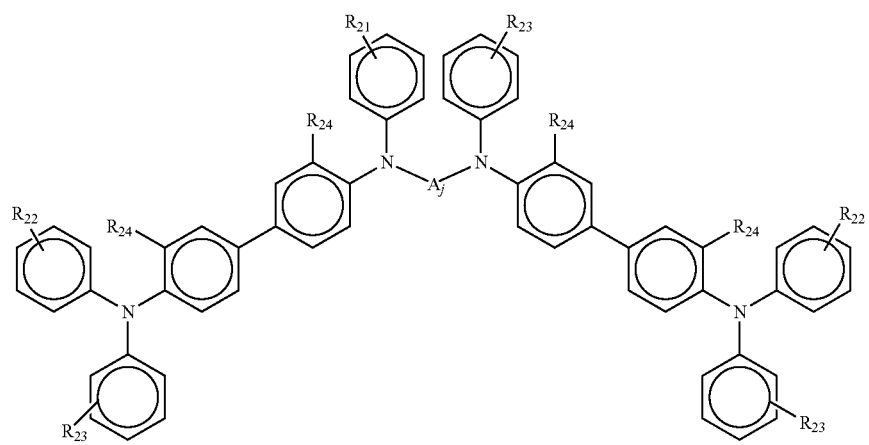

wherein $R_{21}$, $R_{22}$ and $R_{23}$ may be the same or different and each independently represents a hydrogen atom, a deuterium atom, a lower alkyl group, a lower alkoxy group, an unsubstituted phenyl group, or a phenyl group having a lower alkyl group or a lower alkoxy group as a substituent(s);

$R_{24}$ represents a hydrogen atom, a deuterium atom, a lower alkyl group, a lower alkoxy group or a chlorine atom; and $A_1$ represents a group represented by any one of the following structural formulae (a1) to (i1);

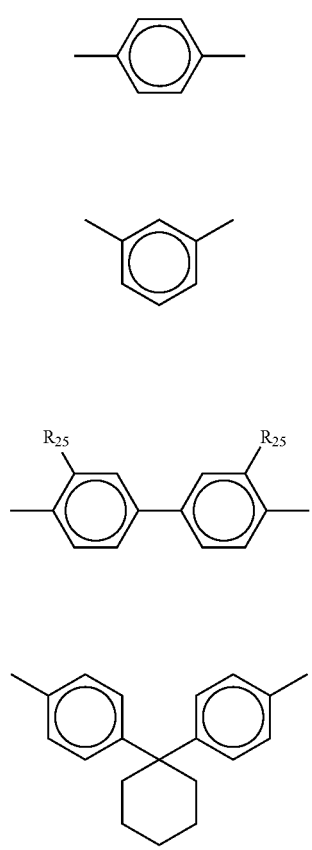

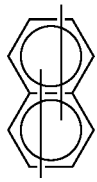
(e1)

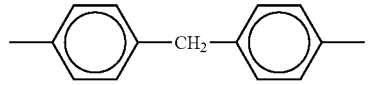
(f1)

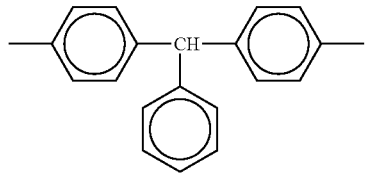
(g1)

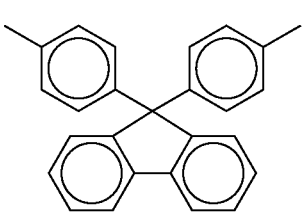
(h1)

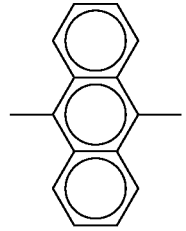
(i1)

in which $R_{25}$ represents a hydrogen atom, a deuterium atom, a lower alkyl group, a lower alkoxy group or a chlorine atom;

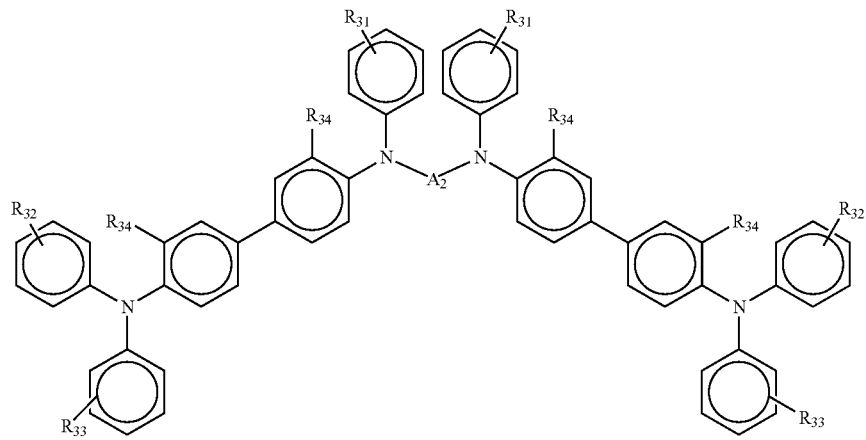
(HTL-III)

wherein $R_{31}$, $R_{32}$ and $R_{33}$ may be the same or different and each independently represents a hydrogen atom, a deuterium atom, a lower alkyl group, a lower alkoxy group, an unsubstituted phenyl group, or a phenyl group having a deuterium atom, a lower alkyl group or a lower alkoxy group as a substituent(s);

$R_{34}$ represents a hydrogen atom, a deuterium atom, a lower alkyl group, a lower alkoxy group or a chlorine atom; and A2 represents a group represented by any one of the following formulae (j1) to (n1)

wherein $R_{41}$ and $R_{42}$ may be the same or different and each independently represents a hydrogen atom, a deuterium atom, a lower alkyl group, a lower alkoxy group, an unsubstituted phenyl group or a phenyl group having a deuterium atom, a lower alkyl group or a lower alkoxy group as a substituent(s);

$R_{43}$ represents a hydrogen atom, a lower alkyl group, a lower alkoxy group or a chlorine atom; and A3 represents a group represented by anyone of the following structural formulae (a2) to (i2)

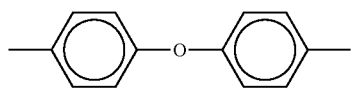
(j1)

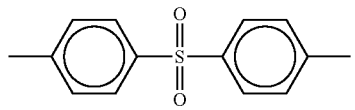
(l1)

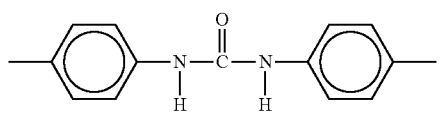
(n1)

(k1)

(m1)

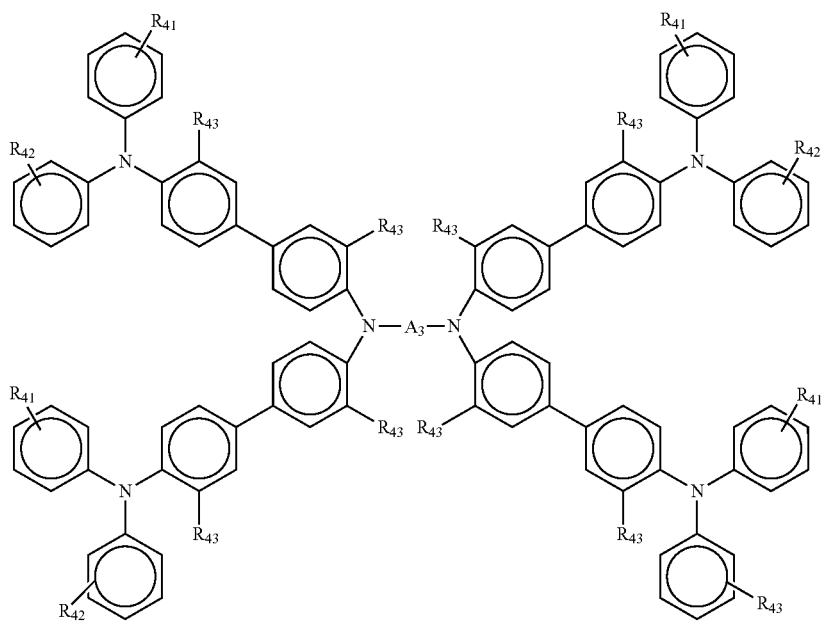
(HTL-IV

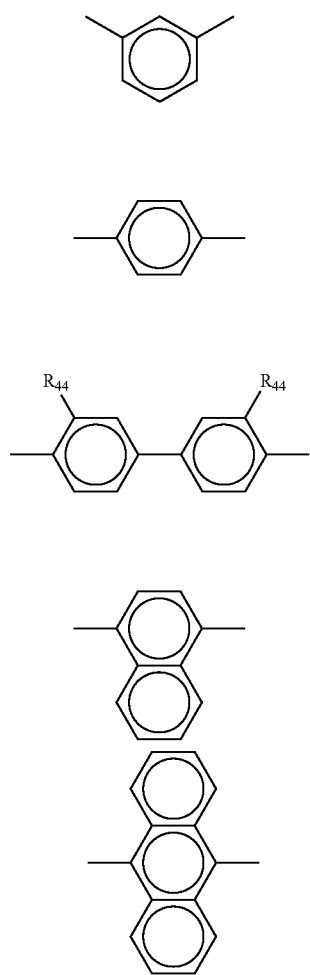
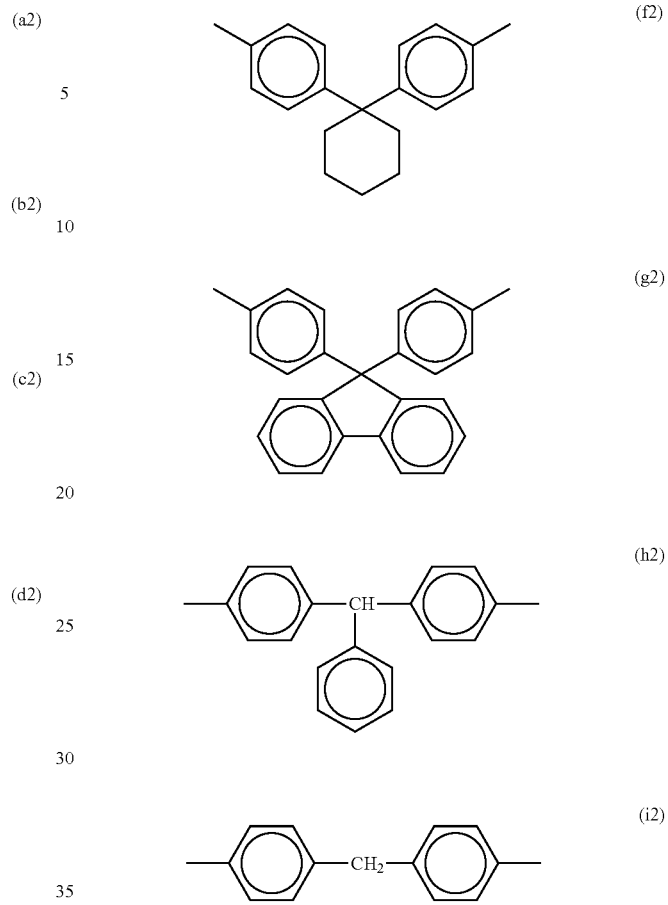
in which $R_{44}$ represents a hydrogen atom, a deuterium atom, a lower alkyl group, a lower alkoxy group or a chlorine atom;
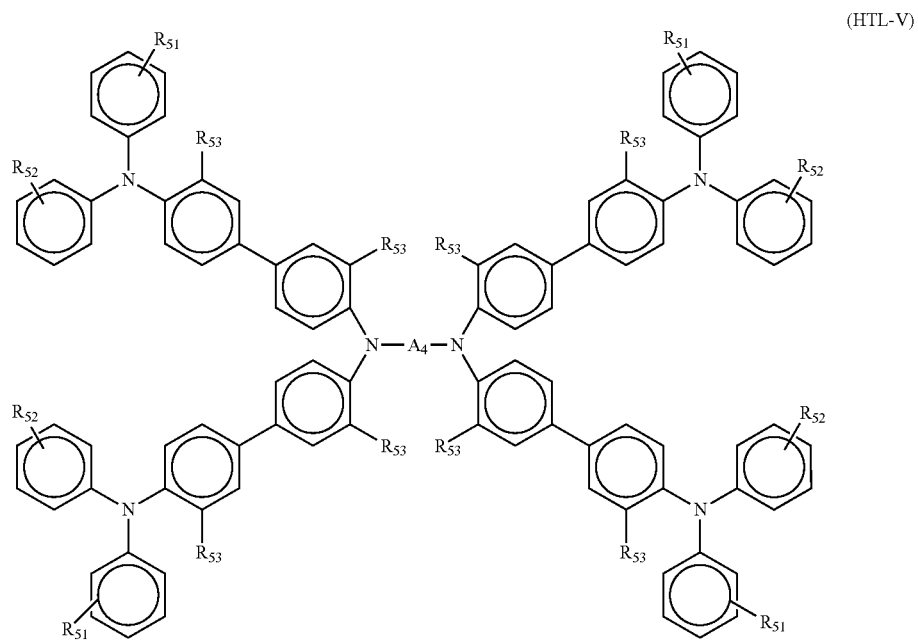

wherein $R_{51}$ and $R_{52}$ may be the same or different and each independently represent a hydrogen atom, a deuterium atom, a lower alkyl group, a lower alkoxy group, an unsubstituted phenyl group or a phenyl group having a deuterium atom, a lower alkyl group or a lower alkoxy group as a substituent(s);

$R_{53}$ represents a hydrogen atom, a deuterium atom, a lower alkyl group, a lower alkoxy group or a chlorine atom; and $A_4$ represents a group represented by anyone of the following structural formulae (j2) to (n2)

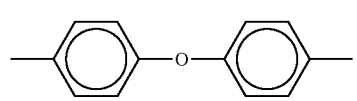
(j2)

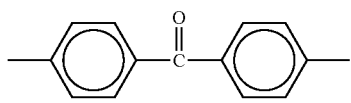
(k2)

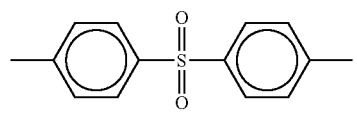
(l2)

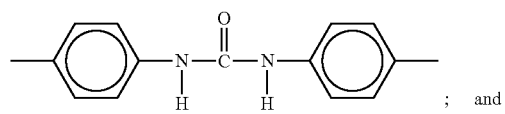
(m2)

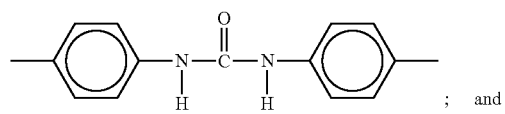
(n2)

; and

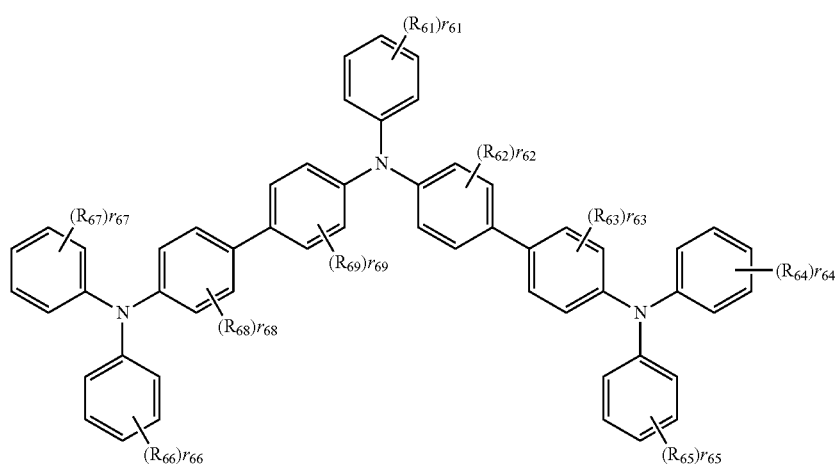
(HTL-VI)

where $R_{61}$ to $R_{69}$, which may be the same or different, independently represent a hydrogen atom, a deuterium atom, a lower alkyl group, a lower alkoxy group, an unsubstituted aromatic hydrocarbon group, a phenyl group having a deuterium atom, a lower alkyl group or a lower alkoxy group; $r_{61}$ to $r_{69}$, which may be the same or different, represent 0, 1 or 2.

20. The organic light emitting device according to claim 1, wherein the phosphorescent emitter material is an organometallic compound selected from the group consisting of phosphorescent organometallic platinum compounds, organometallic iridium compounds and organometallic osmium compounds.

21. The organic light emitting device according to claim 20, wherein the phosphorescent organometallic platinum compound has an aromatic ligand.

22. The organic light emitting device according to claim 20, wherein the phosphorescent organometallic iridium compound has an aromatic ligand.

23. The organic light emitting device according to claim 20, wherein the phosphorescent organometallic osmium compound has an aromatic ligand.

24. The organic light emitting device according to claim 1, further comprising an exciton/electron blocking layer disposed between the emissive layer and the anode, wherein the exciton/electron blocking layer blocks at least one of excitons or electrons and comprises a material that is the compound represented by the general formula H1.

25. The organic light emitting device according to claim 24, wherein the material for the exciton/electron blocking layer is selected from the group consisting of Compound H1-1, Compound H1-2, Compound H1-3, Compound H1-4, Compound H1-5, Compound H1-6, Compound H1-7, Compound H1-8, Compound H1-9, Compound H1-10, Compound H1-11, Compound H1-12, Compound H1-13, Compound H1-14, Compound H1-15, Compound H1-16, and Compound H1-17.

26. The organic light emitting device according to claim 24, wherein the exciton/electron blocking layer blocks both excitons and electrons.

27. An organic light emitting device comprising an anode, a cathode and a plurality of organic layers provided between them, the plurality of organic layers comprising:
an emissive layer comprising a host material and a phosphorescent emitter material, the host material comprising:
a first host compound, a second host compound, and a third host compound, wherein the first host compound is represented by the formula

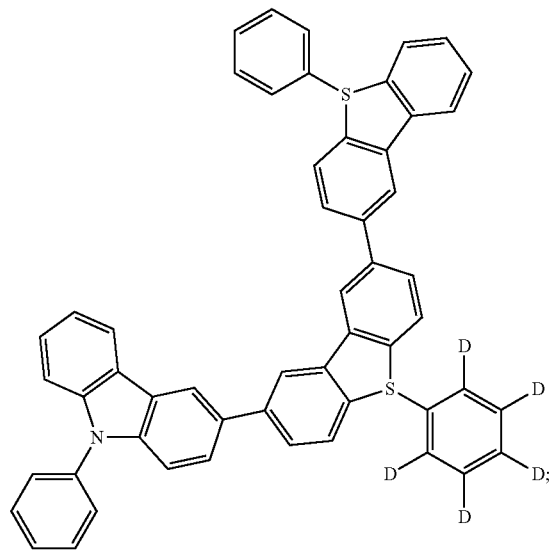

and the second host compound is represented by the formula

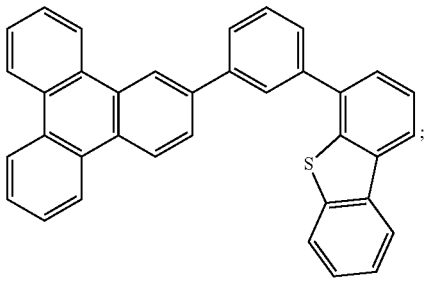 [SMILES: c1cc(-c2ccc3c4ccccc4c4ccccc4c3c2)cc(-c2cccc3c2sc2ccccc23)c1]

and the third host compound is represented by the formula

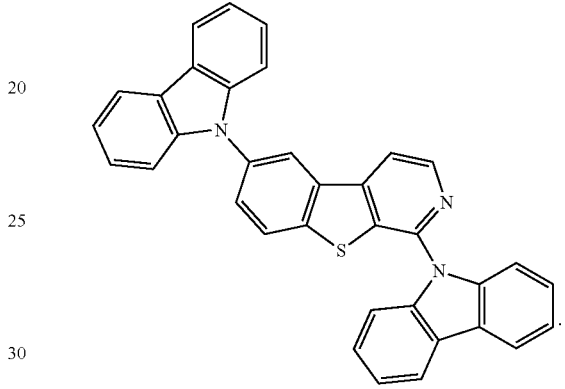

28. The organic light emitting device of claim 27, wherein the first host compound constitutes no more than 25 wt. % of the emissive layer.

29. The organic light emitting device of claim 28, wherein the first host compound constitutes about 10 to 20 wt. % of the emissive layer.

* * * * *

UNITED STATES PATENT AND TRADEMARK OFFICE
CERTIFICATE OF CORRECTION

PATENT NO. : 9,705,099 B2
APPLICATION NO. : 14/372594
DATED : July 11, 2017
INVENTOR(S) : Vadim Adamovich et al.

It is certified that error appears in the above-identified patent and that said Letters Patent is hereby corrected as shown below:

In the Specification

Column 31, Line 39, after Compound 15, please insert

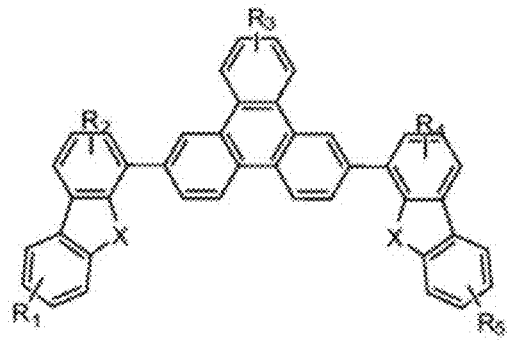
Compound 19 G

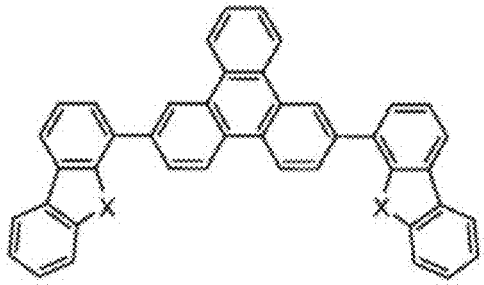
Compound 19

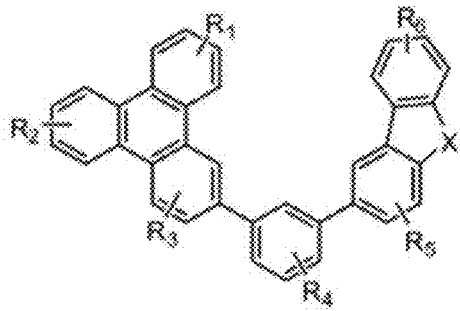
Compound 20 G

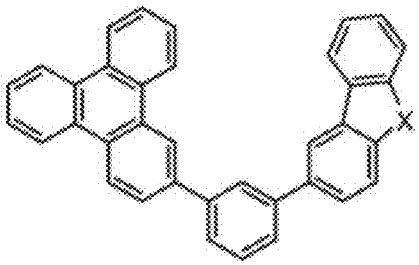
Compound 20

--

Signed and Sealed this
Twenty-second Day of May, 2018

Andrei Iancu
*Director of the United States Patent and Trademark Office*

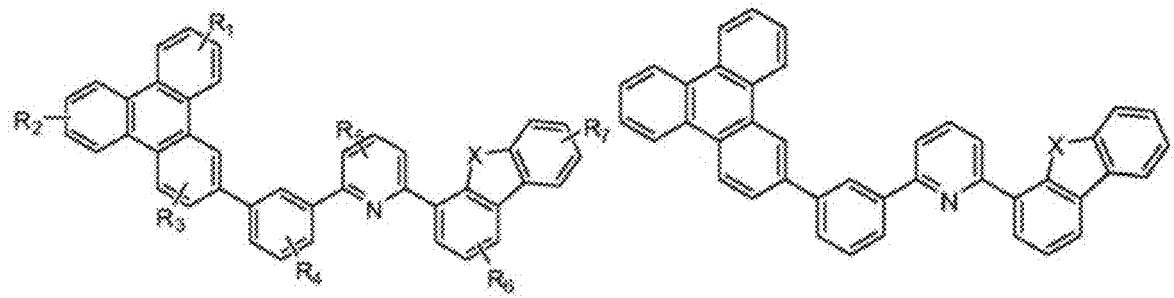
Compound 21 G
Compound 21
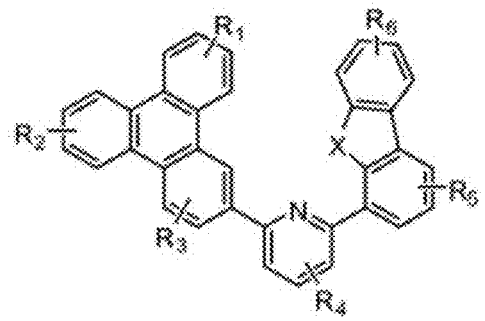
Compound 22 G
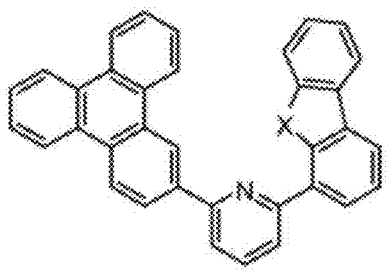
Compound 22
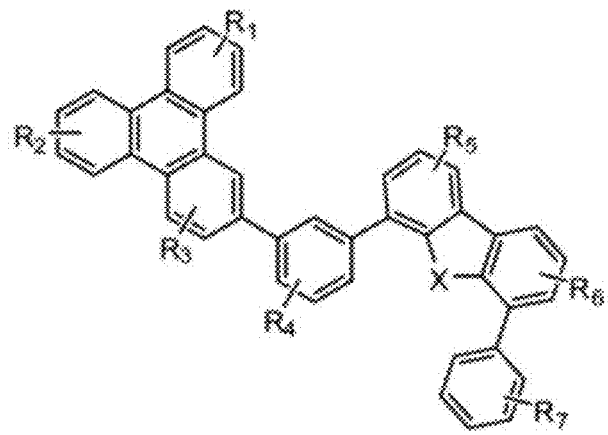
Compound 23 G
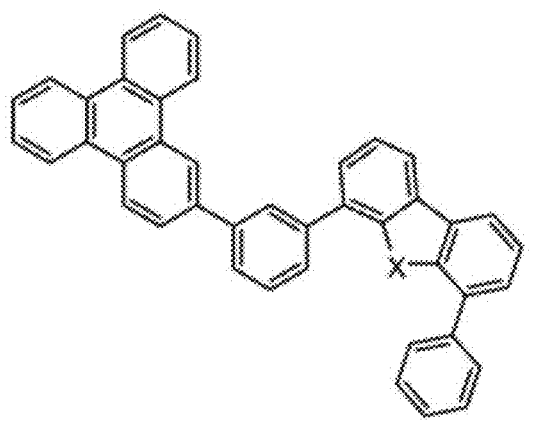
Compound 23

CERTIFICATE OF CORRECTION (continued)
U.S. Pat. No. 9,705,099 B2

Column 34, Lines 46-66, please delete

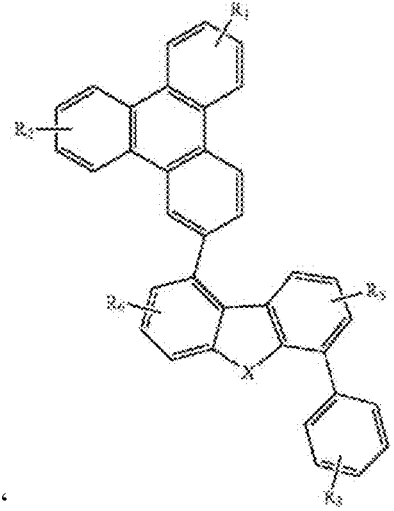

" and insert --

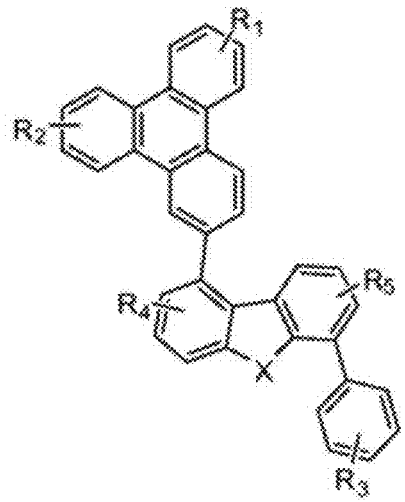

--

In the Claims

In Claim 1, Column 100, Lines 1-27, please delete

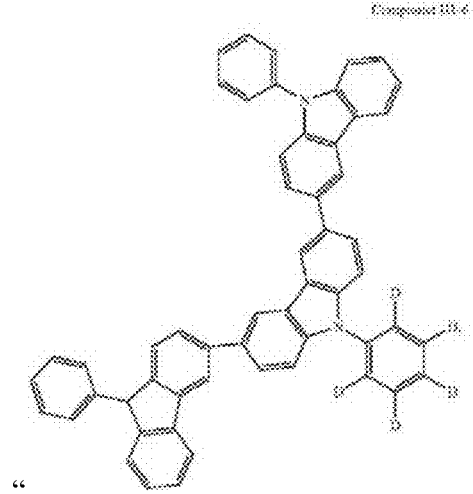

" and insert --

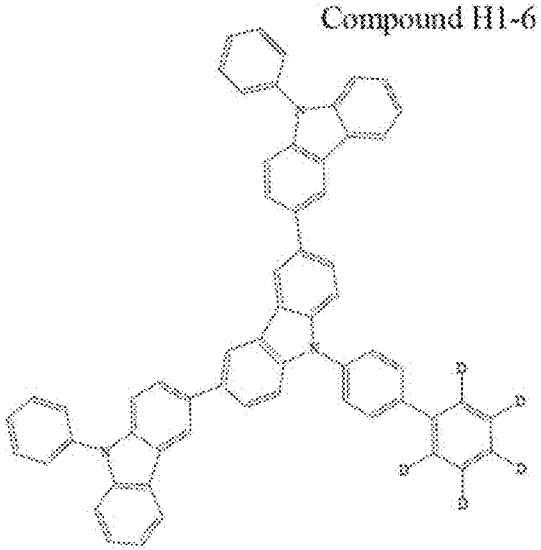

--

CERTIFICATE OF CORRECTION (continued)
U.S. Pat. No. 9,705,099 B2

In Claim 1, Column 101, Lines 20-44, please delete " 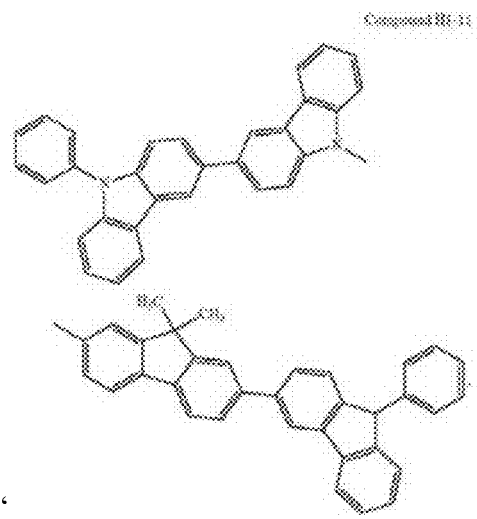 " and insert -- 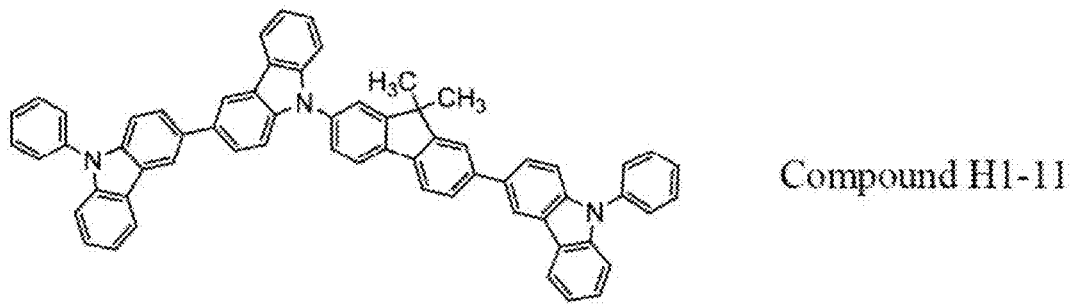 --

In Claim 19, Column 110, Lines 46-66, please delete " 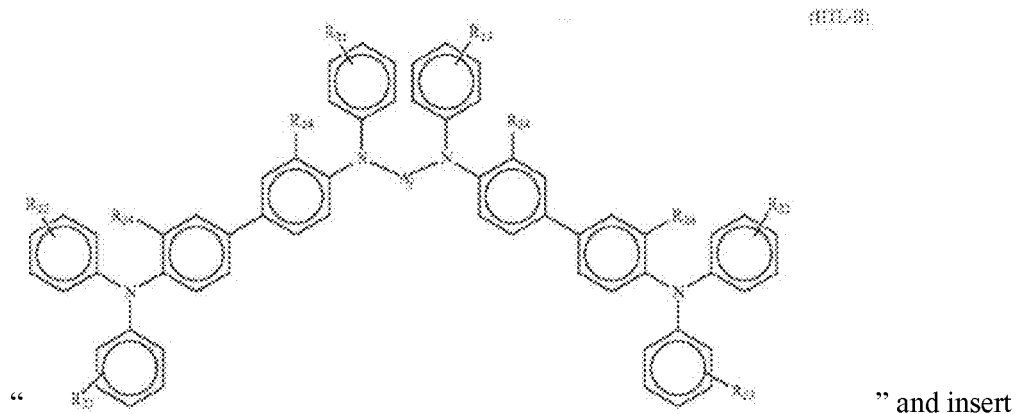 " and insert

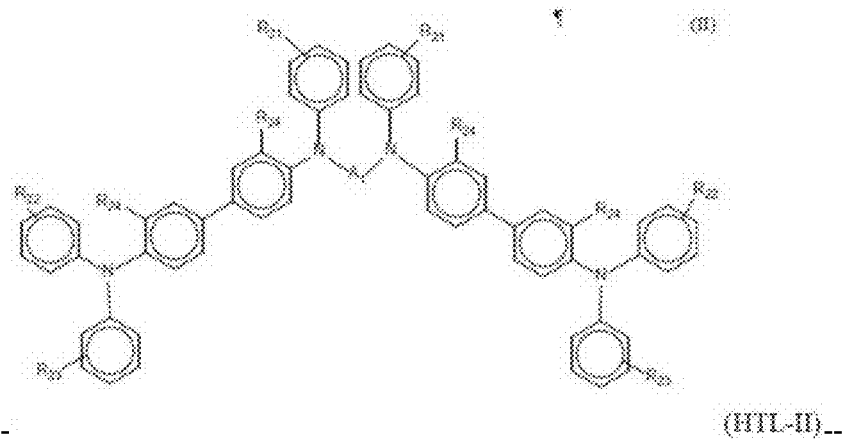
-- (HTL-II) --
In Claim 19, Columns 113-114, after Line 10, please delete compound (HTL-IV)
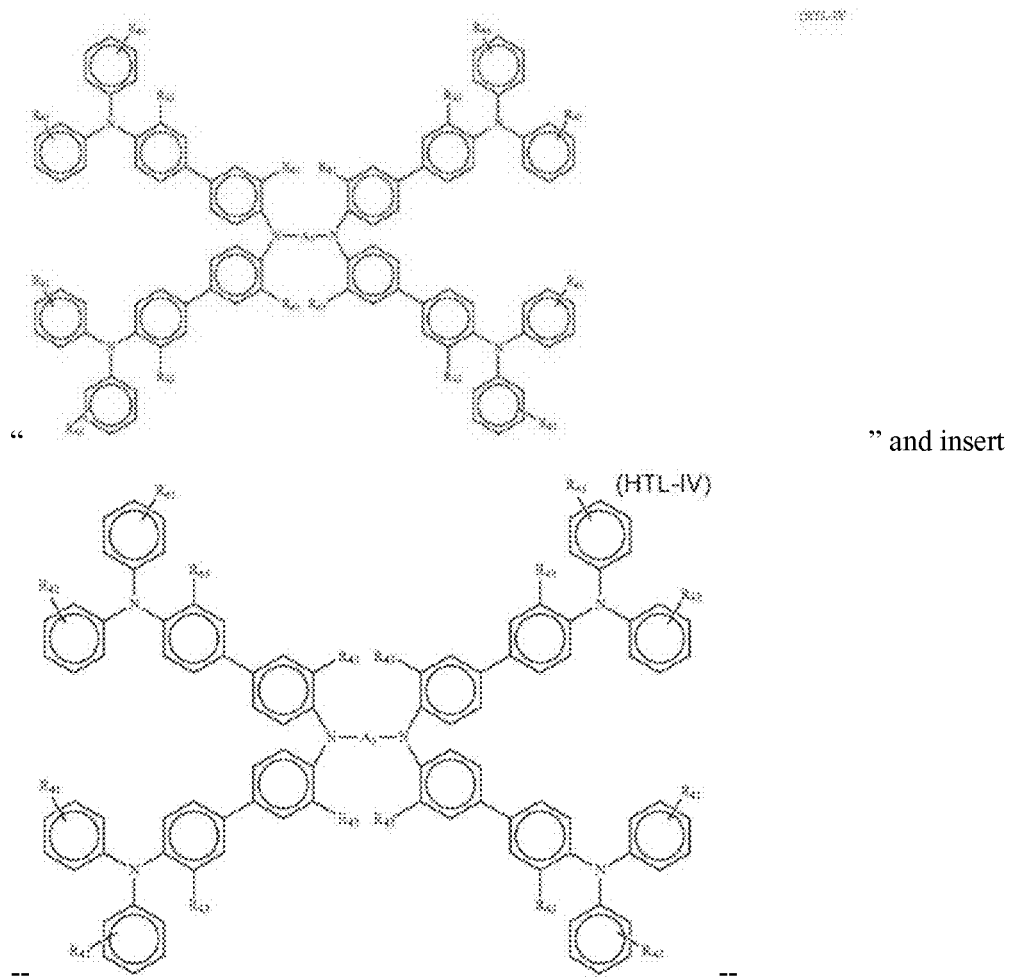
" and insert
-- (HTL-IV) --

CERTIFICATE OF CORRECTION (continued)
U.S. Pat. No. 9,705,099 B2

Page 6 of 6

In Claim 27, Column 119, Lines 16-38, please delete

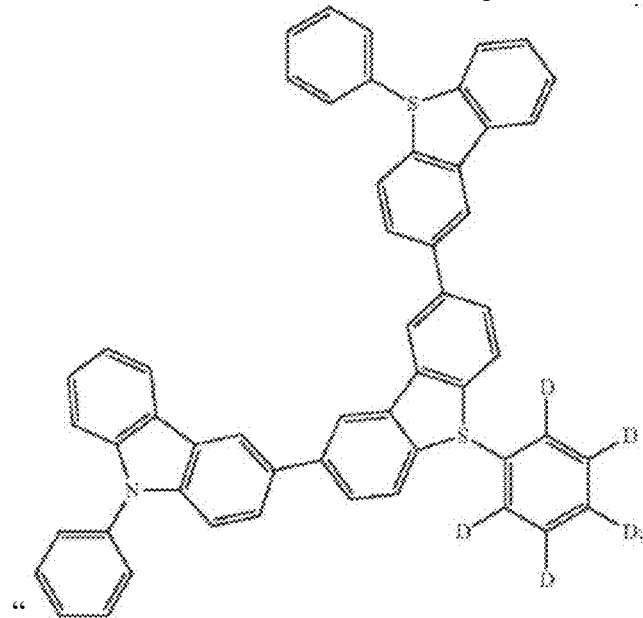

" and insert

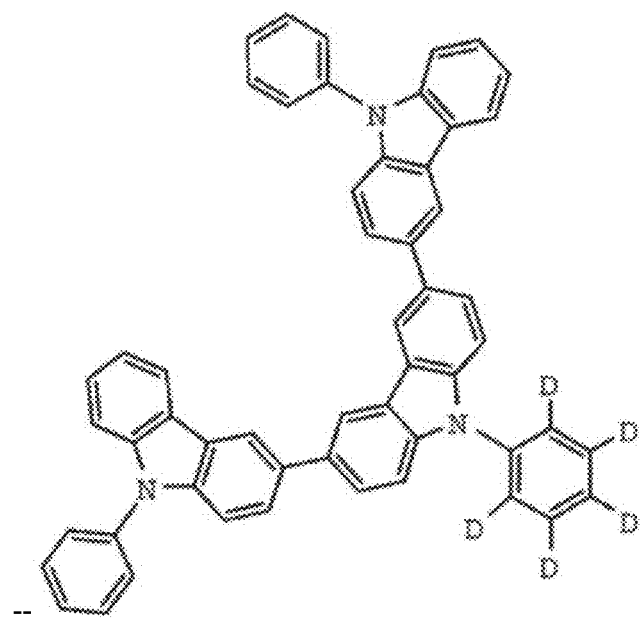

-- --